US011437590B2

(12) United States Patent
Makishima et al.

(10) Patent No.: US 11,437,590 B2
(45) Date of Patent: Sep. 6, 2022

(54) ORGANIC ELECTROLUMINESCENCE ELEMENT MATERIAL, ORGANIC ELECTROLUMINESCENCE ELEMENT, DISPLAY APPARATUS AND ILLUMINATION APPARATUS

(71) Applicant: Konica Minolta, Inc., Tokyo (JP)

(72) Inventors: Yukihiro Makishima, Hino (JP); Takayuki Iijima, Fukuroi (JP); Hiroshi Kita, Hachioji (JP)

(73) Assignee: KONICA MINOLTA, INC., Tokyo (JP)

(*) Notice: Subject to any disclaimer, the term of this patent is extended or adjusted under 35 U.S.C. 154(b) by 333 days.

(21) Appl. No.: 16/087,801

(22) PCT Filed: Apr. 28, 2017

(86) PCT No.: PCT/JP2017/016990
§ 371 (c)(1),
(2) Date: Sep. 24, 2018

(87) PCT Pub. No.: WO2017/195669
PCT Pub. Date: Nov. 16, 2017

(65) Prior Publication Data

US 2019/0115537 A1 Apr. 18, 2019

(30) Foreign Application Priority Data

May 13, 2016 (JP) ............................ JP2016-097067

(51) Int. Cl.
*H01L 51/50* (2006.01)
*H01L 51/00* (2006.01)
(Continued)

(52) U.S. Cl.
CPC .............. *H01L 51/008* (2013.01); *C07F 5/02* (2013.01); *C07F 5/027* (2013.01); *C09K 11/06* (2013.01);
(Continued)

(58) Field of Classification Search
CPC . C07F 5/02; C07F 5/027; C09K 11/06; G09F 9/30; H01L 51/0067;
(Continued)

(56) References Cited

U.S. PATENT DOCUMENTS

| | | | | |
|---|---|---|---|---|
| 9,385,326 | B2 * | 7/2016 | Wonneberger | H01L 51/006 |
| 10,686,141 | B2 * | 6/2020 | Hatakeyama | C07F 9/90 |

(Continued)

FOREIGN PATENT DOCUMENTS

| | | | |
|---|---|---|---|
| CN | 105431439 A | | 3/2016 |
| JP | 11-080225 A | * | 3/1999 |

(Continued)

OTHER PUBLICATIONS

Journal of Physical Chemistry C, (2013), 117, pp. 14999-15008. (Year: 2013).*

(Continued)

*Primary Examiner* — Dawn L Garrett
(74) *Attorney, Agent, or Firm* — Lucas & Mercanti, LLP

(57) ABSTRACT

An organic electroluminescence element material contains a π-conjugated boron compound having a structure represented by Formula (1), (Continued)

Formula (1)

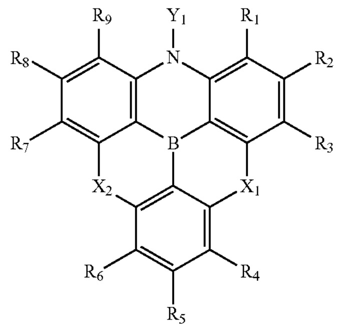

wherein, $X_1$ and $X_2$ each independently represent O, S, or N—$Y_1$, $Y_1$ represents an alkyl group, an aromatic hydrocarbon ring group, or an aromatic heterocyclic group, when there are a plurality of $Y_1$s the plurality of $Y_1$s may be the same or different, $R_1$ to $R_9$ each independently represent a hydrogen atom or a substituent.

7 Claims, 4 Drawing Sheets

(51) Int. Cl.
*C09K 11/06* (2006.01)
*G09F 9/30* (2006.01)
*C07F 5/02* (2006.01)
*H05B 33/14* (2006.01)

(52) U.S. Cl.
CPC ............ *G09F 9/30* (2013.01); *H01L 51/0067* (2013.01); *H01L 51/0072* (2013.01); *H01L 51/50* (2013.01); *H05B 33/14* (2013.01); *H01L 51/0085* (2013.01); *H01L 51/5012* (2013.01); *H01L 51/5016* (2013.01); *H01L 51/5056* (2013.01); *H01L 51/5072* (2013.01)

(58) Field of Classification Search
CPC ............... H01L 51/0072; H01L 51/008; H01L 51/0085; H01L 51/5012; H01L 51/5016; H01L 51/5056; H01L 51/5072; H05B 33/14
See application file for complete search history.

(56) References Cited

U.S. PATENT DOCUMENTS

2009/0066226 A1* 3/2009 Sugita .................. C07D 405/14
313/504
2009/0295275 A1 12/2009 Parham et al.
2015/0023627 A1 1/2015 Kimura et al.
2018/0069182 A1* 3/2018 Hatakeyama ............. C07F 9/90
2018/0366653 A1* 12/2018 He ...................... H01L 51/0071
2019/0378982 A1* 12/2019 He ......................... C09K 11/06

FOREIGN PATENT DOCUMENTS

JP 2013056859 A 3/2013
WO 2005062675 A1 7/2005

OTHER PUBLICATIONS

Kinoshita et al., "Synthesis and Physical Properties of BN-embedded Triangulene," Japan Chemical Society 96th Spring Annual Meeting, Proceedings (DVD), Mar. 19, 2016, 3F1-42. (Year: 2016).*

Machine translation for JP 11-080225 A (publication date: Mar. 1999). (Year: 1999).*

Yasuhiro et al, Nature Photonics, vol. 13, Issue 10, Oct. 2019, pp. 678-682. (Year: 2019).*

International Search Report dated Jul. 11, 2017 for PCT/JP2017/016990 and English translation.

Written Opinion of the International Searching Authority dated Jul. 11, 2017 from the corresponding International Application No. PCT/JP2017/016990 and English translation.

CNIPA, Office Action for the corresponding Chinese patent application No. 201780029637.5, dated Dec. 18, 2019, with English translation (18 pages).

Truong Ba Tai, et al., "Theoretical Design of π-Conjugated Heteropolycyclic Compounds Containing a Tricoordinated Boron Center," Journal of Physical Chemistry, Jul. 3, 2013, pp. 14999-15008, vol. 117, No. 29.

Keisuke Okinoshita, et al., "Synthesis and Physical Properties of BN-embedded Triangulene," 96th Spring Meeting of the Chemical Society of Japan, 2016, pp. 1-14.

JPO, Office Action for the corresponding Japanese patent application No. 2018-516972, dated Sep. 8, 2020, with English translation.

Fumiya Miyamoto, et al., "Synthesis of Boron-Doped Polycyclic Aromatic Hydrocarbons by Tandem Intramolecular Electrophilic Arene Borylation," Organic Letters, 2015, p. 6158-6161, vol. 17.

Keisuke Kinoshita, et al., "Synthesis and Physical Properties of BN-embedded Triangulene," Japan Chemical Society 96 th Spring Annual Meeting, Proceedings (DVD), Mar. 10, 2016, 3F1-42.

KIPO, Office Action for the corresponding Korean patent application No. 10-2018-7032290, dated Nov. 3, 2020, with English translation.

CNIPA, Office Action for the corresponding Chinese patent application No. 2017180029637.5, dated Sep. 25, 2020, with English translation.

* cited by examiner

ORGANIC ELECTROLUMINESCENCE ELEMENT MATERIAL, ORGANIC ELECTROLUMINESCENCE ELEMENT, DISPLAY APPARATUS AND ILLUMINATION APPARATUS

CROSS REFERENCE TO RELATED APPLICATION

This Application is a 371 of PCT/JP2017/016990 filed on Apr. 28, 2017 which, in turn, claimed the priority of Japanese Patent Application No. 2016-097067 filed on May 13, 2016, both applications are incorporated herein by reference.

TECHNICAL FIELD

The present invention relates to a material for an organic electroluminescence element which exhibits excellent performance even when it is used for any one of a host material, an electron transport material and a hole transport material. The present invention also relates to an organic electroluminescence element, a display device, and a lighting device. In particular, the present invention relates to a material for an organic electroluminescence element which improves drive voltage and emission luminance.

BACKGROUND

An organic EL element (also referred to as "an organic electroluminescence element") utilizes electroluminescence (hereinafter abbreviated as "EL") of an organic material. An organic EL element is a technology that has been already put into practical use as a new light emitting system enabling planar light emission. An organic EL element has been applied no only to electronic displays but also to lighting devices, and development thereof is expected.

Compounds such as bipyridine, oxadiazole, triazole, silole and triarylamine, which have been conventionally used as materials for organic EL elements, had a problem of improving performance by achieving compatibility of carrier tolerance (stability of radical cation or radical anion) and exciton resistance (stability of excitons generated by recombination of radical cation or radical anion) when they are used as a host material. This compatibility is required for a host material.

Boron-containing organic compounds are expected to be electron transport materials in organic EL elements due to high electron acceptor properties (electron transporting properties) of boron, but there is a problem that it is thermally unstable due to their high electrophilicity derived from the empty p orbital of boron. In response to this problem. Patent document 1 describes a compound that solves the above-mentioned problem by covering around boron with a bulky substituent. However, although the compound described in Patent document 1 is superior in thermal stability because it is covered with a bulky substituent around boron, but improvement in electrochemical performance and further stability are required.

Further, Patent document 2 discloses that by immobilizing boron with an aromatic ring, it succeeds in synthesizing an electrochemically stable boron-containing organic compound as compared with the compound in Patent document 1. Patent document 2 describes that this compound showed superior properties as an organic EL material.

However, since the heteroatom is only an electron acceptor boron atom, it lacks the hole transporting property and carrier recombination occurs in the vicinity of the interface between the light emitting layer and the hole transport layer, thereby accelerating deterioration of the element. In addition, since the methyl moiety of the joint protrudes perpendicularly to the aromatic ring, it inhibits π-π stacking and degrades carrier transportability.

Furthermore, Patent document 3 discloses information of having succeeded in synthesizing a compound in which an oxygen atom is introduced into a joint portion connecting aromatic rings to each other, and its unique physical properties are revealed. However, since planar immobilization from all directions has not been attempted, rigidity of the ring is insufficient, and improvement of electrochemical stability is required.

PRIOR ART DOCUMENTS

Patent Documents

Patent document 1: WO 2005/062675
Patent document 2: JP-A 2013-56859
Patent document 3: US 2015/023627

SUMMARY OF THE INVENTION

Problems to be Solved by the Invention

The present invention has been made in view of the above-described problems and situation. An object of the present invention is to provide a material for an organic electroluminescence element which exhibits excellent performance regardless of whether it is used as a host material, an electron transport material or a hole transport material, and has improved drive voltage and emission luminance of the element. Another object of the present invention is to provide an organic electroluminescence element using the organic electroluminescence device material, a display device, and a lighting device.

Means to Solve the Problems

As a result of investigating the causes of the above-mentioned problems according to the present invention, it has been found that a π-conjugated boron compound having a structure represented by Formula (1) has high planarity and rigidity, thereby the thermal stability and the electrochemical stability are improved and the above problems of the present invention were solved. Thus, the present invention was achieved. That is, the above-described objects of the present invention are solved by the following embodiments.

1. An organic electroluminescence element material containing a π-conjugated boron compound having a structure represented by Formula (1).

Formula (1)

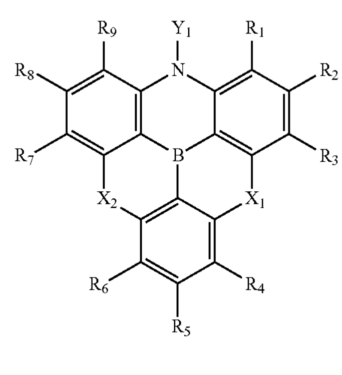

Wherein, $X_1$ and $X_2$ each independently represent O, S, or N—$Y_1$, $Y_1$ represents an alkyl group, an aromatic hydrocarbon ring group, or an aromatic heterocyclic group, when there are a plurality of $Y_1$s the plurality of $Y_1$s may be the same or different, $R_1$ to $R_9$ each independently represent a hydrogen atom or a substituent.

2. The organic electroluminescence element material described in the embodiment 1, wherein $X_1$ and $X_2$ in Formula (1) each represent O.

3. The organic electroluminescence element material described in the embodiment 2, wherein $Y_1$ and $R_1$ to $R_9$ each independently represent: an azine skeleton, a dibenzofuran skeleton, an azadibenzofuran skeleton, a diazadibenzofuran skeleton, a carbazole skeleton, a diazacarbazole skeleton or an aryl group having an electron withdrawing group.

4. The organic electroluminescence element material described in the embodiment 2, wherein $Y_1$ and $R_1$ to $R_9$ each independently represent a carbazole skeleton or an aryl group having an electron donating group.

5. An organic electroluminescence element containing an organic layer interposed between an anode and a cathode, wherein the organic layer includes the organic electroluminescence element material described in any one of the embodiments 1 to 4.

6. A display device provided with the organic electroluminescence element described in the embodiment 5.

7. A lighting device provided with the organic electroluminescence element described in the embodiment 5.

Effects of the Invention

By the above-described embodiments of the present invention, it is possible to provide a material for an organic electroluminescence element which exhibits excellent performance regardless of whether it is used as a host material, an electron transport material or a hole transport material and has improved drive voltage and emission luminance of the element. Further, it is possible to provide an organic electroluminescence element using the organic electroluminescence element material, a display device, and a lighting device.

Although an appearing mechanism or an action mechanism of the effect of the present invention is not fully clarified, but it is presumed as follows.

The π-conjugated boron compound having a structure represented by Formula (1) contained in the organic electroluminescence element material of the present invention is flatly fixed from all direction. Consequently, it is supposed that the rigidity of the ring increases and thermal stability and electrical stability improves.

In addition, the lone pair on the nitrogen atom flows into the electron deficient boron atom, whereby the electrophilicity and the nucleophilicity of the whole molecule are relaxed and stabilized. Since it has both an electron donor property (hole transporting property) and an electron acceptor property (electron transporting property), the carrier balance is improved as a host material. Therefore, it is presumed that this boron compound functions properly as a material for both a hole transport material and an electron transport material.

Furthermore, since the molecular structure is substantially planar, it is easy to form π-π stacking. It is presumed that the carrier transportability is improved by making the distance between the molecules close to each other and facilitating hopping movement of carriers.

EMBODIMENTS TO CARRY OUT THE INVENTION

Figure 1:
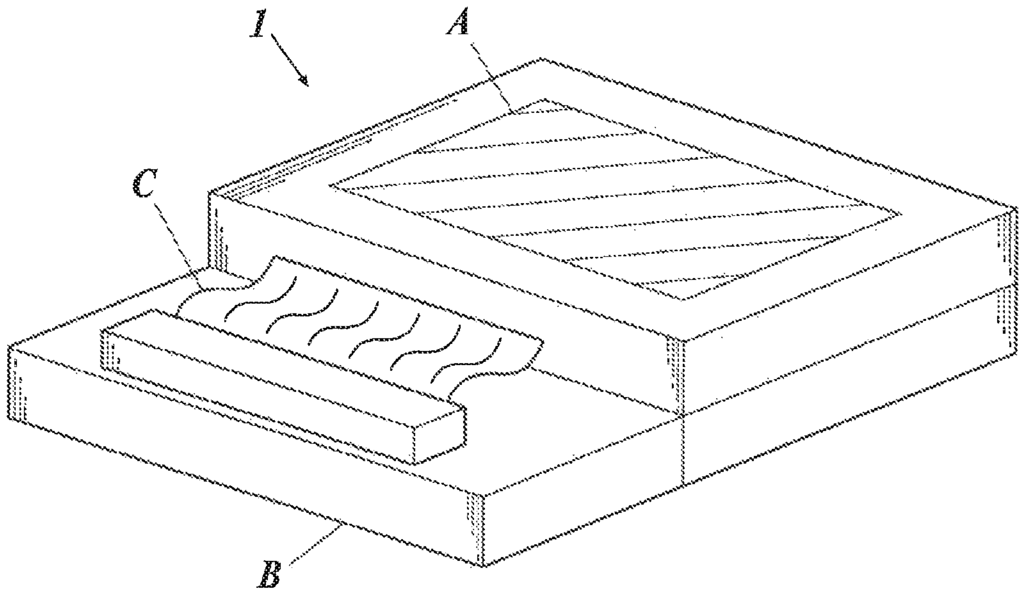
FIG. 1 is a schematic diagram illustrating an example of a display device including an organic EL element.

An organic electroluminescence element material of the present invention is characterized in containing a π-conjugated boron compound having a structure represented by Formula (1). This feature is a technical feature common to the inventions according to each claim.

As an embodiment of the present invention, it is preferable that $X_1$ and $X_2$ in Formula (1) represent O from the synthetic viewpoint.

It is preferable that $Y_1$ and $R_1$ to $R_9$ in Formula (1) each independently represent: an azine skeleton, a dibenzofuran skeleton, an azadibenzofuran skeleton, a diazadibenzofuran skeleton, a carbazole skeleton, a diazacarbazole skeleton or an aryl group having an electron withdrawing group from the viewpoint of superior performance as an electron transport material with high electron acceptor property.

It is preferable that $Y_1$ and $R_1$ to $R_9$ in Formula (1) each independently represent a carbazole skeleton or an aryl group having an electron donating group from the viewpoint of superior performance as a hole transport material having high electron donor property.

It is preferable that an organic electroluminescence element of the present invention contains an organic layer interposed between an anode and a cathode, and the organic layer includes the organic electroluminescence element material of the present invention from the viewpoint of exhibiting the effect of the present invention.

Further, the organic electroluminescence element of the present invention may be suitably provided in a display device.

Further, the organic electroluminescence element of the present invention may be suitably provided in a lighting device.

The present invention and the constitution elements thereof, as well as configurations and embodiments to carry out the present invention, will be detailed in the following. In the present specification, when two figures are used to indicate a range of value before and after "to", these figures are included in the range as a lowest limit value and an upper limit value.

<<Organic Electroluminescence Element Material>>

An organic electroluminescence element material of the present invention is characterized in containing a π-conjugated boron compound having a structure represented by Formula (1).

The background to using the compound having such a structure is as follows. Thin films and structures composed of organic compounds are basically insulators, but among π-conjugated compounds, many compounds exhibiting semiconducting properties are known. In these compounds, molecules are close to each other, and carrier hopping movement is facilitated.

Pentacene and polythiophene are representative examples thereof, and triarylborane may exhibit semiconductivity by electron conduction using an empty p orbital of boron atom in some cases. However, in many cases, in order to make it resistant to the attack of a nucleophilic species and the Lewis base to the boron atom, the aryl group of the triarylborane is substituted with a substituent that sterically shields the boron atom, for example, trimesitylborane or trisbiphenylborane. A sterically bulky substituent is often given at the ortho position of the aryl group bonded to the boron atom. In such a chemical structure, the distance between the boron atom and the boron atom where LUMO localizes is separated, so that the mobility is insufficient for use as a transistor or an n-type material of a heterojunction type organic solar cell, and sufficient effect is not obtained.

However, in the compound having the triple phenoxaborine skeleton in which the three phenyl groups of triphenylborane, which is a representative example of the π-conjugated boron compound group according to the present invention, are connected by oxygen atoms at all ortho positions to form discotic molecules, it is no longer necessary to shield the perimeter of the boron atom with a sterically hindering substituent from its strength of sp2 (i.e., rigidity of planarity).

Therefore, in the thin film or the structure formed by this boron compound, since the distance between the boron atoms where LUMO exists is shortened, it shows an n-type semiconducting property and it becomes possible to suitably use as a semiconductor material.

That is, the π-conjugated boron compound according to the present invention easily forms π-π stacking by increasing the planarity, and the intermolecular distances are close to each other, whereby carrier hopping movement is facilitated and carrier transportability is improved.

Here, since the carrier applies either to the radical cation or the radical anion, this boron compound may be suitably used as any of the electron transport material, the hole transport material and the host material.

<Π-Conjugated Boron Compound>

The π-conjugated boron compound according to the present invention has a structure represented by Formula (1).

Formula (1)

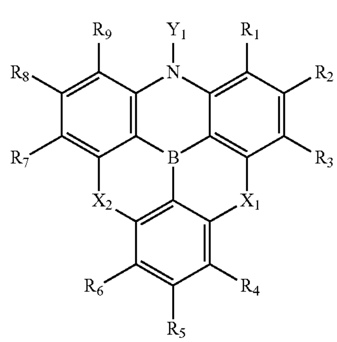

In the Formula, $X_1$ and $X_2$ each independently represent O, S, or N—$Y_1$, $Y_1$ represents an alkyl group, an aromatic hydrocarbon ring group, or an aromatic heterocyclic group, when there are a plurality of $Y_1$s the plurality of $Y_1$s may be the same or different, $R_1$ to $R_9$ each independently represent a hydrogen atom or a substituent. The compound having the structure represented by Formula (1) is preferably used as a neutral molecule.

The alkyl group represented by $Y_1$ may be a straight, branched or cyclic structure. Examples thereof are: a straight, branched or cyclic alkyl group having 1 to 20 carbon atoms. Specific examples are: a methyl group, an ethyl group, an n-propyl group, an isopropyl group, an n-butyl group, an s-butyl group, a t-butyl group, an n-pentyl group, a neopentyl group, an n-hexyl group, a cyclohexyl group, a 2-ethylhexyl group, an n-heptyl group, an n-octyl group, a 2-hexyloctyl group, an n-nonyl group, an n-decyl group, an n-undecyl group, an n-dodecyl group, an n-tridecyl group, an n-tetradecyl group, an n-pentadecyl group, an n-hexadecyl group, an n-heptadecyl group, an n-octadecyl group, an n-nonadecyl group, and an n-icosyl group. More preferable examples are: a methyl group, an ethyl group, an isopropyl group, a t-butyl group, a cyclohexyl group, a 2-ethylhexyl group, and 2-hexyloctyl group. These alkyl groups may further have a halogen atom, an aromatic hydrocarbon ring group described later, an aromatic heterocyclic group described later, and an amino group described later.

Examples of an aromatic hydrocarbon group represented by $Y_1$ are: a benzene ring, an indene ring, a naphthalene ring, an azulene ring, a fluorene ring, a phenanthrene ring, an anthracene ring, an acenaphthylene ring, a biphenylene ring, a chrysene ring, a naphthacene ring, a pyrene ring, a pentalene ring, an aceanthrylene ring, a heptalene ring, a triphenylene ring, an as-indacene ring, a chrysene ring, an s-indacene ring, a pleiadene ring, a phenalene ring, a fluoranthene ring, a perylene ring, and an acephenanthrylene ring, a biphenyl ring, a terphenyl ring, and a tetraphenyl ring. These aromatic hydrocarbon ring groups may further have a halogen atom, the above-described alkyl group, an alkoxy group described later, the above-described aromatic heterocyclic group, and an amino group described later.

Examples of an aromatic heterocyclic group represented by $Y_1$ are: a carbazole ring, an indoloindole ring, a 9,10-dihydroacridine ring, a phenoxazine ring, a phenothiazine ring, a dibenzothiophene ring, a benzofurylindole ring, a benzothienoindole ring, an indolocarbazole ring, a benzofurylcarbazole flag, a benzothienocarbazole ring, a benzothienobenzothiophene ring, a benzocarbazole ring, a dibenzocarbazole ring, a dibenzofuran ring, a benzofurylbenzofuran ring, and a dibenzosylole ring. These aromatic heterocyclic groups may further have a halogen atom, the above-described alkyl group, an alkoxy group described later, the above-described aromatic hydrocarbon ring group, and an amino group described later.

It is particularly preferable that $Y_1$ represents an azine skeleton, a dibenzofuran skeleton, an azadibenzofuran skeleton, a diazadibenzofuran skeleton, a carbazole skeleton, a diazacarbazole skeleton or an aryl group having an electron withdrawing group. Alternatively, it is particularly preferred that $Y_1$ represents a carbazole skeleton or an aryl group having an electron donating group.

The substituent represented by $R_1$ to $R_9$ is not particularly limited, but it is preferably, for example, an alkyl group, an alkoxy group, an amino group, an aromatic hydrocarbon ring group, or an aromatic heterocyclic group. Incidentally, these substituent groups include those having other substituents on a part of the structure.

The alkyl group represented by $R_1$ to $R_9$ may be a straight, branched or cyclic structure. Examples thereof are: a straight, branched or cyclic alkyl group having 1 to 20 carbon atoms. Specific examples are: a methyl group, an ethyl group, an n-propyl group, an isopropyl group, an n-butyl group, an s-butyl group, a t-butyl group, an n-pentyl group, a neopentyl group, an n-hexyl group, a cyclohexyl group, a 2-ethylhexyl group, an n-heptyl group, an n-octyl group, a 2-hexyloctyl group, an n-nonyl group, an n-decyl group, an n-undecyl group, an n-dodecyl group, an n-tridecyl group, an n-tetradecyl group, an n-pentadecyl group, an n-hexadecyl group, an n-heptadecyl group, an n-octadecyl group, an n-nonadecyl group, and an n-icosyl group. More preferable examples are: a methyl group, an ethyl group, an isopropyl group, a t-butyl group, a cyclohexyl group, a 2-ethylhexyl group, and 2-hexyloctyl group. Examples of the substituent which may be possessed by these alkyl groups include: a halogen atom, an aromatic hydrocarbon ring group described later, an aromatic heterocyclic group described later, and an amino group described later.

The alkoxy group represented by $R_1$ to $R_9$ may be a straight, branched or cyclic structure. Examples thereof are: a straight, branched or cyclic alkoxy group having 1 to 20 carbon atoms. Specific examples are: a methoxy group, an ethoxy group, an n-propoxy group, an isopropoxy group, an n-butoxy group, an isobutoxy group, a t-butoxy group, an n-pentyloxy group, a neopentyloxy group, an n-hexyloxy group, a cyclohexyloxy group, an n-heptyloxy group, an n-octyloxy group, a 2-ethylhexyloxy group, a nonyloxy group, a decyloxy group, a 3,7-dimethyloctyloxy group, an n-undecyloxy group, an n-dodecyloxy group, an n-tridecyloxy group, an n-tetradecyloxy group, a 2-n-hexyl-n-octyloxy group, an n-pentadecyloxy group, an n-hexadecyloxy group, an n-heptadecyloxy group, an n-octadecyloxy group, an n-nonadecyloxy group, and an n-icosyloxy group. More preferable examples are: a methoxy group, an ethoxy group, an isopropoxy group, a t-butoxy group, a cyclohexyloxy group, a 2-ethylhexyloxy group, and a 2-hexyloctyloxy group. Examples of the substituent which may be possessed by these alkoxy groups include: a halogen atom, an aromatic hydrocarbon ring group described later, an aromatic heterocyclic group described later, and an amino group described later.

Examples of an aromatic hydrocarbon ring group represented by $R_1$ to $R_9$ are: a benzene ring, an indene ring, a naphthalene ring, an azulene ring, a fluorene ring, a phenanthrene ring, an anthracene ring, an acenaphthylene ring, a biphenylene ring, a chrysene ring, a naphthacene ring, a pyrene ring, a pentalene ring, an aceanthrylene ring, a heptalene ring, a triphenylene ring, an as-indacene ring, a chrysene ring, an s-indacene ring, a pleiadene ring, a phenalene ring, a fluoranthene ring, a perylene ring, and an acephenanthrylene ring, a biphenyl ring, a terphenyl ring, and a tetraphenyl ring. Examples of the substituent which may be possessed by these aromatic hydrocarbon ring groups include: a halogen atom, the above-described alkyl group, the above-described alkoxy group, the aromatic heterocyclic group described later, and an amino group described later.

Examples of an aromatic heterocyclic group represented by $R_1$ to $R_9$ are: a carbazole ring, an indoloindole ring, a 9,10-dihydroacridine ring, a phenoxazine ring, a phenothiazine ring, a dibenzothiophene ring, a benzofurylindole ring, a benzothienoindole ring, an indolocarbazole ring, a benzofurylcarbazole ring, a benzothienocarbazole ring, a benzothienobenzothiophene ring, a benzocarbazole ring, a dibenzocarbazole ring, a dibenzofuran ring, a benzofurylbenzofuran ring, and a dibenzosylol ring.

Examples of the substituent which may be possessed by these aromatic heterocyclic groups include: a halogen atom, the above-described alkyl group, the above-described alkoxy group, the above-described aromatic hydrocarbon ring group d, and an amino group described later.

The amino group represented by $R_1$ to $R_9$ may be a substituted amino group having a substituent. Examples of the substituent possessed by the substituted amino group include a halogen atom, the above-described alkyl group, the above-described aromatic hydrocarbon ring group, and the above-described aromatic heterocyclic group. It is particularly preferable that each of $R_1$ to $R_9$ independently represents an azine skeleton, a dibenzofuran skeleton, an azadibenzofuran skeleton, a diazadibenzofuran skeleton, a carboline skeleton, a diazacarbazole skeleton or an aryl group having an electron withdrawing group. Alternatively, it is particularly preferable that $R_1$ to $R_9$ each independently represent a carbazole skeleton or an aryl group having an electron donating group.

<Synthetic Method of π-Conjugated Boron Compound>

The π-conjugated boron compound having a structure represented by Formula (1) according to the present invention may be synthesized by the following synthetic route.

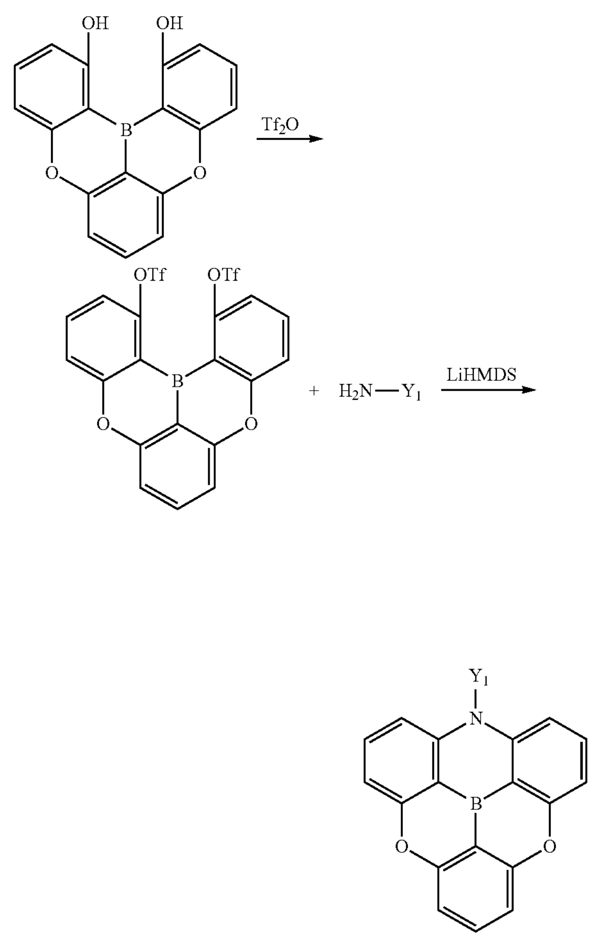

<Specific Examples of π-Conjugated Boron Compound>

As an example of the π-conjugated boron compound having a structure represented by Formula (1), the following exemplified compounds may be mentioned, but the present invention is not limited thereto.

B1
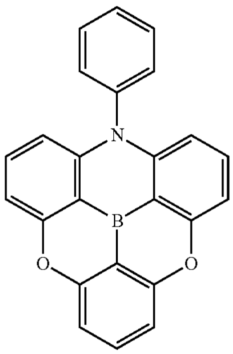
B2
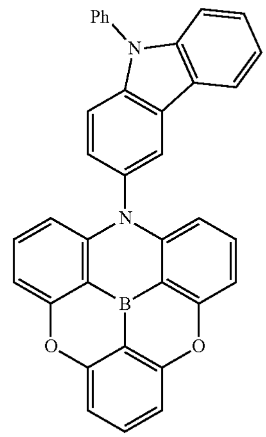
B3
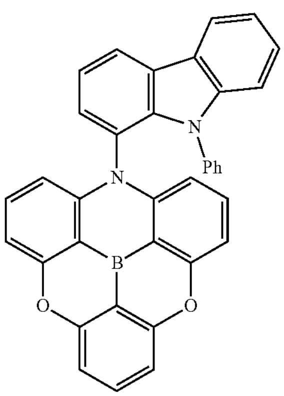
B4
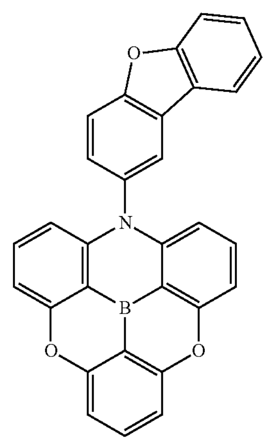
B5
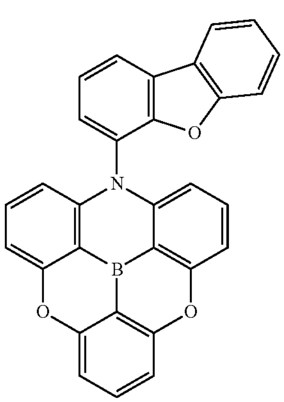
B6
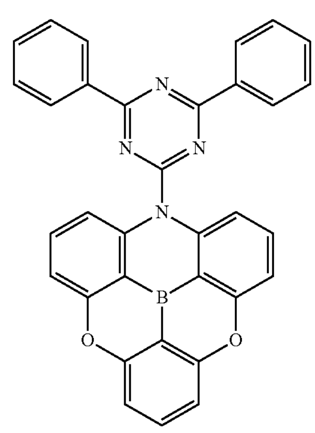

-continued
B7
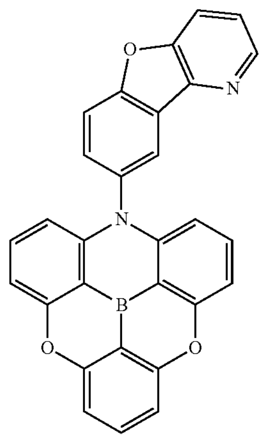
B8
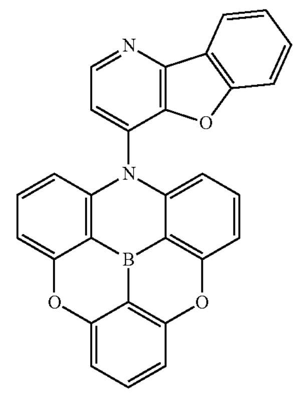
B9
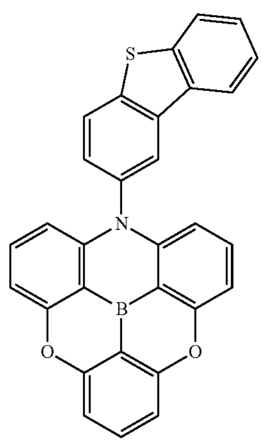
B10
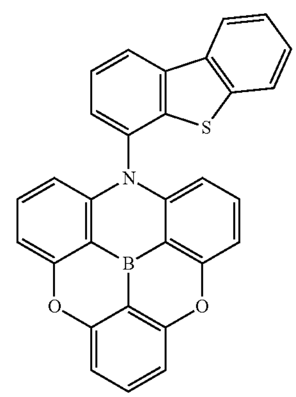
B11
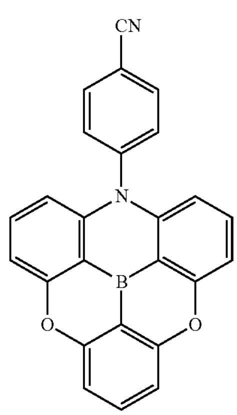
B12
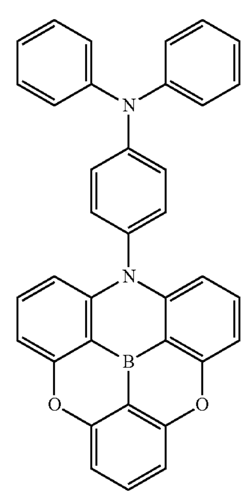

-continued
B13
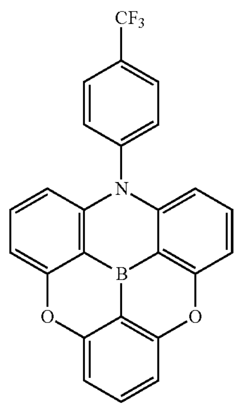
B14
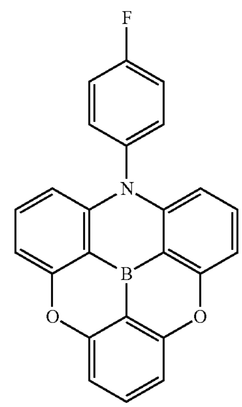
B15
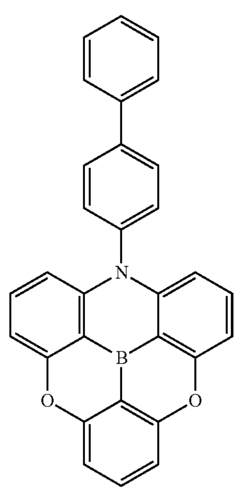
B16
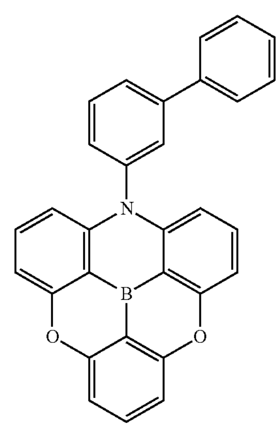
B17
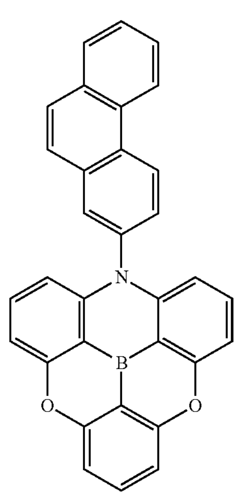
B18
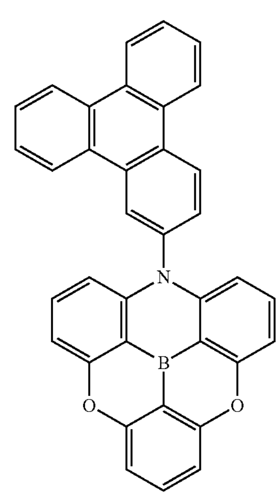

-continued
B19
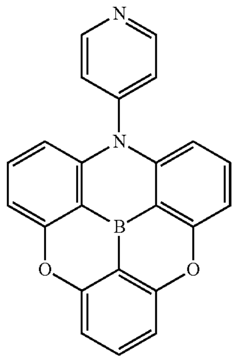
B20
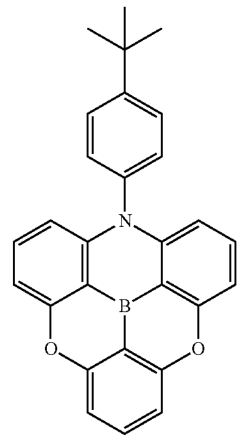
B21
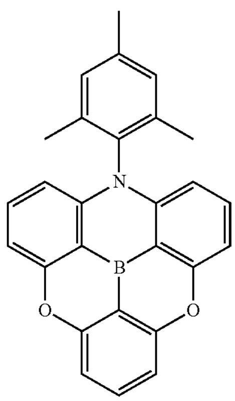
B22
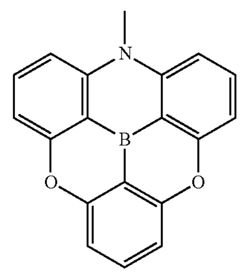
B23
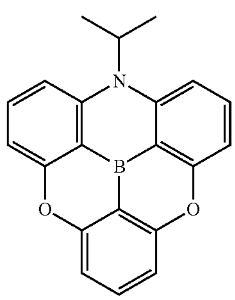
B24
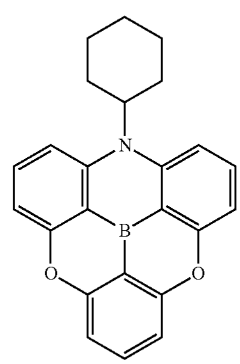
B25
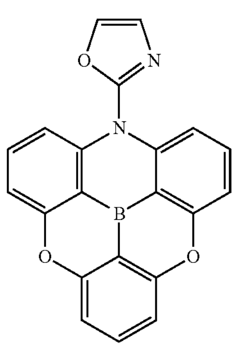
B26
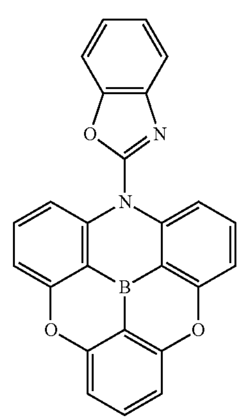

-continued
B27
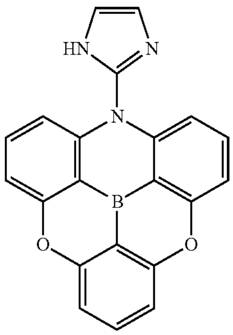
B28
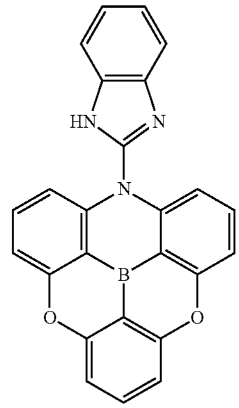
B29
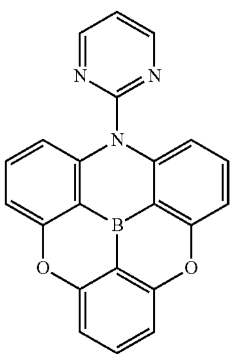
B30
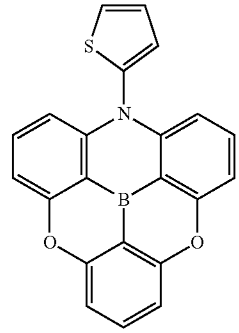
B31
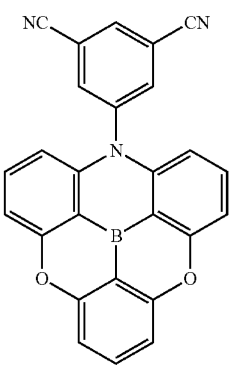
B32
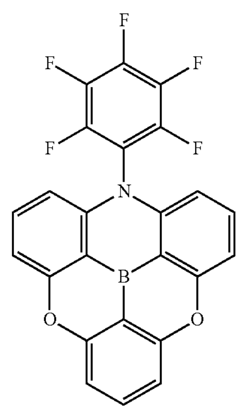
B33
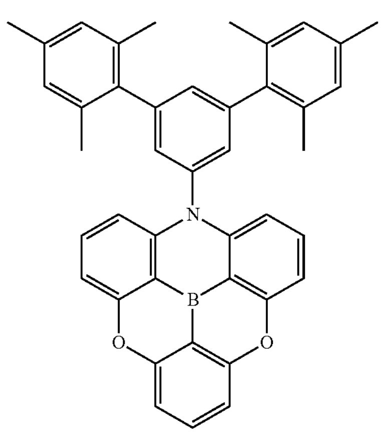
B34
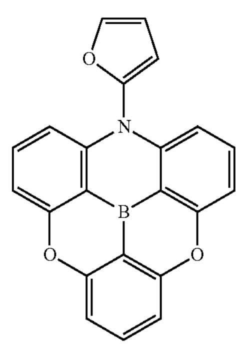

-continued
B35
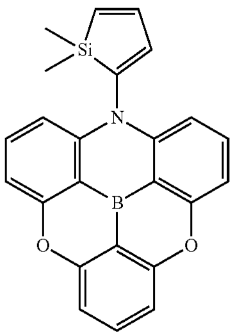
B36
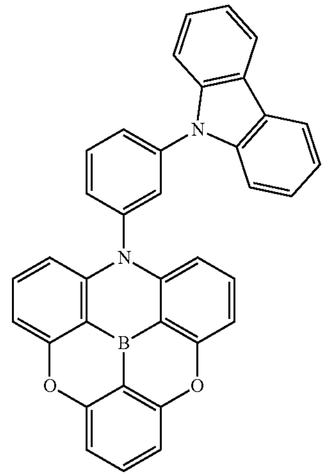
B37
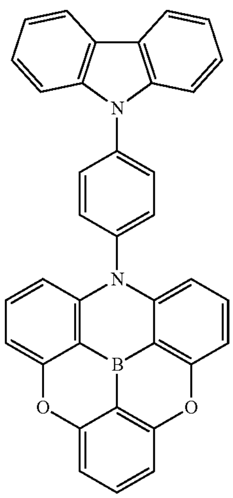
B38
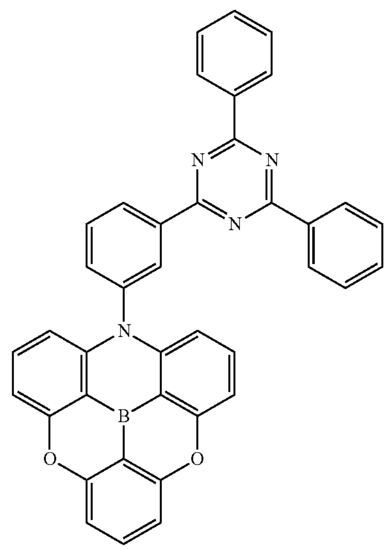
B39
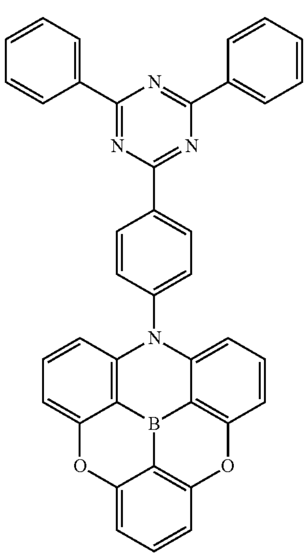
B40
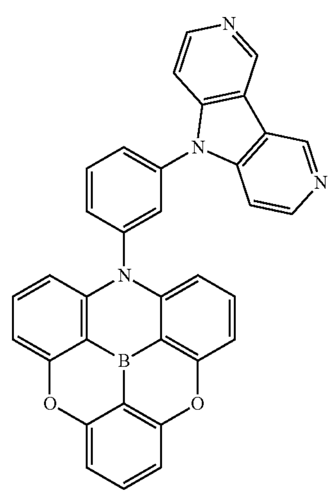

-continued
B41
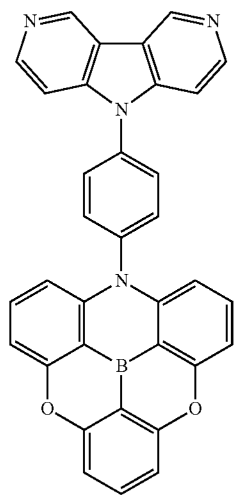
B42
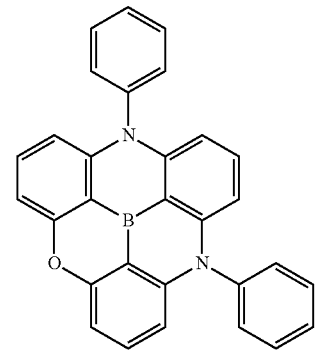
B43
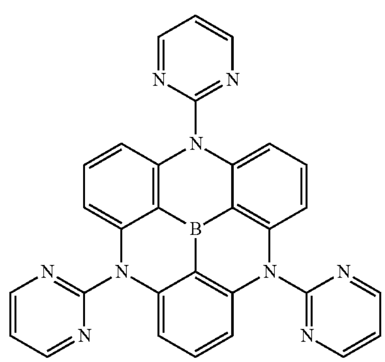
B44
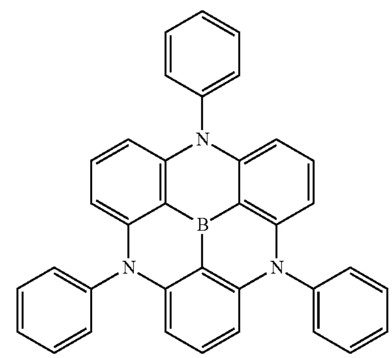
B45
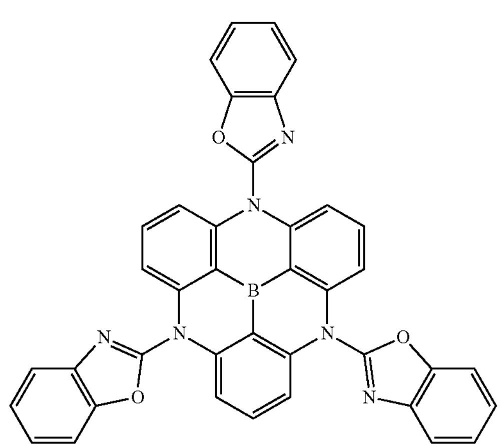
B46
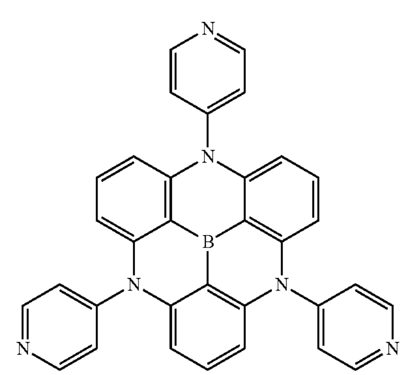

-continued
B47
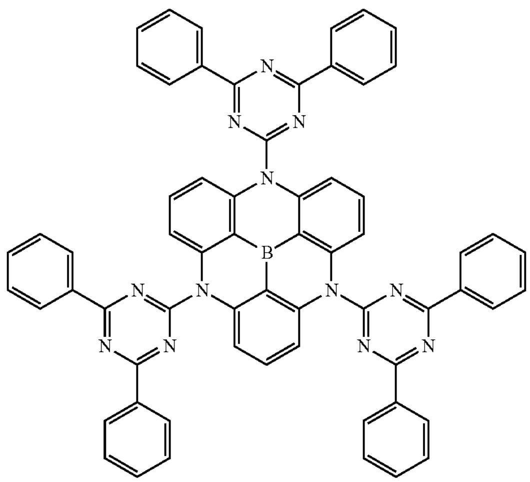
B48
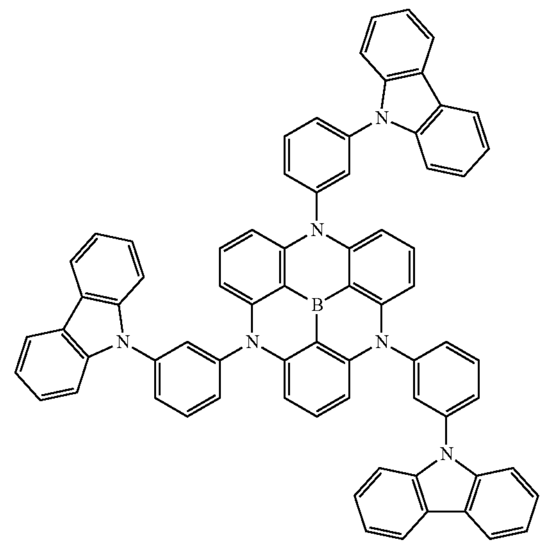
B49
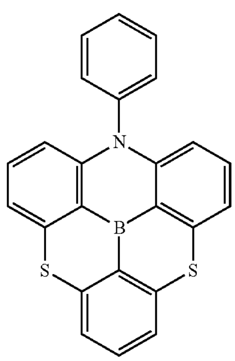
B50
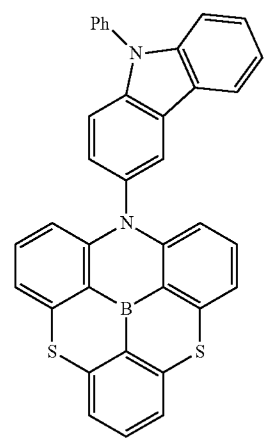
B51
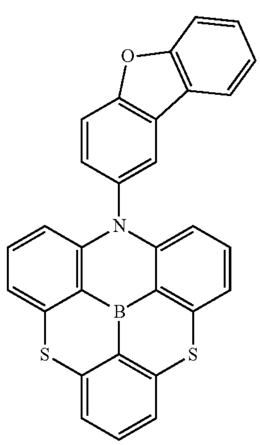
B52
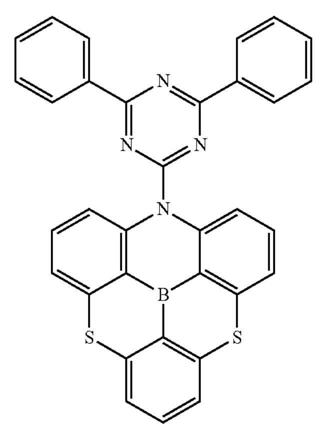

-continued
B53
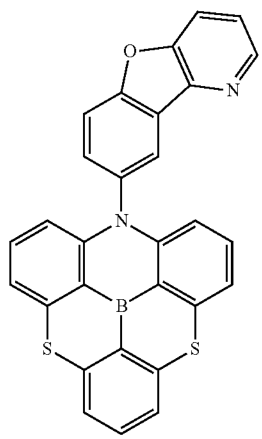
B54
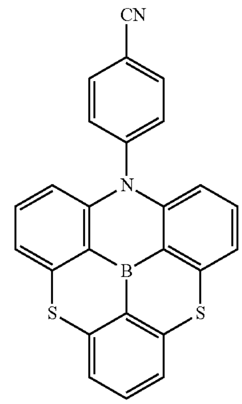
B55
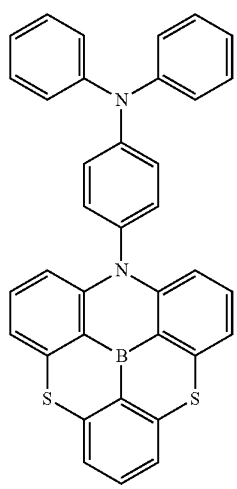
B56
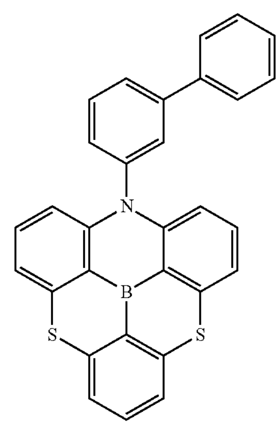
B57
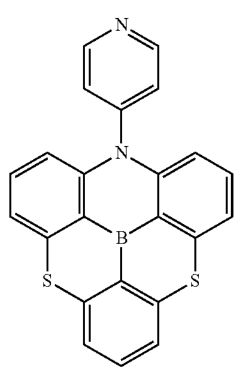
B58
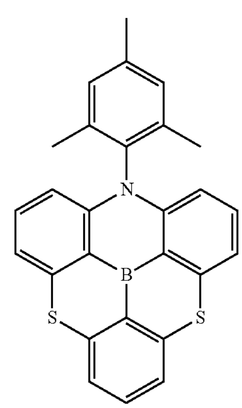

-continued
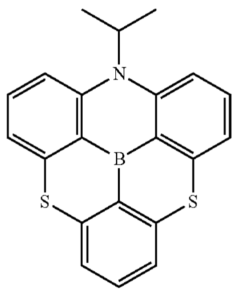
B59
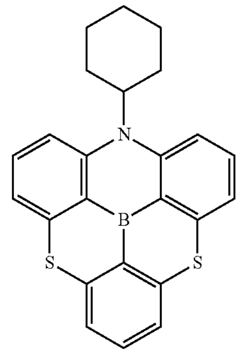
B60
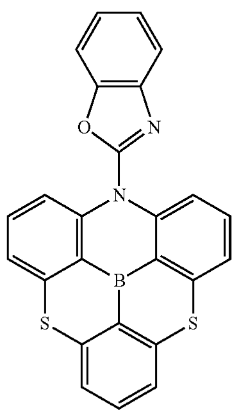
B61
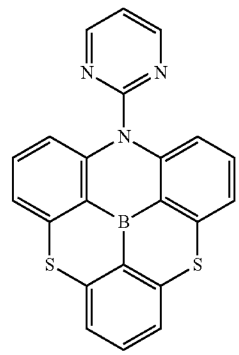
B62
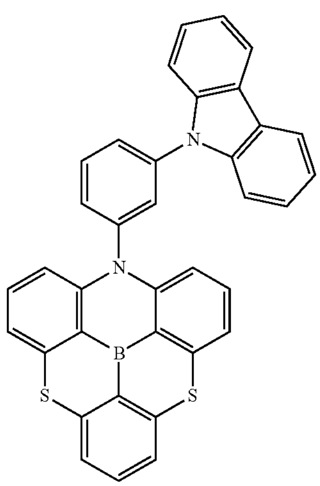
B63
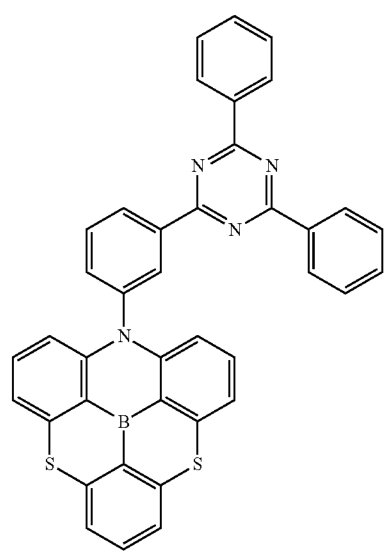
B64

-continued
B65
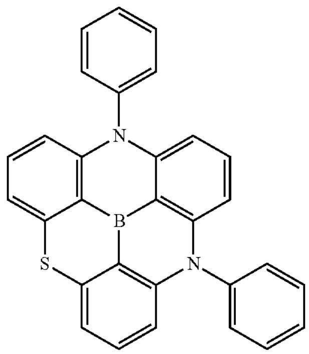
B66
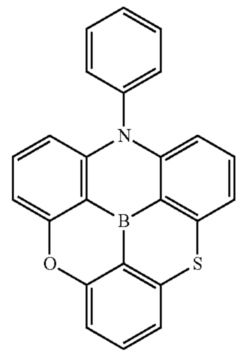
B67
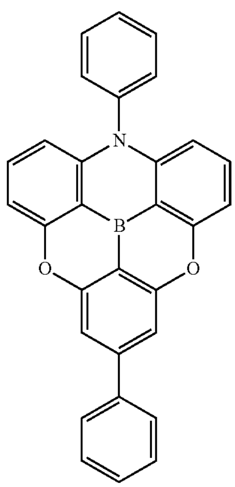
B68
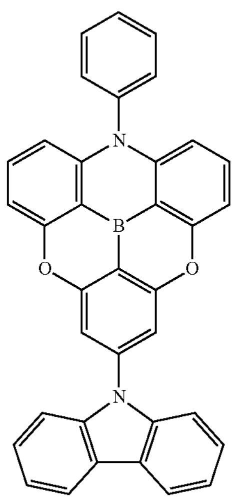
B69
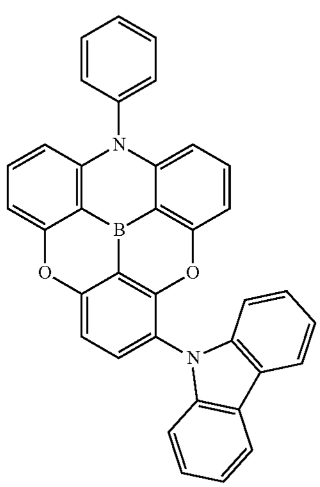
B70
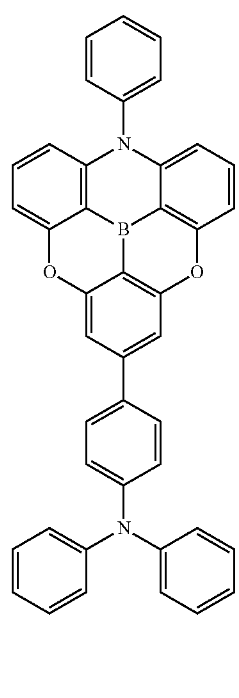

-continued
B71
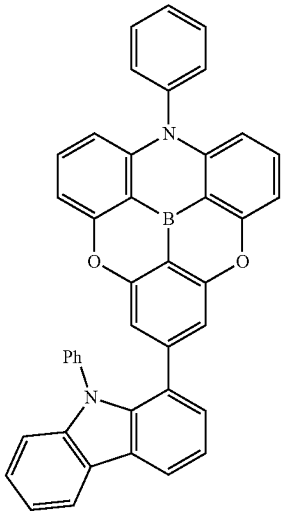
B72
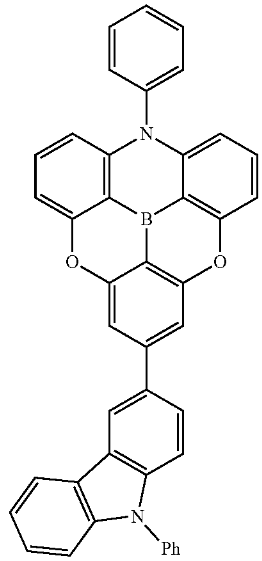
B73
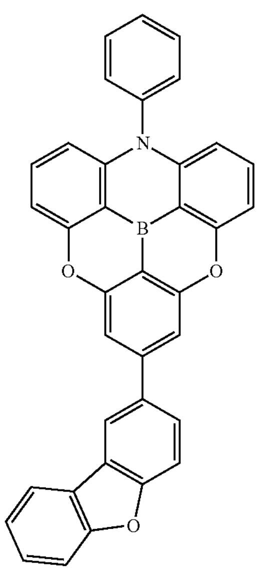
B74
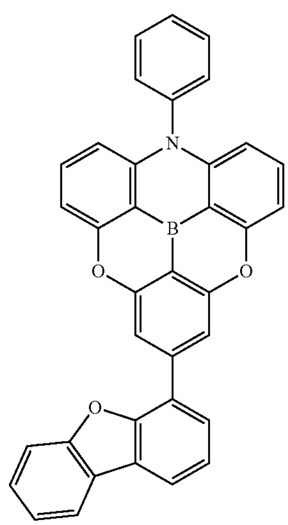

-continued
B75
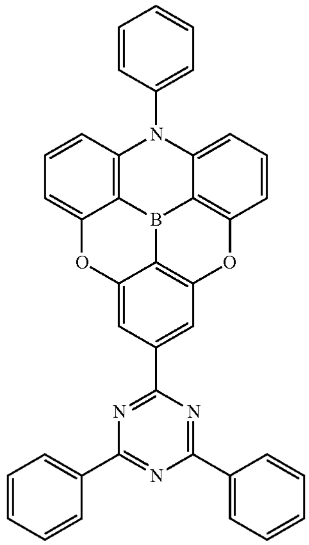
B76
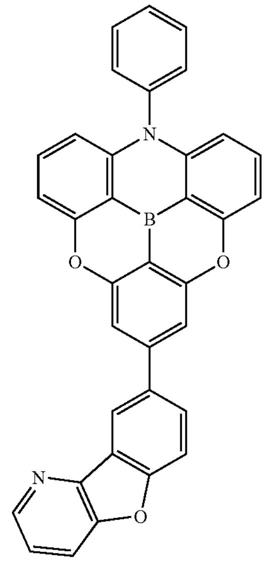
B77
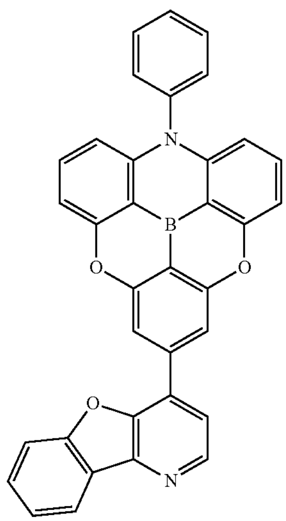
B78
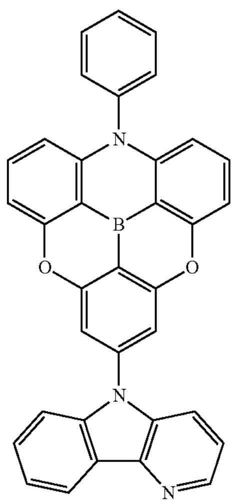
B79
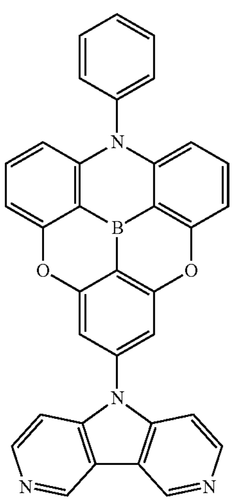
B80
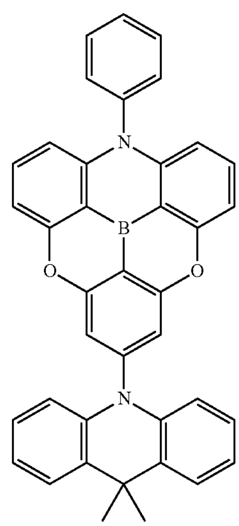

-continued
B81
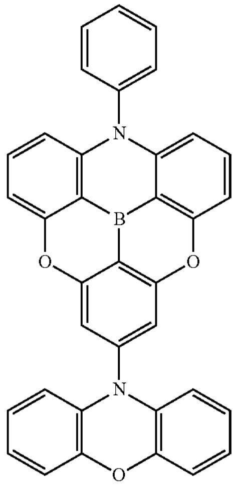
B82
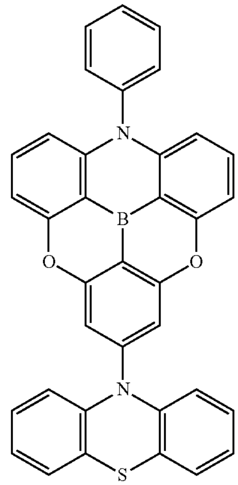
B83
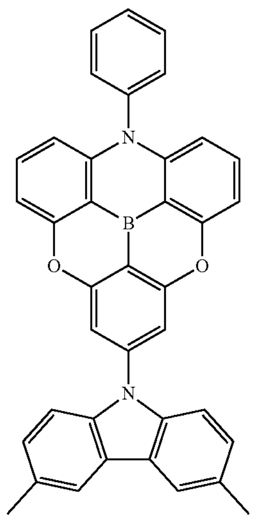
B84
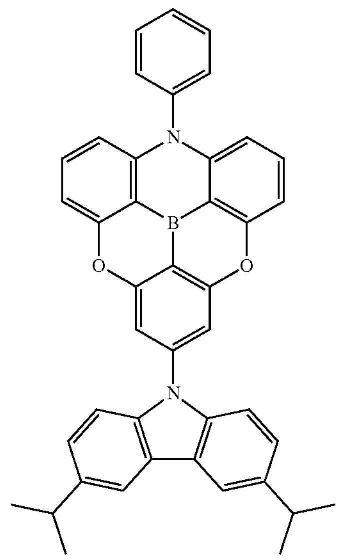
B85
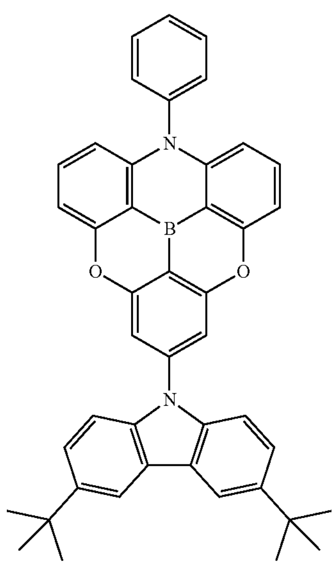
B86
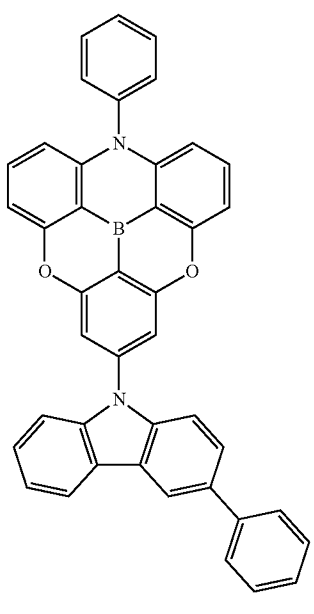

-continued
B87
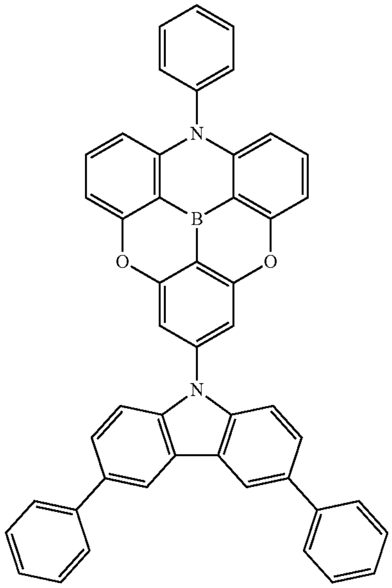
B88
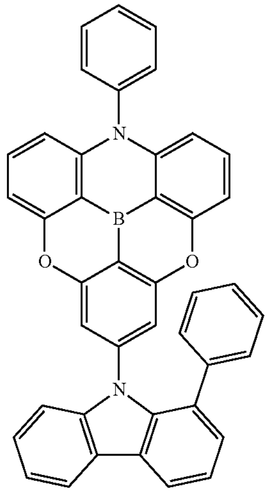
B89
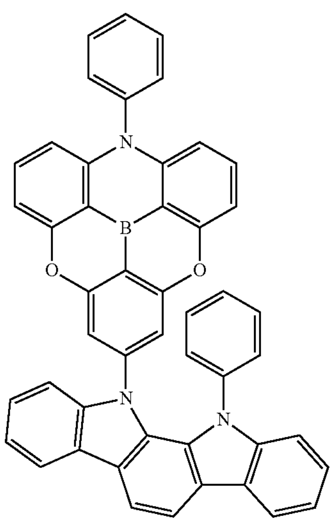
B90
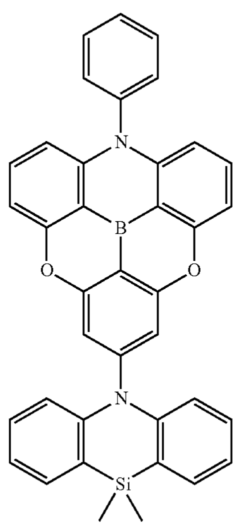

-continued
B91
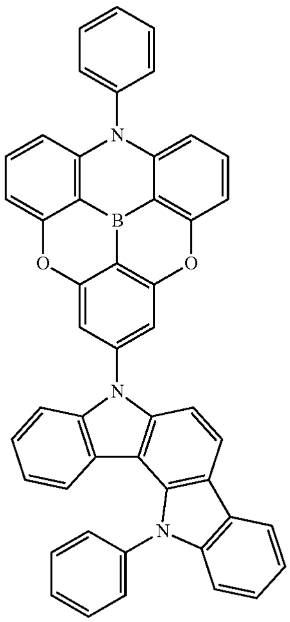
B92
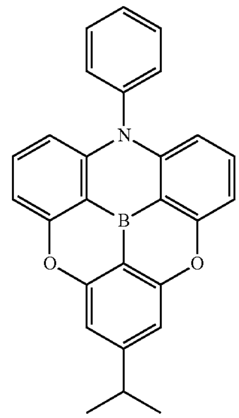
B93
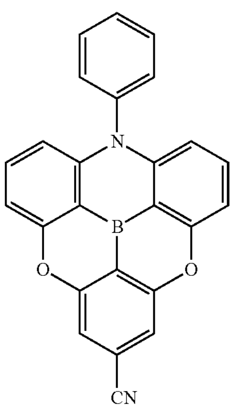
B94
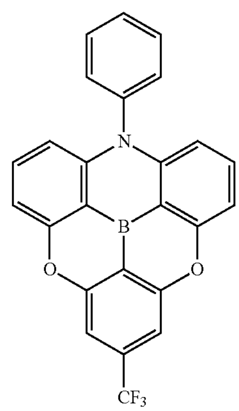
B95
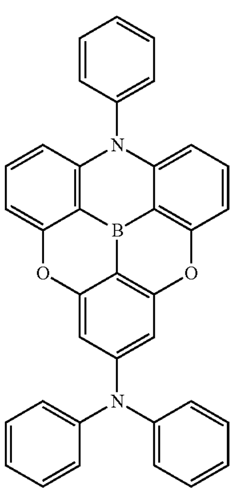
B96
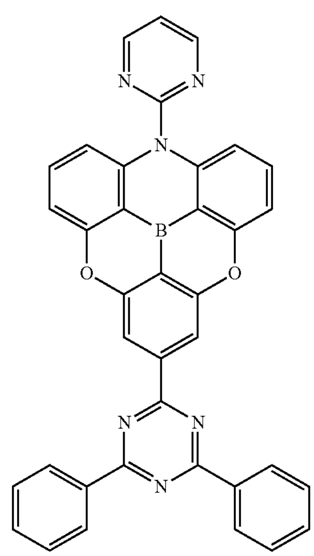

-continued
B97
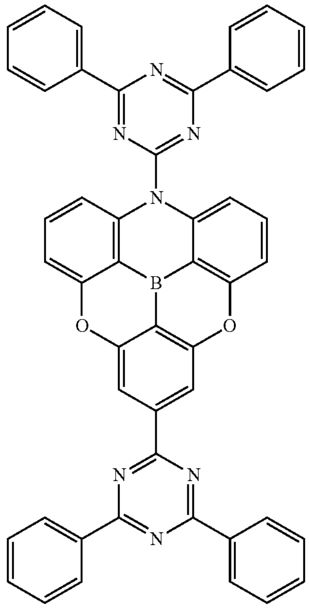
B98
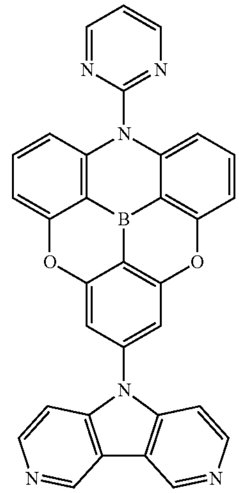
B99
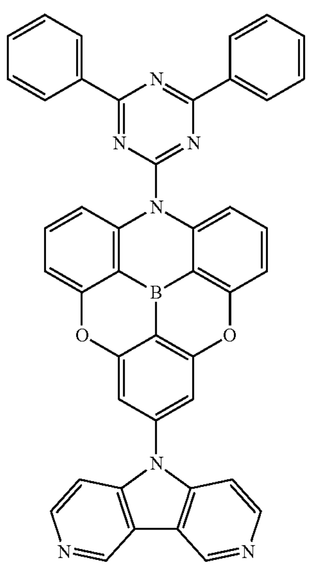
B100
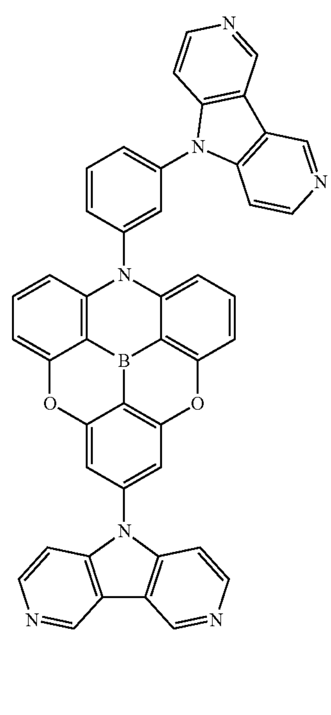

-continued
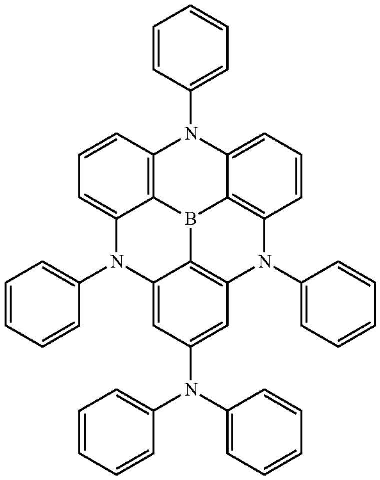
B101
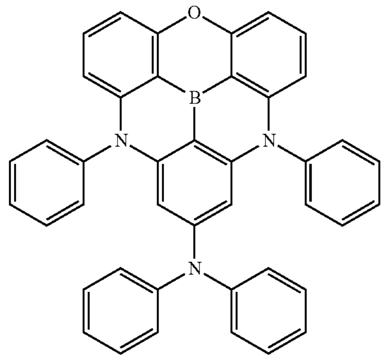
B102
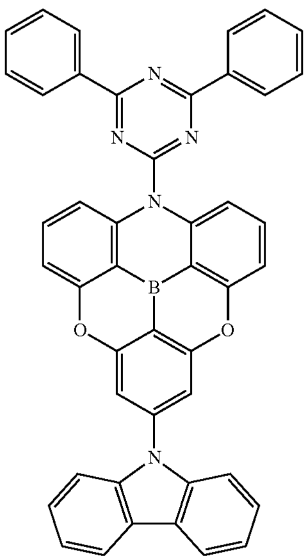
B103
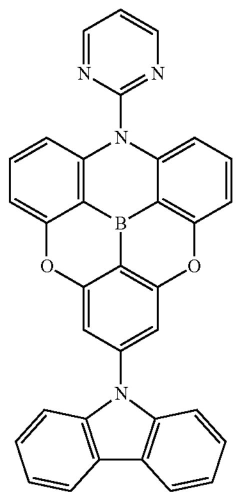
B104
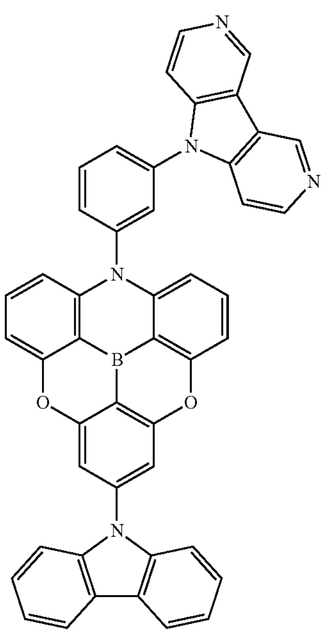
B105
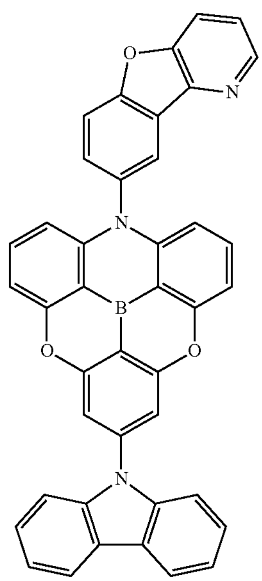
B106

-continued
B107
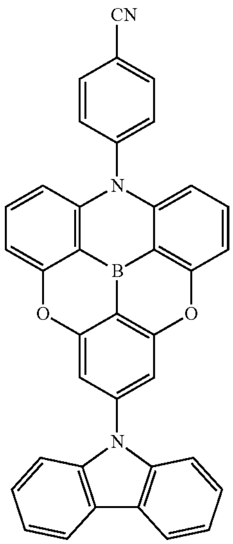
B108
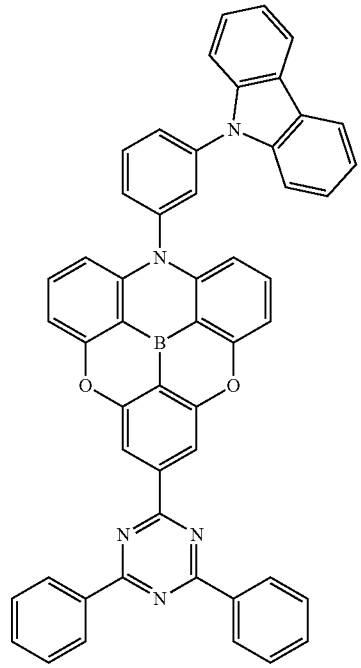
B109
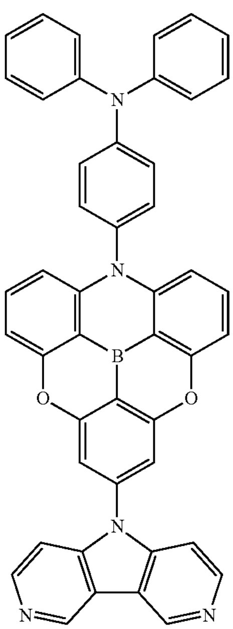
B110
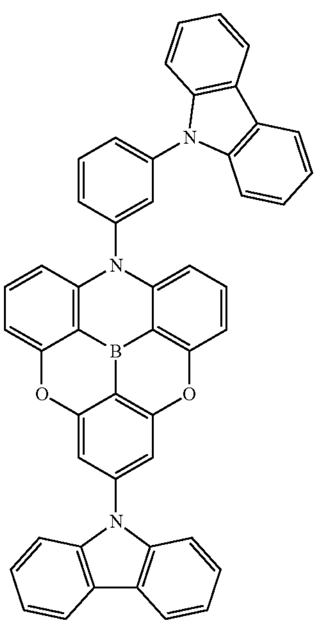

-continued
B111
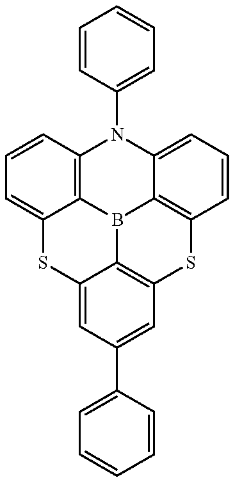
B112
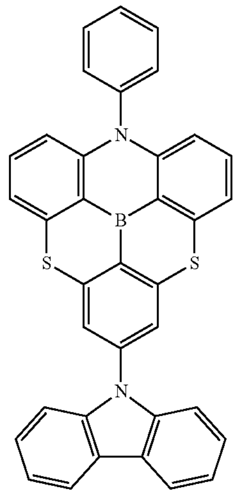
B113
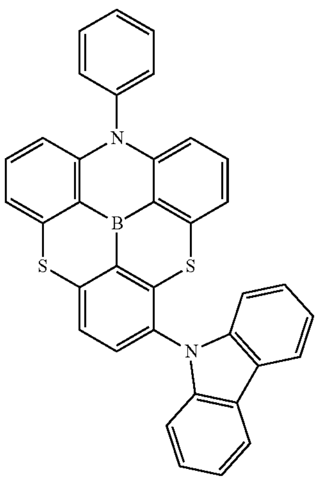
B114
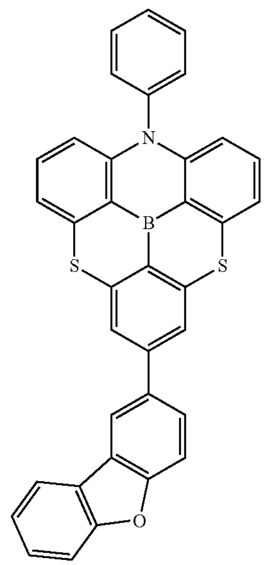
B115
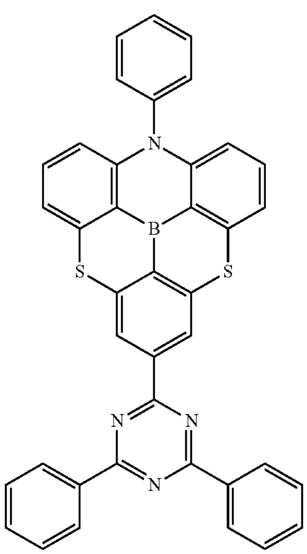
B116
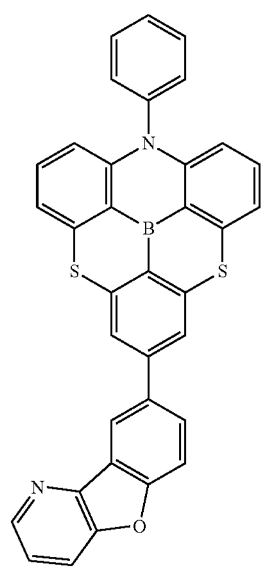

-continued
B117
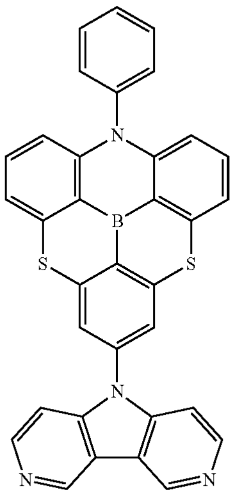
B118
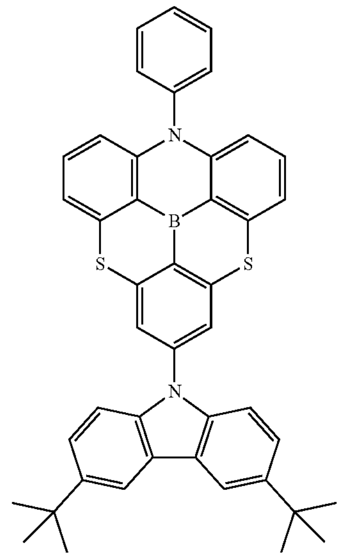
B119
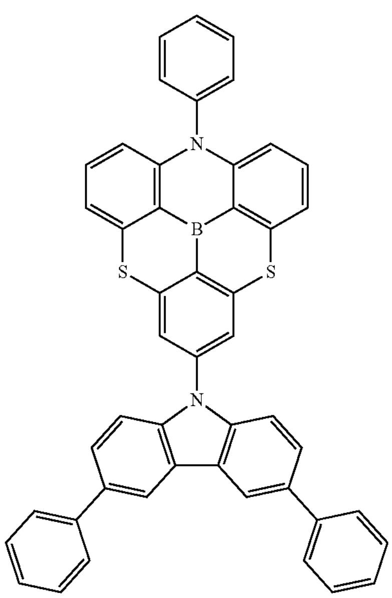
B120
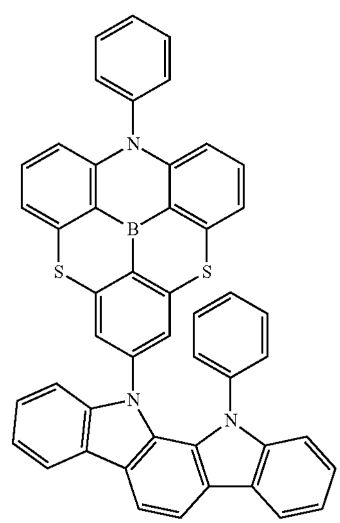

-continued
B121
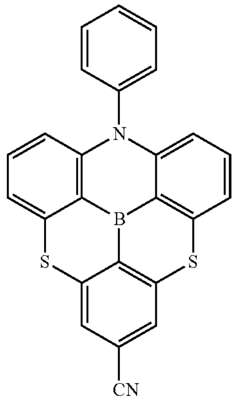
B122
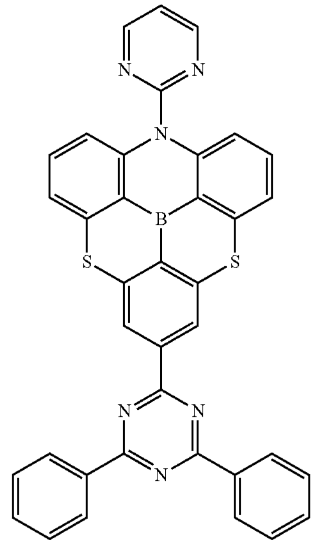
B123
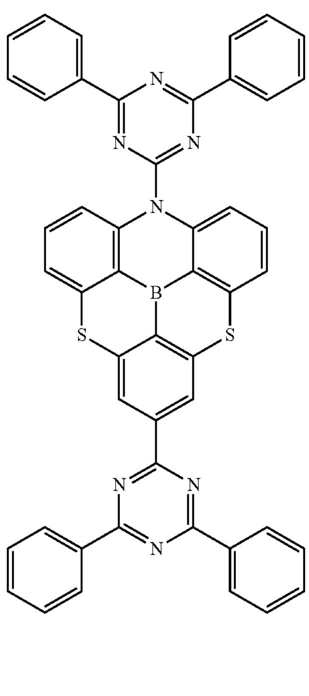
B124
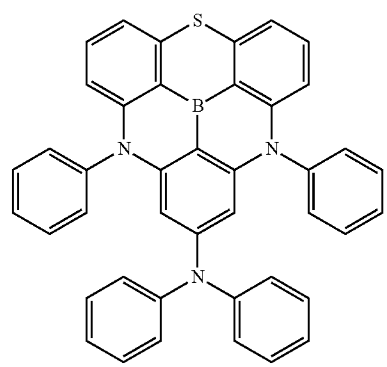

-continued
B125
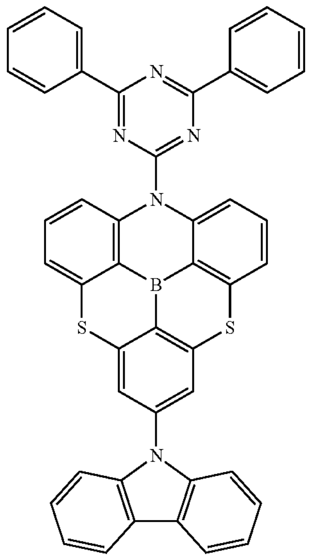
B126
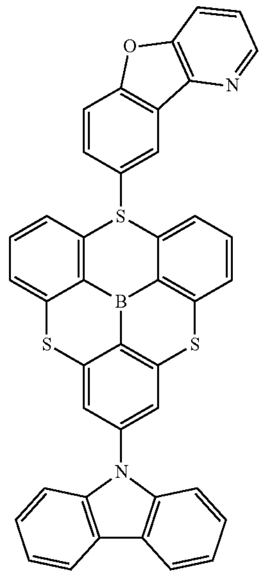
B127
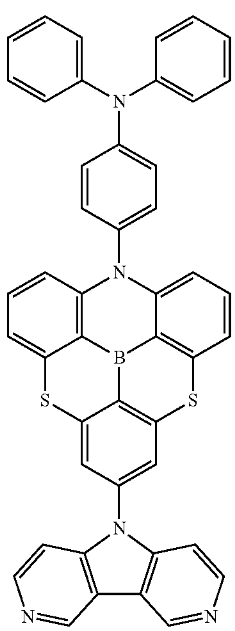
B128
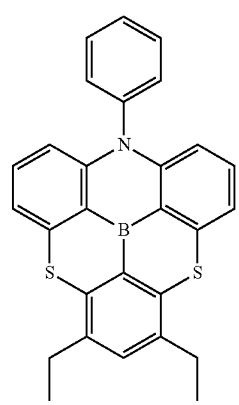

-continued
B129
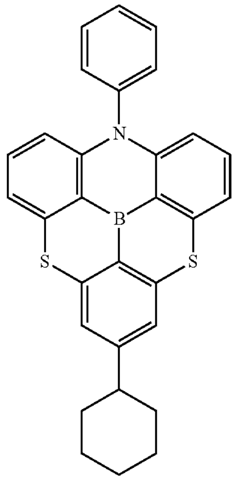
B130
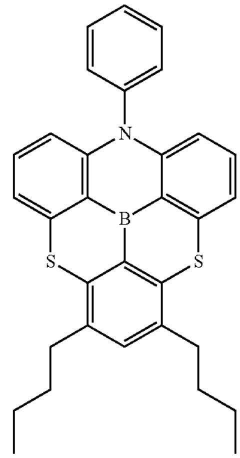
B131
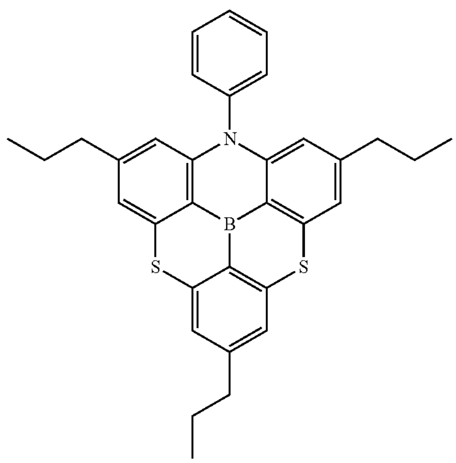
B132
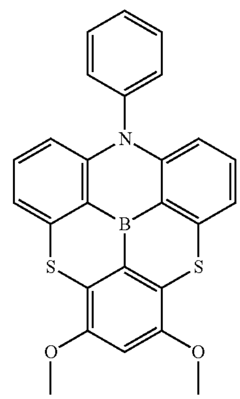
B133
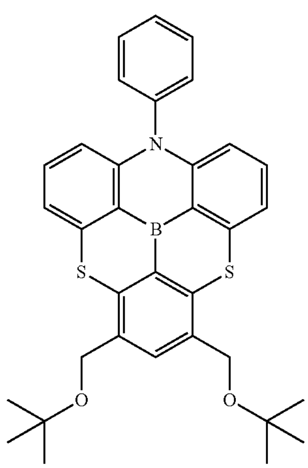
B134
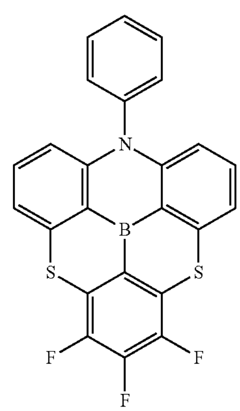

-continued
B135
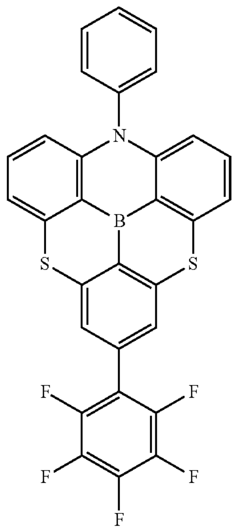
B136
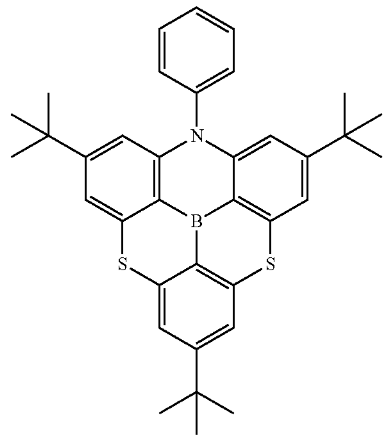
B137
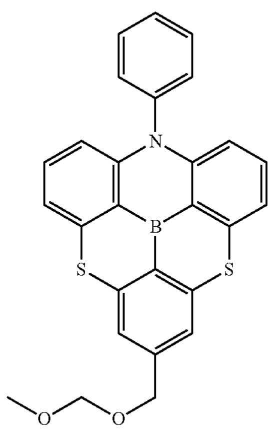
B138
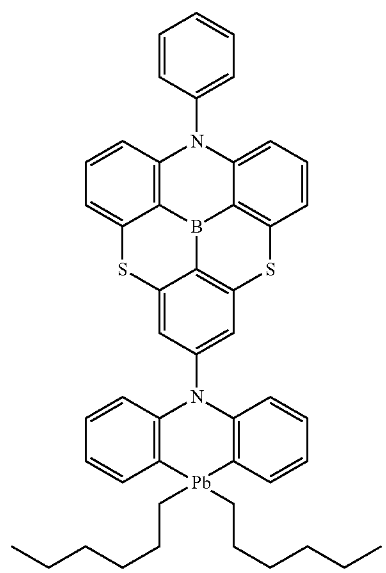
B139
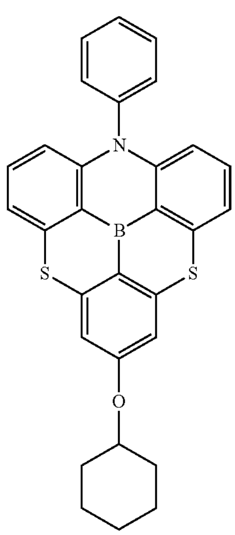
B140
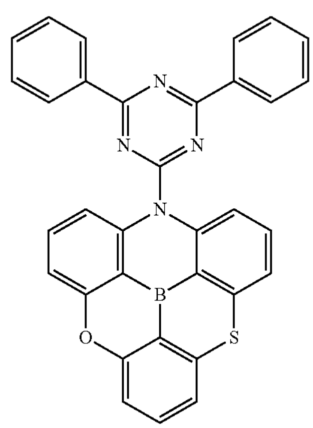

-continued
B141
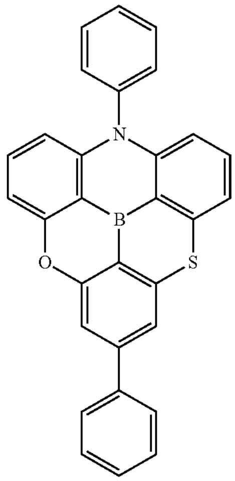
B142
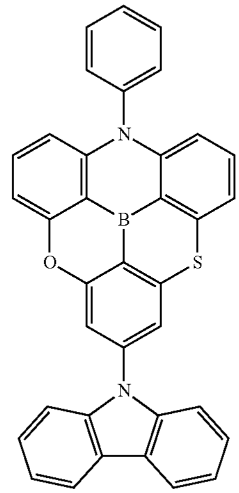
B143
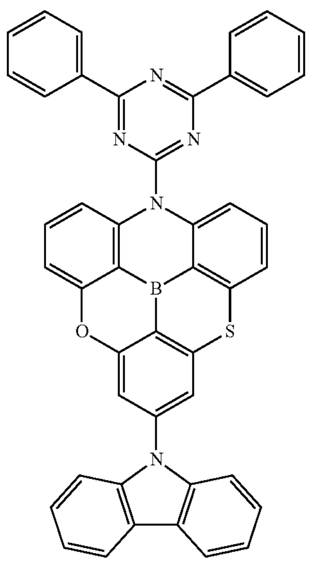
B144
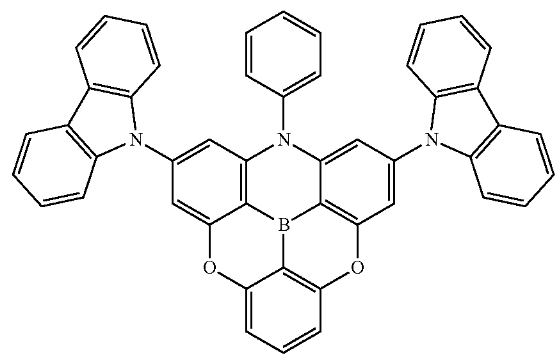
B145
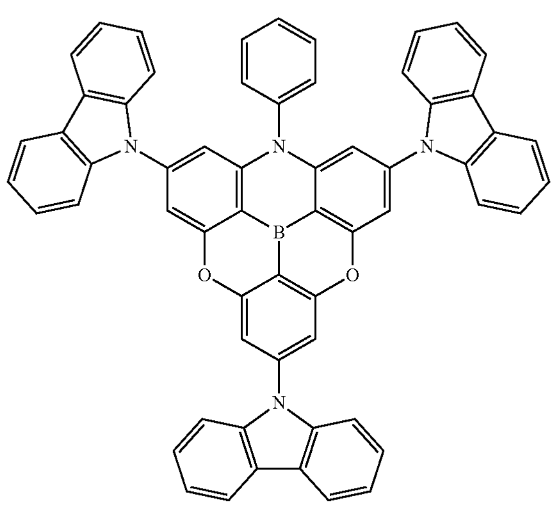
B146
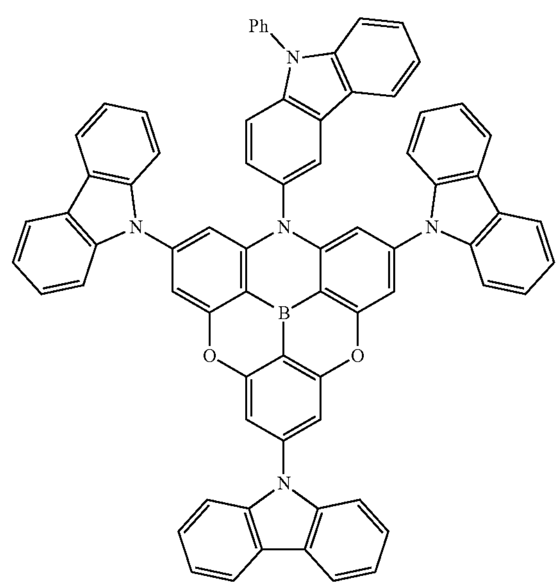

-continued
B147
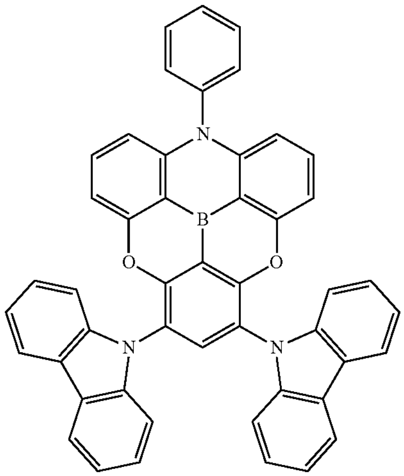
B148
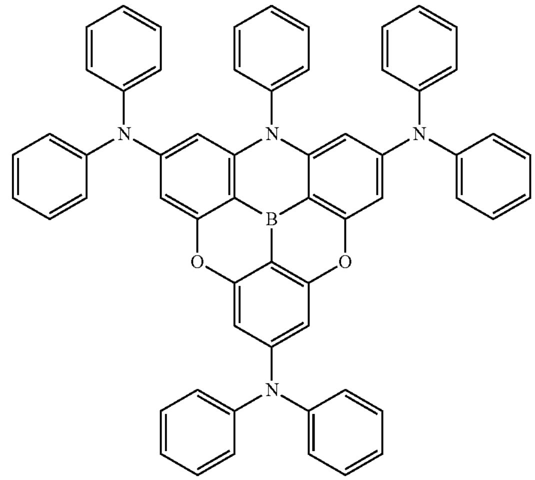
B149
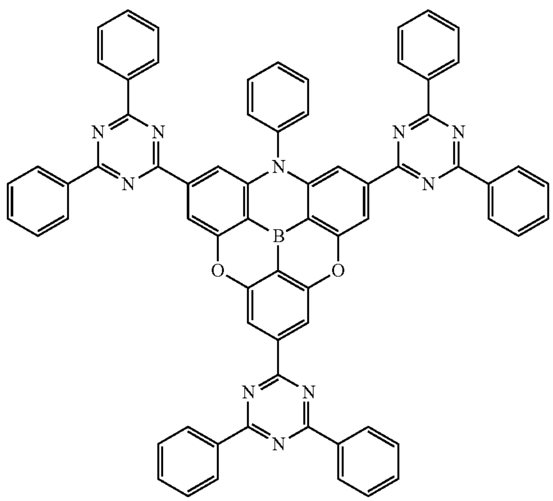
B150
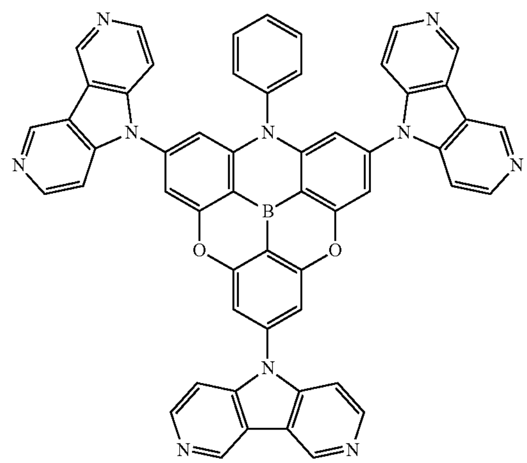
B151
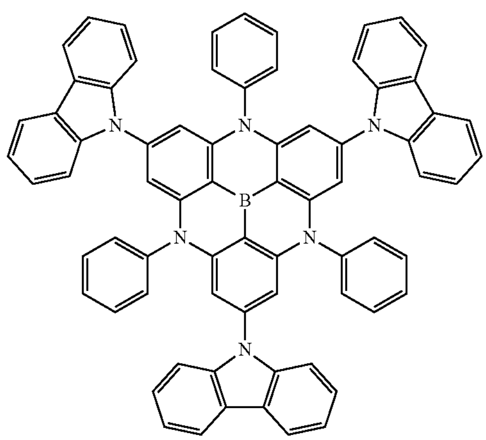
B152
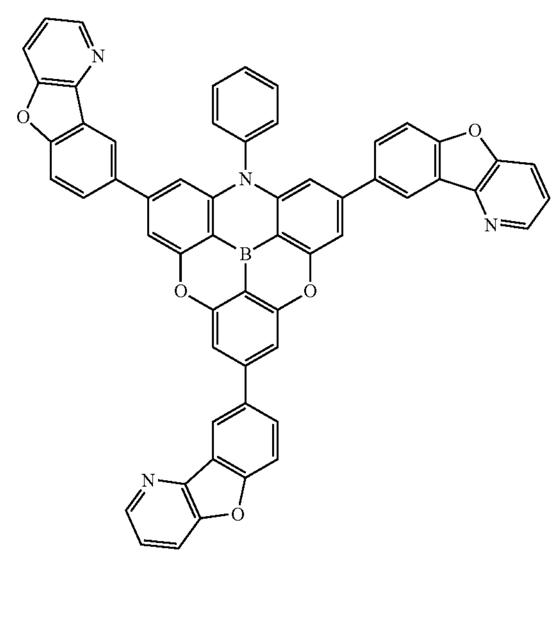

-continued
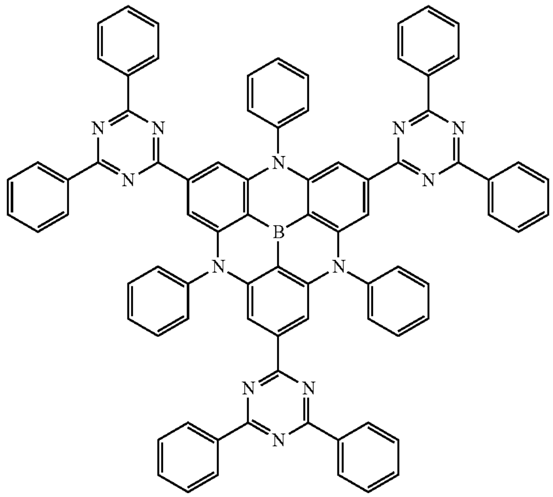
B154
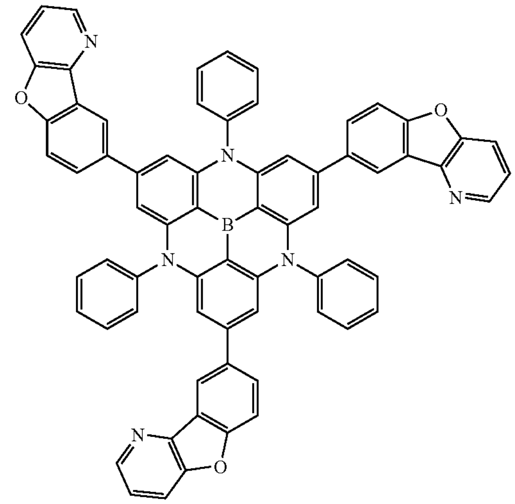
B155
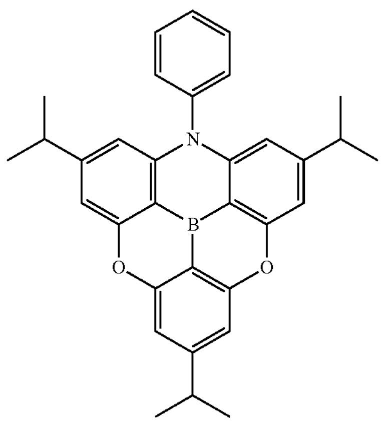
B156
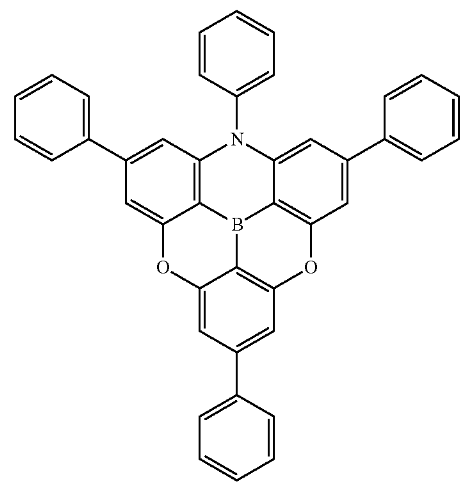
B157
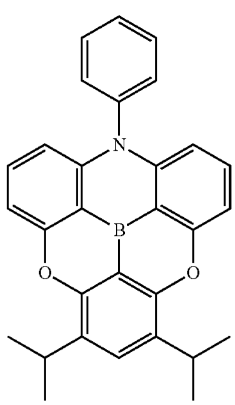
B158
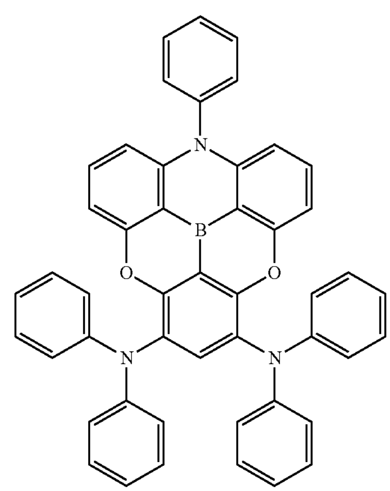

-continued
B159
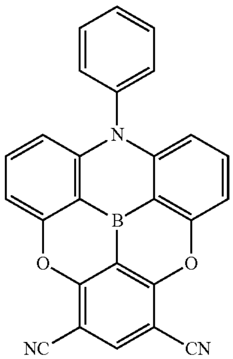
B160
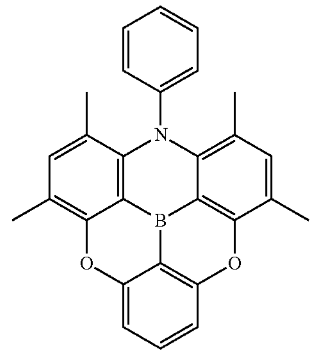
B161
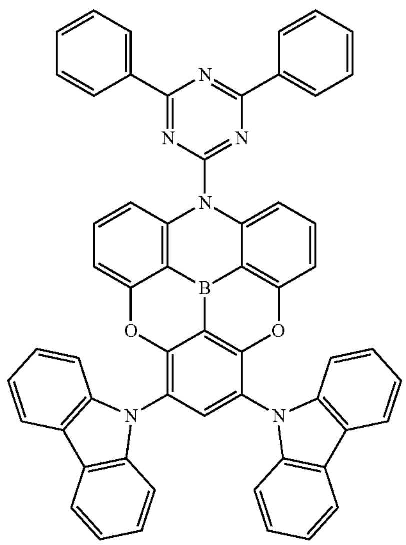
B162
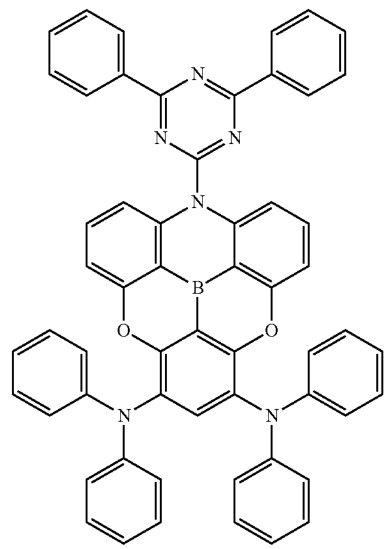
B163
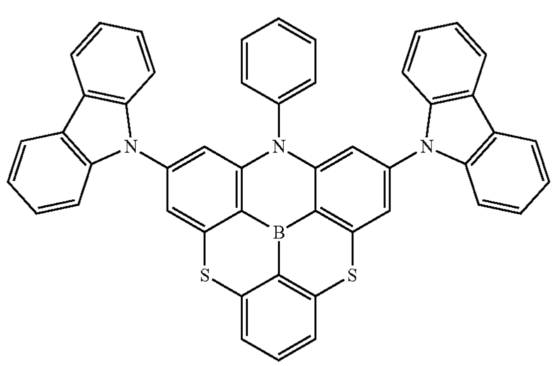
B164
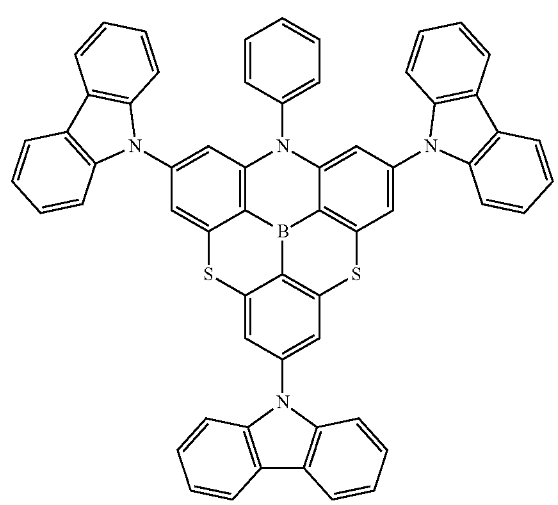

-continued
B165
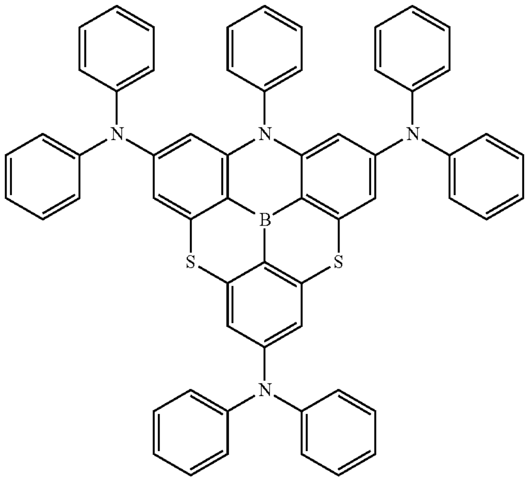
B166
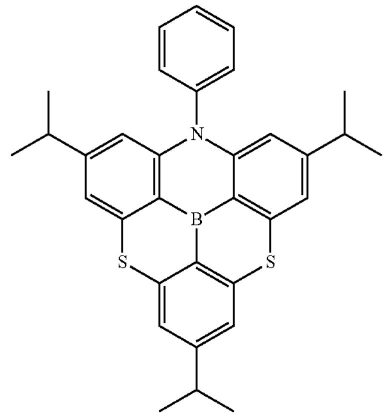
B167
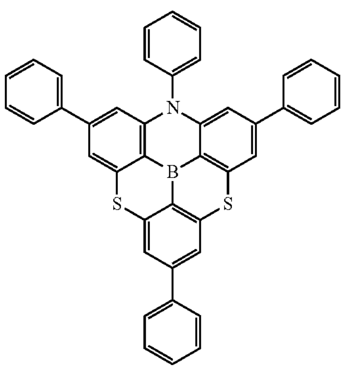
B168
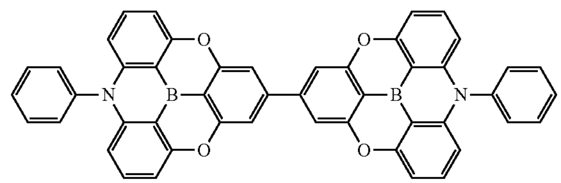
B169
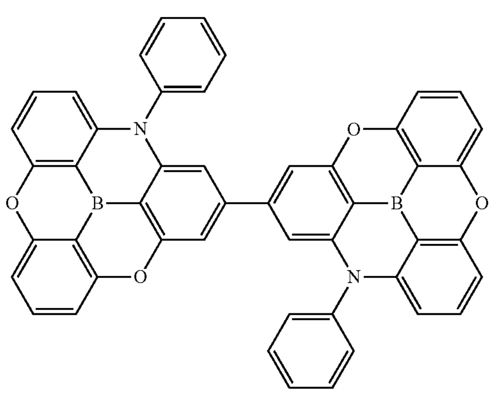
B170
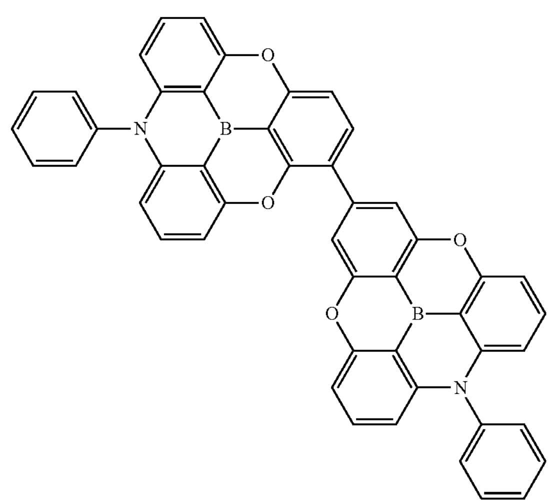

-continued
B171
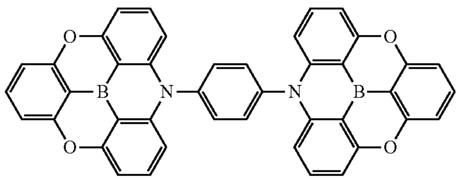
B172
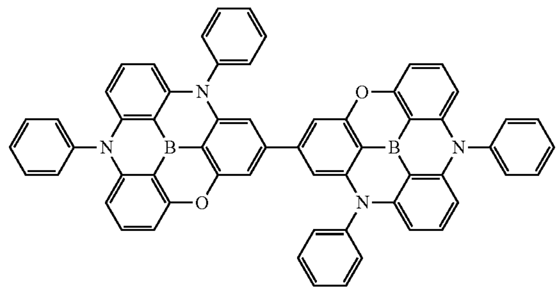
B173
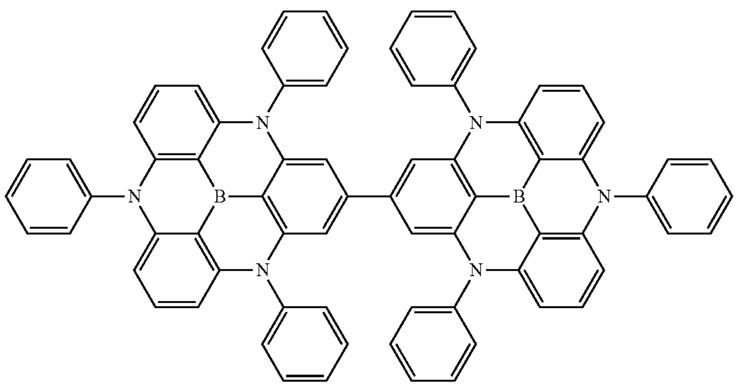
B174
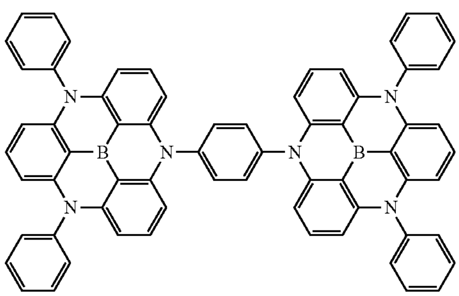
B175
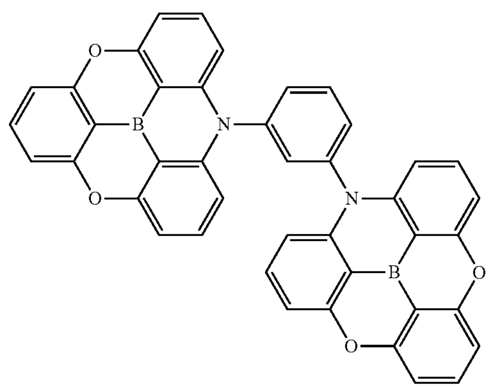
B176
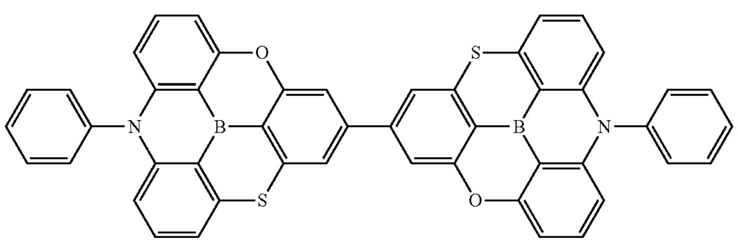
B177
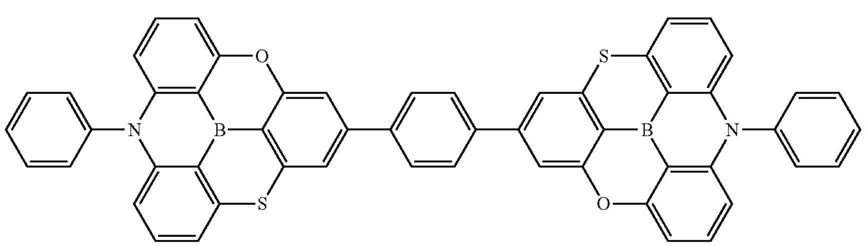

-continued
B178
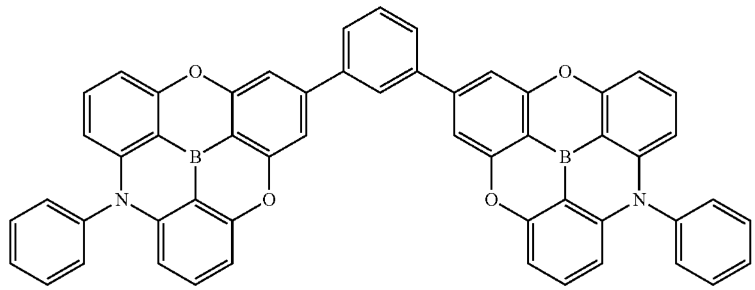
B179
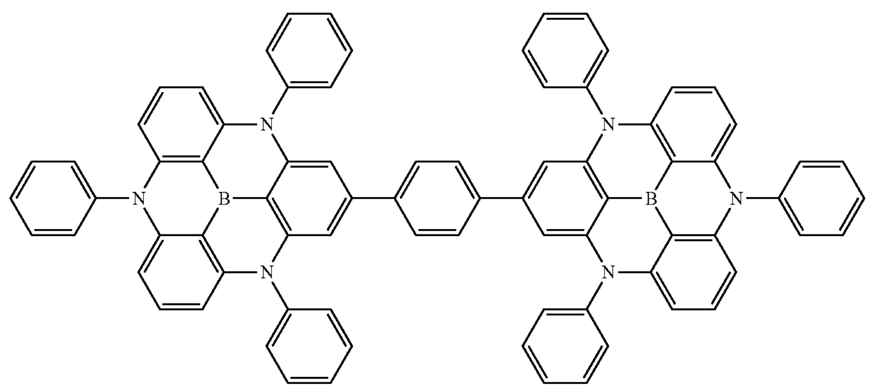
B180
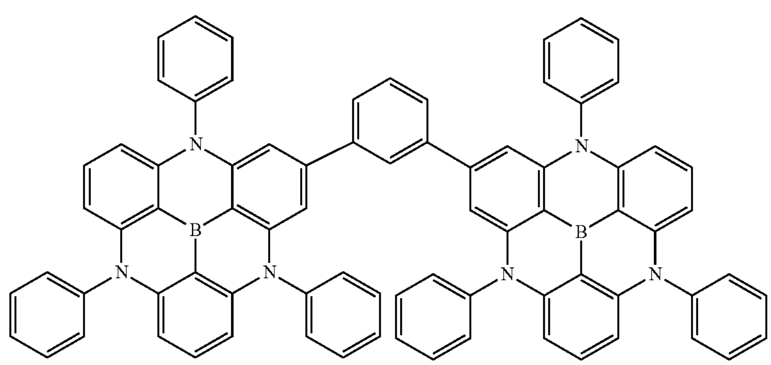
B181
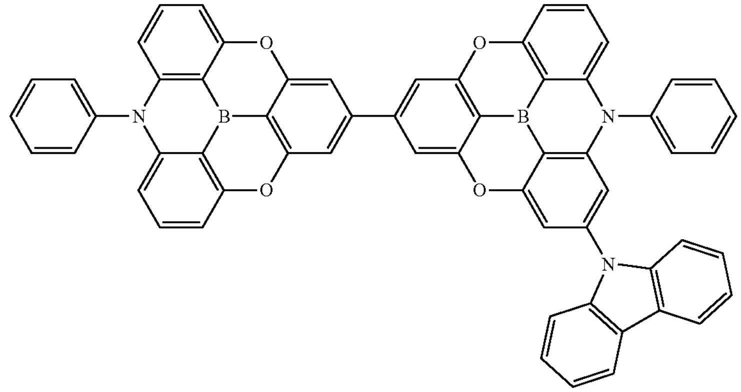

-continued
B182
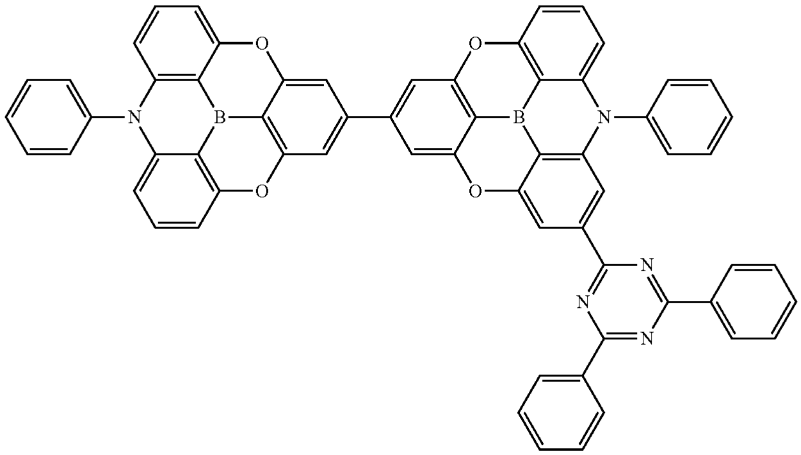
B183
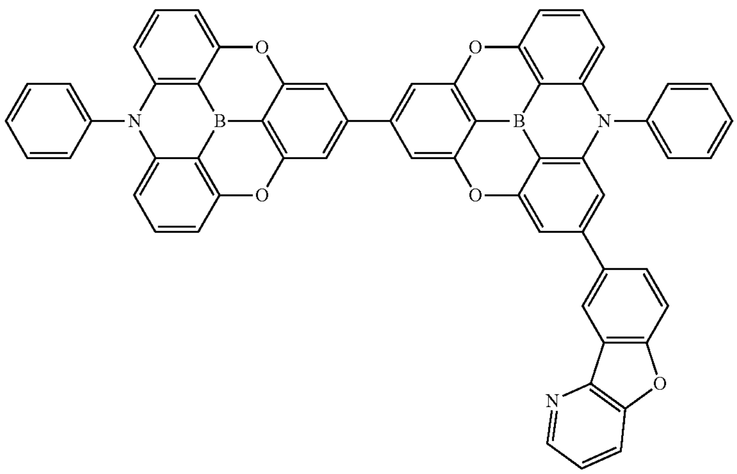
B184
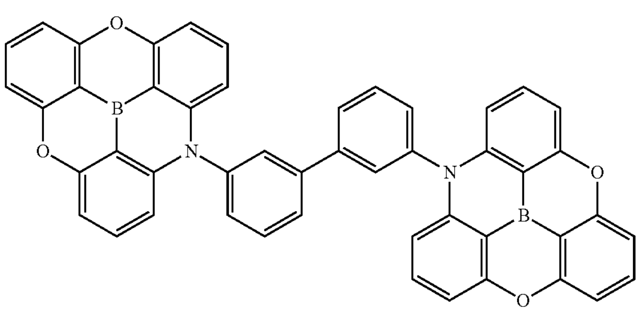
B185
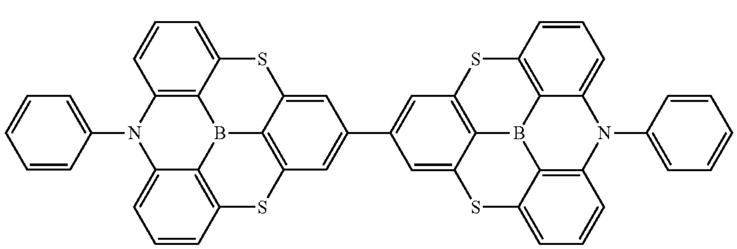

-continued
B186
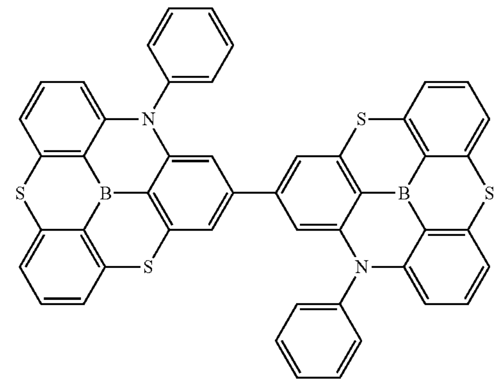
B187
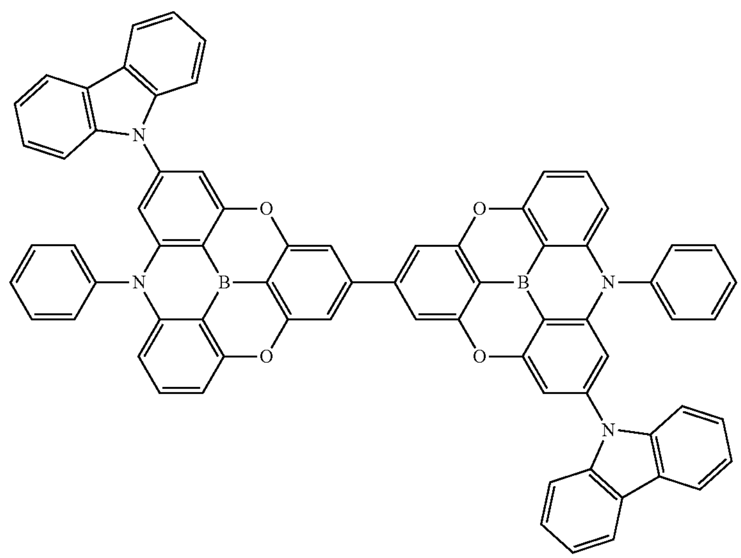
B188
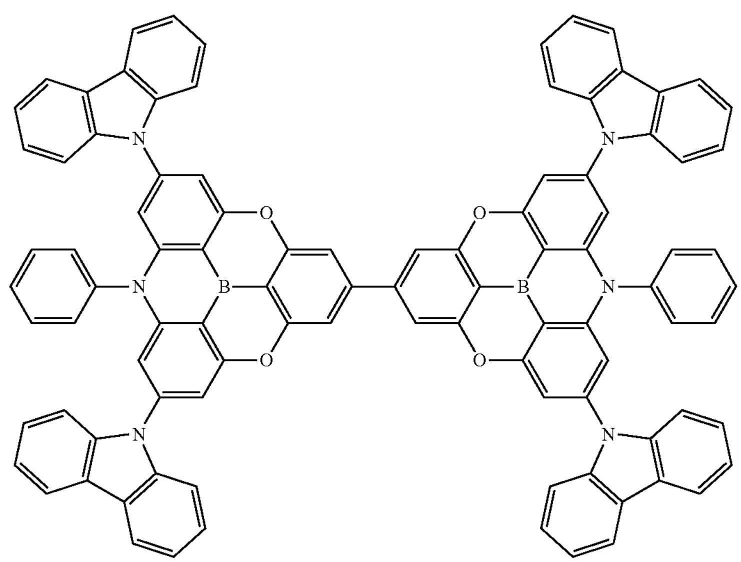

-continued
B189
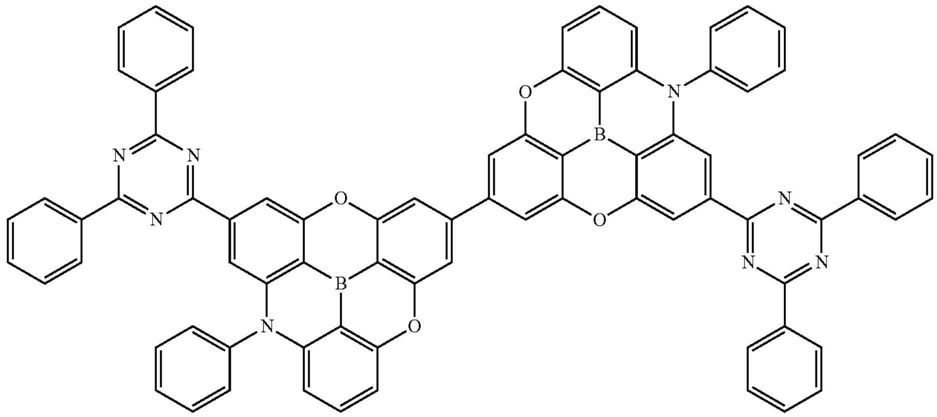
B190
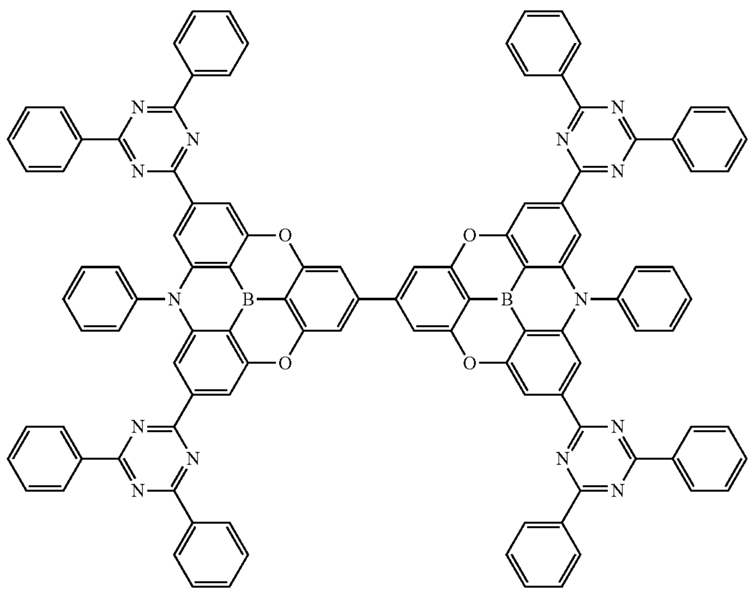
B191
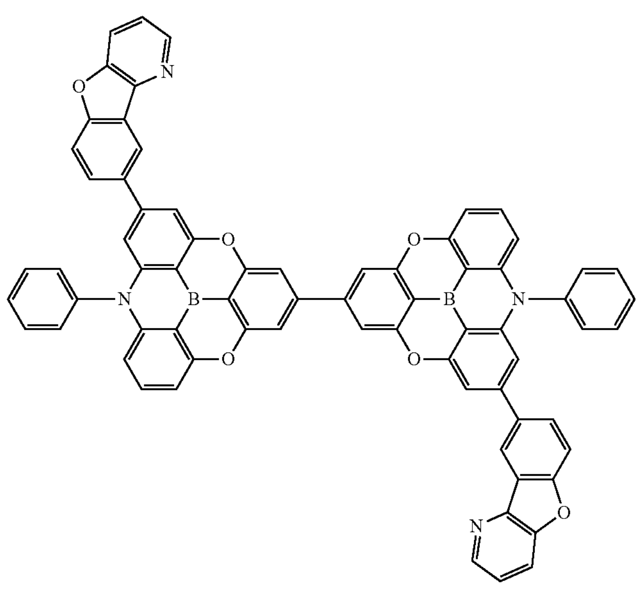

-continued
B192
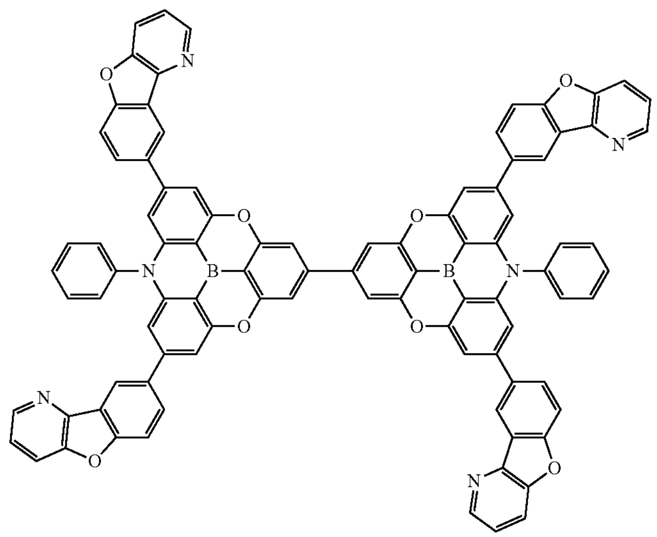
B193
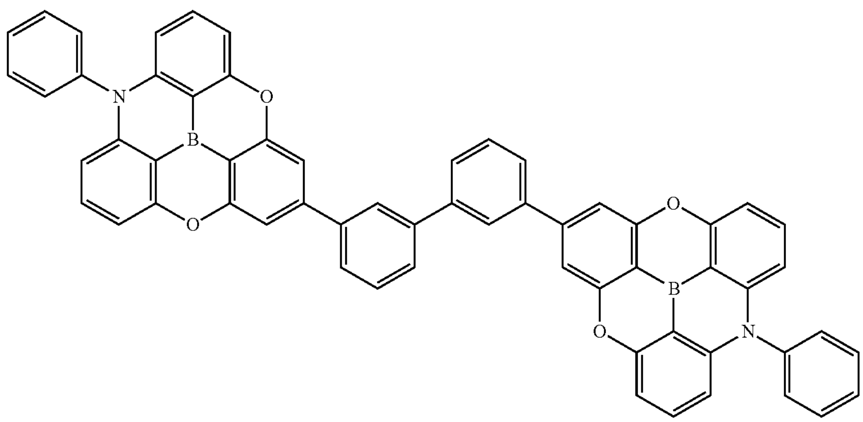
B194
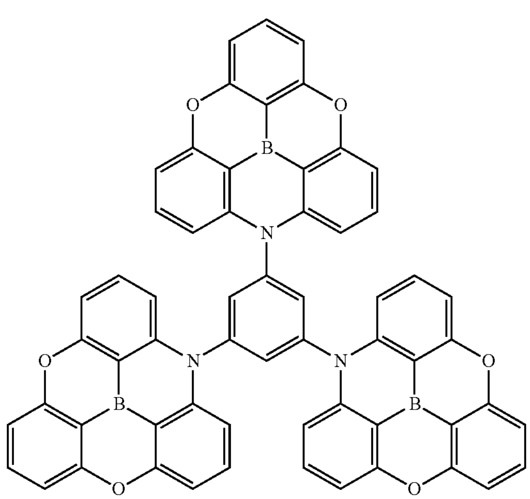
B195
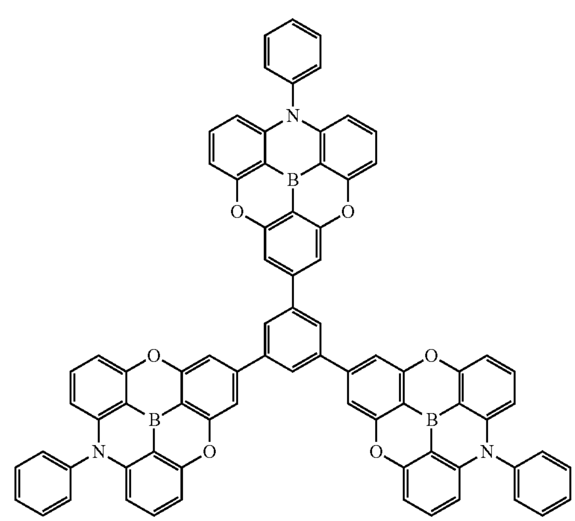

-continued
B196
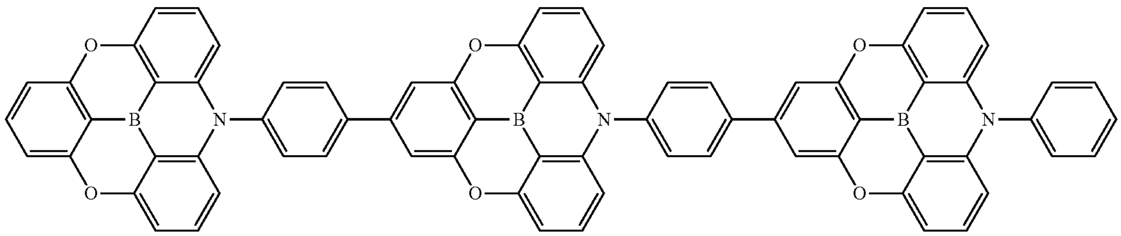
B197
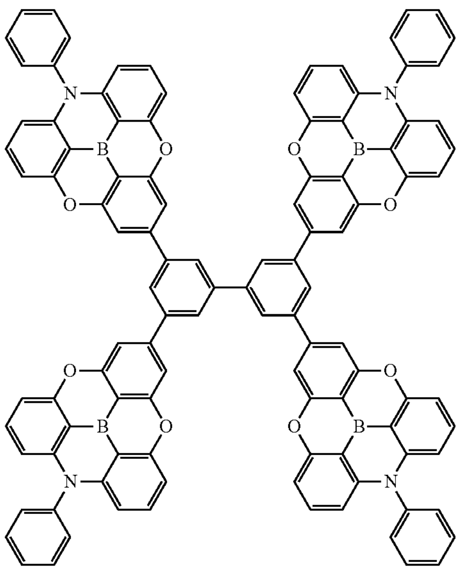
B198
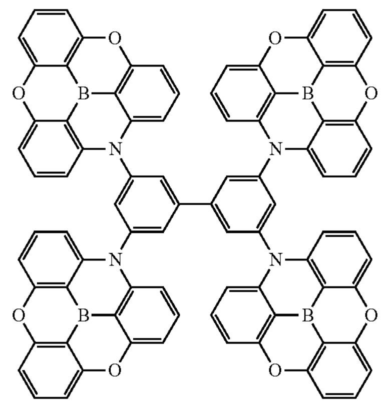
B199
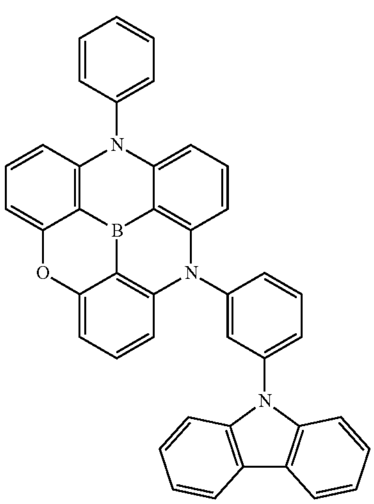
B200
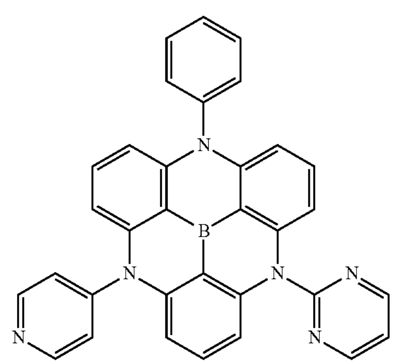

-continued

B201

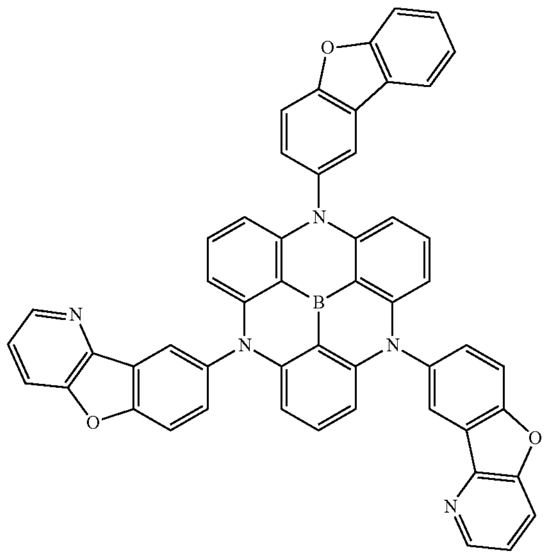

B202

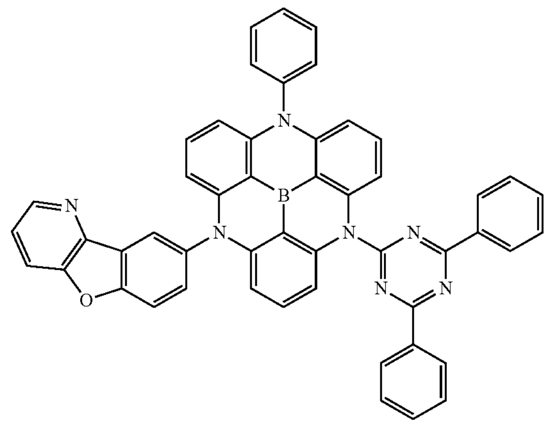

As a host material, a compound which is excellent in an electron acceptor property (electron transporting property) and an electron donor property (hole transporting property), and having a good balance in carrier transportability and carrier balance is preferable.

In the present invention, the planar borane unit itself in which an electron acceptor boron atom coexists with an electron donor nitrogen atom has both high carrier transportability and carrier balance. Therefore, in Formula (1), for example, exemplified compounds B1, B23, and B67 in which $Y_1$ or $R_1$ to $R_9$ represent a neutral unit are preferable.

It is also preferable that the exciton resistance and the carrier resistance of the molecule are further stabilized by expanding the π conjugated system while maintaining high carrier transportability and carrier balance.

In the present invention, it is particularly preferable that the molecule has two or more planar borane units, or, for example, the molecules are exemplified compounds B44, B156, B169 and B177 having a plurality of neutral units.

When both an electron acceptor aryl group and an electron donor aryl group are introduced into planar borane, both the electron transporting property and the hole transporting property are improved, and it is expected that the property as a host will be further improved.

In the present invention, for example, exemplified compounds B103, B105, B108, B109 and B161 are particularly preferable. These compounds have an electron acceptor aryl group for at least one of $Y_1$ and $R_1$ to $R_9$ in Formula (1) and an electron acceptor aryl group for another one of $Y_1$ and $R_1$ to $R_9$.

A high electron acceptor property is preferred as an electron transport material.

In the present invention, for example, exemplified compounds B6, B7, and B99 having an electron acceptor unit in at least one of $Y_1$ and $R_1$ to $R_9$ in Formula (1) are particularly preferable.

These compounds have a bipolar property by the presence of an electron donor nitrogen atom on the planar borane. Therefore, it is expected to exhibit an excellent effect as a host material having a high electron acceptor property.

A high electron donor property is preferred as a hole transport material.

In the present invention, for example, exemplified compounds B2, B12, B110, and B158 having an electron donor property unit in $Y_1$ and $R_1$ to $R_9$ of Formula (1) correspond thereto.

These compounds have a bipolar property by the presence of an electron acceptor boron atom on the planar borane. Therefore, it is expected to exhibit an excellent effect as a host material having a high electron donor property.

As described above, easy formation of π-π stacking between molecules facilitates hopping movement of carriers due to the proximity of intermolecular distances and improves carrier transportability. In the present invention, for example, exemplified compounds B6. B26, B29, and B99 having, furan, pyrimidine, triazine, oxazole, benzoxazole among electron acceptor property (electron withdrawing) units in $Y_1$ of Formula (1) correspond to this. These compounds are expected to exhibit even better carrier transportability. This is because the above substituent hardly receives steric hindrance with a peri-position hydrogen atom on planar borane and therefore it is possible to bond to planar borane on almost the same plane. When a π-conjugated boron compound having a structure represented by Formula (1) according to the present invention is used as a host material or a charge transport material, it is preferably used in an amount of 30 mass % or more, more preferably 50 mass % in each layer of the organic EL element.

In addition, when a π-conjugated boron compound having a structure represented by Formula (1) according to the present invention is used as a host material or a charge transport material, luminescence derived from the π-conjugated boron compound having a structure represented by Formula (1) is not substantially observed in the organic EL element.

<<Constitution Layers of Organic EL Element>>

The organic EL element of the present invention is an organic electroluminescence element having an organic layer sandwiched between an anode and a cathode, wherein the organic layer contains the material for an organic electroluminescence element of the present invention. The organic EL element of the present invention is suitably used for a lighting device and a display device.

Representative element constitutions used for an organic EL element of the present invention are as follows, however, the present invention is not limited to these.

(1) Anode/light emitting layer/cathode
(2) Anode/light emitting layer/electron transport layer/cathode
(3) Anode/hole transport layer/light emitting layer/cathode
(4) Anode/hole transport layer/light emitting layer/electron transport layer/cathode
(5) Anode/hole transport layer/light emitting layer/electron transport layer/electron injection layer/cathode
(6) Anode/hole injection layer/hole transport layer/light emitting layer/electron transport layer/cathode
(7) Anode/hole injection layer/hole transport layer/(electron blocking layer/) light emitting layer/(hole blocking layer/) electron transport layer/electron injection layer/cathode Among these, the constitution (7) is preferably used. However, the present invention is not limited to this.

The light emitting layer of the present invention is composed of one or a plurality of layers. When a plurality of layers are employed, it may be placed a non-light emitting intermediate layer between the light emitting layers.

According to necessity, it may be provided with a hole blocking layer (it is also called as a hole barrier layer) or an electron injection layer (it is also called as a cathode buffer layer) between the light emitting layer and the cathode. Further, it may be provided with an electron blocking layer (it is also called as an electron barrier layer) or an hole injection layer (it is also called as an anode buffer layer) between the light emitting layer and the anode.

An electron transport layer according to the present invention is a layer having a function of transporting an electron. An electron transport layer includes an electron injection layer, and a hole blocking layer in a broad sense. Further, an electron transport layer unit may be composed of plural layers.

A hole transport layer according to the present invention is a layer having a function of transporting a hole. A hole transport layer includes a hole injection layer, and an electron blocking layer in a broad sense. Further, a hole transport layer unit may be composed of plural layers.

In the representative element constitutions as described above, the layers eliminating an anode and a cathode are also called as "organic layers".

(Tandem Structure)

An organic EL element of the present invention may be so-called a tandem structure element in which plural light emitting units each containing at least one light emitting are laminated.

A representative example of an element constitution having a tandem structure is as follows.

Anode/first light emitting unit/intermediate layer/second light emitting unit/intermediate layer/third light emitting unit/cathode.

Here, the above-described first light emitting unit, second light emitting unit, and third light emitting unit may be the same or different. It may be possible that two light emitting units are the same and the remaining one light emitting unit is different.

The plural light emitting units each may be laminated directly or they may be laminated through an intermediate layer. Examples of an intermediate layer are: an intermediate electrode, an intermediate conductive layer, a charge generating layer, an electron extraction layer, a connecting layer, and an intermediate insulating layer. Known composing materials may be used as long as it can form a layer which has a function of supplying an electron to an adjacent layer to the anode, and a hole to an adjacent layer to the cathode.

Examples of a material used in an intermediate layer are: conductive inorganic compounds such as ITO (indium tin oxide), IZO (indium zinc oxide), $ZnO_2$, TiN, ZrN, HfN, $TiO_X$, $VO_X$, CuI, InN, GaN, $CuAlO_2$, $CuGaO_2$, $SrCu_2O_2$, $LaB_6$, $RuO_2$, and Al; a two-layer film such as $Au/Bi_2O_3$; a multi-layer film such as $SnO_2/Ag/SnO_2$, ZnO/Ag/ZnO, $Bi_2O_3/Au/Bi_2O_3$, $TiO_2/TiN/TiO_2$, and $TiO_2/ZrN/O_2$; fullerene such as $C_{60}$; and a conductive organic layer such as oligothiophene, metal phthalocyanine, metal-free phthalocyanine, metal porphyrin, and metal-free porphyrin. The present invention is not limited to them.

Examples of a preferable constitution in the light emitting unit are the constitutions of the above-described (1) to (7) from which an anode and a cathode are removed. However, the present invention is not limited to them.

Examples of a tandem type organic EL element are described in: U.S. Pat. Nos. 6,337,492, 7,420,203, 7,473,923, 6,872,472, 6,107,734, 6,337,492, WO 2005/009087, JP-A 2006-228712, JP-A 2006-24791, JP-A 2006-49393, JP-A 2006-49394, JP-A 2006-49396, JP-A 2011-96679, JP-A 2005-340187, JP Patent 4711424, JP Patent 3496681, JP Patent 3884564, JP Patent 4213169, JP-A 2010-192719, JP-A 2009-076929, JP-A 2008-078414, JP-A 2007-059848, JP-A 2003-272860, JP-A 2003-045676, and WO 2005/094130. The constitutions of the elements and the composing materials are described in these documents, however, the present invention is not limited to them.

Each layer that constitutes an organic EL element of the present invention will be described in the following.

<<Light Emitting Layer>>

A light emitting layer according to the present invention is a layer which provide a place of emitting light via an exciton produce by recombination of electrons and holes injected from an electrode or an adjacent layer. The light emitting portion may be either within the light emitting layer or at an interface between the light emitting layer and an adjacent layer thereof. The constitution of the light emitting layer according to the present invention is not particularly limited as long as it satisfies the requirements of the present invention.

A total thickness of the light emitting layer is not particularly limited. However, in view of layer homogeneity, required voltage during light emission, and stability of the emitted light color against a drive electric current, the total layer thickness is preferably adjusted to be in the range of 2 nm to 5 μm, more preferably, it is in the range of 2 to 500 nm, and still most preferably, it is in the range of 5 to 200 nm.

Each light emitting layer used in the present invention is preferably adjusted to be in the range of 2 nm to 1 μm, more preferably, it is in the range of 2 to 200 nm, and still most preferably, it is in the range of 3 to 150 nm.

The light emitting layer used in the present invention may be one layer or a plurality of layers. When the π-conjugated boron compound according to the present invention is used in the light emitting layer, it is preferable that at least one layer of the light emitting layers contains the π-conjugated boron compound according to the present invention and a light emitting dopant (also referred to as a light emitting compound, a light emitting dopant, or simply referred to as a; dopant). When at least one layer of the light emitting layer contains the π-conjugated boron compound according to the present invention and at least one of a fluorescent light emitting compound and a phosphorescent light emitting compound, the emission efficiency is improved. This is preferable.

(1) Light Emitting Dopant

As a light emitting dopant (also referred to as a light emitting compound), it is preferable to employ: a fluorescence emitting dopant (also referred to as a fluorescent compound and a fluorescent dopant) and a phosphorescence emitting dopant (also referred to as a phosphorescence emitting compound and a phosphorescent emitting dopant). In the present invention, it is preferable that at least one of the light emitting layers contains a fluorescent compound or a phosphorescent emitting dopant in the range of 0.1 to 50 mass %, more preferably in the range of 1 to 30 mass %.

In the present invention, it is preferable that the light emitting layer contains a light emitting compound in the range of 0.1 to 50 mass %, more preferably in the range of 1 to 30 mass %.

A concentration of a light emitting compound in a light emitting layer may be arbitrarily decided based on the specific compound employed and the required conditions of the device. A concentration of a light emitting compound may be uniform in a thickness direction of the light emitting layer, or it may have any concentration distribution.

It may be used plural light emitting compounds of the present invention. It may be used a combination of fluorescent compounds each having a different structure, or a combination of a fluorescence emitting compound and a phosphorescence emitting compound. Any required emission color will be obtained by this.

Figure 3:
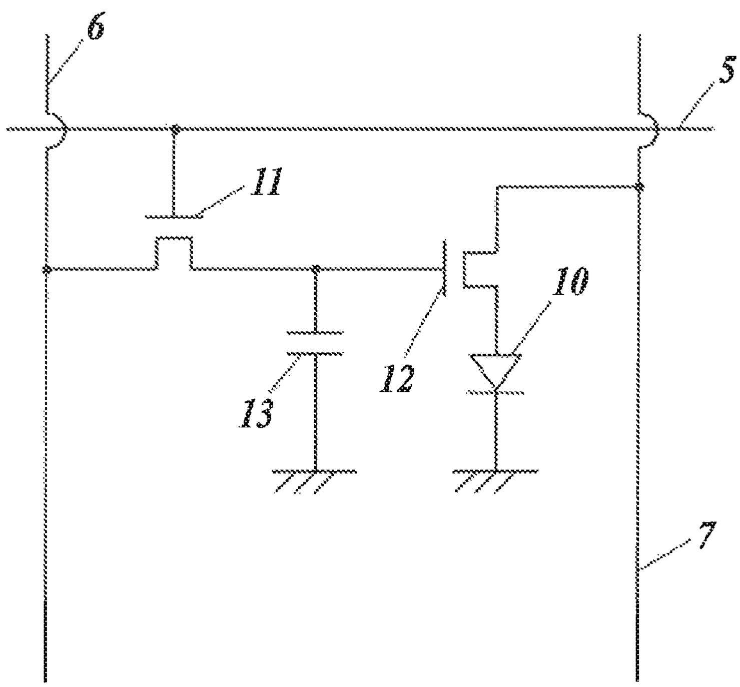
FIG. 3 is a schematic view illustrating a pixel circuit.

Color of light emitted by an organic EL element or a compound of the present invention is specified as follows. In FIG. 3.16 on page 108 of "Shinpen Shikisai Kagaku Handbook (New Edition Color Science Handbook)" (edited by The Color Science Association of Japan, Tokyo Daigaku Shuppan Kai, 1985), values determined via Spectroradiometer CS-1000 (produced by Konica Minolta, Inc.) are applied to the CIE chromaticity coordinate, whereby the color is specified.

In the present invention, it is preferable one or plural light emitting layers contain plural emission dopants having different emission colors to emit white light.

The combination of emission dopants producing white is not specifically limited. It may be cited, for example, combinations of: blue and orange; and blue, green and red.

It is preferable that "white" in the organic EL element of the present invention shows chromaticity in the CIE 1931 Color Specification System at 1,000 cd/$m^2$ in the region of x=0.39±0.09 and y=0.38±0.08, when measurement is done to 2-degree viewing angle front luminance via the aforesaid method.

(1.2) Fluorescence Emitting Dopant

As a fluorescence emitting dopant (a fluorescent dopant), it may be suitably selected from the known fluorescent dopants and delayed fluorescent dopants used in a light emitting layer of an organic EL element.

As specific known fluorescence emitting dopants usable in the present invention, listed are compounds such as: an anthracene derivative, a pyrene derivative, a chrysene derivative, a fluoranthene derivative, a perylene derivative, a fluorene derivative, an arylacetylene derivative, a styrylarylene derivative, a styrylamine derivative, an arylamine derivative, a boron complex, a coumarin derivative, a pyran derivative, a cyanine derivative, a croconium derivative, a squarium derivative, an oxobenzanthracene derivative, a fluorescein derivative, a rhodamine derivative, a pyrylium derivative, a perylene derivative, a polythiophene derivative, and a rare earth complex compound.

In addition, it has been developed a light emitting dopant utilizing delayed fluorescence. It may be used a light emitting dopant utilizing this type of fluorescence. Specific examples of utilizing delayed fluorescence are compounds described in: WO 2011/156793, JP-A 2011-213643, JP-A 2010-93181, and JP 5366106. However, the present invention is not limited to them.

(1.3) Phosphorescence Emitting Dopant

The phosphorescence emitting dopant according to the present invention is a compound which is observed emission from an excited triplet state thereof. Specifically, it is a compound which emits phosphorescence at a room temperature (25° C.) and exhibits a phosphorescence quantum yield of at least 0.01 at 25° C. The phosphorescence quantum yield is preferably at least 0.1.

The phosphorescence quantum yield will be determined via a method described in page 398 of Bunko II of Dai 4 Han Jikken Kagaku Koza 7 (Spectroscopy II of 4th Edition Lecture of Experimental Chemistry 7) (1992, published by Maruzen Co. Ltd.). The phosphorescence quantum yield in a solution will be determined using appropriate solvents. However, it is only necessary for the phosphorescent dopant of the present invention to exhibit the above phosphorescence quantum yield (0.01 or more) using any of the appropriate solvents.

A phosphorescence dopant may be suitably selected and employed from the known materials used for a light emitting layer for an organic EL element.

Examples of a known phosphorescence dopant are compound described in the following publications.

Nature 395, 151 (1998), Appl. Phys. Lett. 78, 1622 (2001), Adv. Mater. 19, 739 (2007), Chem. Mater. 17, 3532 (2005), Adv. Mater. 17, 1059 (2005), WO 2009/100991, WO 2008/101842, WO 2003/040257, US 2006/835469, US 2006/0202194, US 2007/0087321, US 2005/0244673, Inorg. Chem. 40, 1704 (2001), Chem. Mater. 16, 2480 (2004), Adv. Mater. 16, 2003 (2004), Angew. Chem. Int. Ed. 2006, 45, 7800, Appl. Phys. Lett. 86, 153505 (2005), Chem. Lett. 34, 592 (2005), Chem. Commun. 2906 (2005), Inorg. Chem. 42, 1248 (2003), WO 2009/050290, WO 2002/015645, WO 2009/000673, US 2002/0034656, U.S. Pat. No. 7,332,232, US 2009/0108737, US 2009/0039776, U.S. Pat. Nos. 6,921,915, 6,687,266, US 2007/0190359, US 2006/0008670, US 2009/0165846, US 2008/0015355, U.S. Pat. Nos. 7,250,226, 7,396,598, US 2006/0263635, US 2003/0138657, US 2003/0152802, U.S. Pat. No. 7,090,928, Angew. Chem. Int. Ed. 47, 1 (2008), Chem. Mater. 18, 5119 (2006), Inorg. Chem. 46, 4308 (2007), Organometallics 23, 3745 (2004), Appl. Phys. Lett. 74, 1361 (1999), WO 2002/002714, WO 2006/009024, WO 2006/056418, WO 2005/019373, WO 2005/123873, WO 2005/123873, WO 2007/004380, WO 2006/082742, US 2006/0251923, US 2005/0260441, U.S. Pat. Nos. 7,393,599, 7,534,505, 7,445,855, US 2007/0190359, US 2008/0297033, U.S. Pat. No. 7,338,722, US 2002/0134984, and U.S. Pat. No. 7,279,704, US 2006/098120, US 2006/103874, WO 2005/076380, WO 2010/032663, WO 2008/140115, WO 2007/052431, WO 2011/134013, WO 2011/157339, WO 2010/086089, WO 2009/113646, WO 2012/020327, WO 2011/051404, WO 2011/004639, WO 2011/073149, JP-A 2012-069737, JP Application No. 2011-181303, JP-A 2009-114086, JP-A 2003-81988, JP-A 2002-302671 and JP-A 2002-363552.

Among them, preferable phosphorescence emitting dopants are organic metal complexes containing Ir as a center metal. More preferable are complexes containing at least one coordination mode selected from a metal-carbon bond, a metal-nitrogen bond, a metal-oxygen bond and a metal-sulfur bond.

(2) Host Compound

In the present invention, the π-conjugated boron compound according to the present invention may be used as a host material. When the π-conjugated boron compound according to the present invention is not used as a host material, other known host compounds may be used singly or in combination. By using a plurality of host compounds, it is possible to adjust the movement of charges, and it is possible to increase the efficiency of the organic electroluminescence element.

A host compound used in the present invention is a compound which mainly plays a role of injecting or transporting a charge in a light emitting layer. In an organic EL element, an emission from the host compound itself is substantially not observed.

Among the compounds incorporated in the light emitting layer, a mass ratio of the host compound in the aforesaid layer is preferably at least 20%.

A host compound has a hole transporting ability or an electron transporting ability, as well as preventing elongation of an emission wavelength. In addition, from the viewpoint of stably driving an organic EL element at high temperature, it is preferable that a host compound has a high glass transition temperature (T) of 90° C. or more, more preferably, has a Tg of 120° C. or more.

Here, a glass transition temperature (Tg) is a value obtained using DSC (Differential Scanning Colorimetry) based on the method in conformity to JIS-K-7121-2012.

As specific examples of a known host compound used in an organic EL element of the present invention, the compounds described in the following Documents are cited. However, the present invention is not to them.

Japanese patent application publication (JP-A) Nos. 2015-38941, 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084 and 2002-308837; US Patent Application Publication (US) Nos. 2003/0175553, 2006/0280965, 2005/0112407, 2009/0017330, 2009/0030202, 2005/0238919; WO 2001/039234, WO 2009/021126, WO 2008/056746, WO 2004/093 207, WO 2005/089025, WO 2007/063796, WO 2007/063754, WO 2004/107822, WO 2005/030900, WO 2006/114966, WO 2009/086028, WO 2009/003898, WO 2012/023947, JP-A 2008-074939, JP-A 2007-254297, EP 2034538, WO 2011/055933, and WO 2012/035853.

<<Electron Transport Layer>>

An electron transport layer of the present invention is composed of a material having a function of transferring an electron. It is only required to have a function of transporting an injected electron from a cathode to a light emitting layer.

A total layer thickness of the electron transport layer is not specifically limited, however, it is generally in the range of 2 nm to 5 μm, and preferably, it is in the range of 2 to 500 nm, and more preferably, it is in the range of 5 to 200 nm.

In an organic EL element of the present invention, it is known that there occurs interference between the light directly taken from the light emitting layer and the light reflected at the electrode located at the opposite side of the electrode from which the light is taken out at the moment of taking out the light which is produced in the light emitting layer. When the light is reflected at the cathode, it is possible to use effectively this interference effect by suitably adjusting the total thickness of the electron transport layer in the range of several nm to several μm.

On the other hand, the voltage will be increased when the layer thickness of the electron transport layer is made thick. Therefore, especially when the layer thickness is large, it is preferable that the electron mobility in the electron transport layer is $1\times10^{-5}$ $cm^2/Vs$ or more.

As a material used for an electron transport layer (hereafter, it is called as an electron transport material), it is only required to have either a property of ejection or transport of electrons, or a barrier to holes. Any of the conventionally known compounds may be selected and they may be employed.

Cited examples thereof include: a nitrogen-containing aromatic heterocyclic derivative (a carbazole derivative, an azacarbazole derivative (a compound in which one or more carbon atoms constituting the carbazole ring are substitute with nitrogen atoms), a pyridine derivative, a pyrimidine derivative, a pyrazine derivative, a pyridazine derivative, a triazine derivative, a quinoline derivative, a quinoxaline derivative, a phenanthroline derivative, an azatriphenylene derivative, an oxazole derivative, a thiazole derivative, an oxadiazole derivative, a thiadiazole derivative, a triazole derivative, a benzimidazole derivative, a benzoxazole derivative, and a benzothiazole derivative); a dibenzofuran derivative, a dibenzothiophene derivative, a silole derivative; and an aromatic hydrocarbon ring derivative (a naphthalene derivative, an anthracene derivative and a triphenylene derivative).

Further, metal complexes having a ligand of a 8-quinolinol structure or dibnenzoquinolinol structure such as tris(8-quinolinol)aluminum ($Alq_3$), tris(5,7-dichloro-8-quinolinol) aluminum, tris(5,7-dibromo-8-quinolinol)aluminum, tris(2-methyl-8-quinolinol)aluminum, tris(5-methyl-8-quinolinol) aluminum and bis(8-quinolinol)zinc (Znq); and metal complexes in which a central metal of the aforesaid metal complexes is substituted by In, Mg, Cu, Ca, Sn, Ga or Pb, may be also utilized as an electron transport material.

Further, a metal-free or metal phthalocyanine, or a compound whose terminal is substituted by an alkyl group or a sulfonic acid group, may be preferably utilized as an electron transport material. A distyryl pyrazine derivative, which is exemplified as a material for a light emitting layer, may be used as an electron transport material. Further, in the same manner as used for a hole injection layer and a hole transport layer, an inorganic semiconductor such as an n-type Si and an n-type SiC may be also utilized as an electron transport material.

It may be used a polymer material introduced these compounds in the polymer side-chain or a polymer material having any one of these substance in a polymer main chain.

In an electron transport layer according to the present invention, it is possible to employ an electron transport layer of a high n property (electron rich) which is doped with impurities as a guest material. As examples of a dope material, listed are those described in each of JP-A Nos. 4-297076, 10-270172, 2000-196140, 2001-102175, as well as in J. Appl. Phys., 95, 5773 (2004).

Although the present invention is not limited thereto, preferable examples of a known electron transport material used in an organic EL element of the present invention are compounds described in the following publications.

U.S. Pat. Nos. 6,528,187, 7,230,107, US 2005/0025993, US 2004/0036077, US 2009/0115316, US 2009/0101870, US 2009/0179554, WO 2003/060956, WO 2008/132085, Appl. Phys. Lett. 75, 4 (1999), Appl. Phys. Lett. 79, 449 (2001), Appl. Phys. Lett. 81, 162 (2002), Appl. Phys. Lett. 81, 162 (2002), Appl. Phys. Lett. 79, 156 (2001), U.S. Pat. No. 7,964,293, US 2009/030202, WO 2004/080975, WO 2004/063159, WO 2005/085387, WO 2006/067931, WO 2007/086552, WO 2008/114690, WO 2009/069442, WO 2009/066779, WO 2009/054253, WO 2011/086935, WO 2010/150593, WO 2010/047707, EP 2311826, JP-A 2010-251675, JP-A 2009-209133, JP-A 2009-124114, JP-A 2008-277810, JP-A 2006-156445, JP-A 2005-340122, JP-A 2003-45662, JP-A 2003-31367, JP-A 2003-282270, and WO 2012/115034.

As a preferable electron transport material, it may be cited an aromatic heterocyclic ring compound containing at least one nitrogen atom. Examples thereof are: a pyridine derivative, a pyrimidine derivative, a pyrazine derivative, a triazine derivative, a dibenzofuran derivative, a dibenzothiophene derivative, a carbazole derivative, an azacarbazole derivative, a benzimidazole derivative, and an aryl phosphine oxide derivative. An electron transport material may be used singly, or may be used in combination of plural kinds of compounds.

<<Hole Blocking Layer>>

A hole blocking layer is a layer provided with a function of an electron transport layer in a broad meaning. Preferably, it contains a material having a function of transporting an electron, and having very small ability of transporting a hole. It will improve the recombination probability of an electron and a hole by blocking a hole while transporting an electron.

Further, a composition of an electron transport layer described above may be appropriately utilized as a hole blocking layer of the present invention when needed.

A hole blocking layer placed in an organic EL element of the present invention is preferably arranged at a location in the light emitting layer adjacent to the cathode side.

A thickness of a hole blocking layer according to the present invention is preferably in the range of 3 to 100 nm, and more preferably, in the range of 5 to 30 nm.

With respect to a material used for a hole blocking layer, the material used in the aforesaid electron transport layer is suitably used, and further, the material used as the aforesaid host compound is also suitably used for a hole blocking layer.

<<Electron Injection Layer>>

An electron injection layer (it is also called as "a cathode buffer layer") according to the present invention is a layer which is arranged between a cathode and a light emitting layer to decrease an operating voltage and to improve an emission luminance. An example of an electron injection layer is detailed in volume 2, chapter 2 "Electrode materials" (pp. 123-166) of "Organic EL Elements and Industrialization Front thereof (Nov. 30, 1998, published by N.T.S. Co. Ltd.)".

In the present invention, an electron injection layer is provided according to necessity, and as described above, it is placed between a cathode and a light emitting layer, or between a cathode and an electron transport layer.

An electron injection layer is preferably a very thin layer. The layer thickness thereof is preferably in the range of 0.1 to 5 nm depending on the materials used.

An election injection layer is detailed in JP-A Nos. 6-325871, 9-17574, and 10-74586. Examples of a material preferably used in an election injection layer include: a metal such as strontium and aluminum; an alkaline metal compound such as lithium fluoride, sodium fluoride, or potassium fluoride; an alkaline earth metal compound such as magnesium fluoride; a metal oxide such as aluminum oxide; and a metal complex such as lithium 8-hydroxyquinolate (Liq). It is possible to use the aforesaid electron transport materials.

The above-described materials may be used singly or plural kinds may be used together in an election injection layer.

<<Hole Transport Layer>>

In the present invention, a hole transport layer contains a material having a function of transporting a hole. A hole transport layer is only required to have a function of transporting a hole injected from an anode to a light emitting layer.

The total layer thickness of a hole transport layer of the present invention is not specifically limited, however, it is generally in the range of 0.5 nm to 5 μm, preferably in the range of 2 to 500 nm, and more preferably in the range of 5 to 200 nm.

A material used in a hole transport layer (hereafter, it is called as a hole transport material) is only required to have any one of properties of injecting and transporting a hole, and a barrier property to an electron. A hole transport material may be suitably selected from the conventionally known compounds.

Examples of a hole transport material include:

a porphyrin derivative, a phthalocyanine derivative, an oxazole derivative, an oxadiazole derivative, a triazole derivative, an imidazole derivative, a pyrazoline derivative, a pyrazolone derivative, a phenylenediamine derivative, a hydrazone derivative, a stilbene derivative, a polyarylalkane derivative, a triarylamine derivative, a carbazole derivative, an indolocarbazole derivative, an isoindole derivative, an acene derivative of anthracene or naphthalene, a fluorene derivative, a fluorenone derivative, polyvinyl carbazole, a polymer or an oligomer containing an aromatic amine in a side chain or a main chain, polysilane, and a conductive polymer or an oligomer (e.g., PEDOT: PSS, an aniline type copolymer, polyaniline and polythiophene).

Examples of a triarylamine derivative include: a benzidine type represented by α-NPD (4,4'-bis[N-(1-naphthyl)-N-phenylamino]biphenyl), a star burst type represented by MTDATA (4,4',4"-tris(N-(3-methylphenyl)-N-phenylamino)triphenylamine), a compound having fluorenone or anthracene in a triarylamine bonding core.

A hexaazatriphenylene derivative described in JP-A Nos. 2003-519432 and 2006-135145 may be also used as a hole transport material.

In addition, it is possible to employ an electron transport layer of a higher p property which is doped with impurities. As its example, listed are those described in each of JP-A Nos. 4-297076, 2000-196140, and 2001-102175, as well as in J. Appl. Phys., 95, 5773 (2004).

Further, it is possible to employ so-called p-type hole transport materials, and inorganic compounds such as p-type Si and p-type SiC, as described in JP-A No. 11-251067, and J. Huang et al. reference (Applied Physics Letters 80 (2002), p. 139). Moreover, an orthometal compounds having Ir or Pt as a center metal represented by $Ir(ppy)_3$ are also preferably used.

Although the above-described compounds may be used as a hole transport material, preferably used are: a triarylamine derivative, a carbazole derivative, an indolocarbazole derivative, an azatriphenylene derivative, an organic metal complex, a polymer or an oligomer incorporated an aromatic amine in a main chain or in a side chain.

Specific examples of a known hole transport material used in an organic EL element of the present invention are compounds in the aforesaid publications and in the following publications. However, the present invention is not limited to them.

Examples of a publication are: Appl. Phys. Lett. 69, 2160(1996), J. Lumin. 72-74, 985(1997), Appl. Phys. Lett. 78, 673(2001), Appl. Phys. Lett. 90, 183503(2007), Appl. Phys. Lett. 51, 913(1987), Synth. Met. 87, 171(1997), Synth. Met. 91, 209(1997), Synth. Met. 111, 421(2000), SID Symposium Digest, 37, 923(2006), J. Mater. Chem. 3, 319(1993), Adv. Mater. 6, 677(1994), Chem. Mater. 15, 3148(2003), US 2003/0162053, US 2002/0158242, US 2006/0240279, US 2008/0220265, U.S. Pat. No. 5,061,569, WO 2007/002683, WO 2009/018009, EP 650955, US 2008/0124572, US 2007/0278938, US 2008/0106190, US 2008/0018221, WO 2012/115034, JP-A 2003-519432, JP-A 2006-135145, and U.S. patent application Ser. No. 13/585,981.

A hole transport material may be used singly or may be used in combination of plural kinds of compounds.

<<Electron Blocking Layer>>

An electron blocking layer is a layer provided with a function of a hole transport layer in a broad meaning. Preferably, it contains a material having a function of transporting a hole, and having very small ability of transporting an electron. It will improve the recombination probability of an electron and a hole by blocking an electron while transporting a hole. Further, a composition of a hole transport layer described above may be appropriately utilized as an electron blocking layer of an organic EL element of the present invention when needed.

An electron blocking layer placed in an organic EL element of the present invention is preferably arranged at a location in the light emitting layer adjacent to the anode side.

A thickness of an electron blocking layer is preferably in the range of 3 to 100 nm, and more preferably, in the range of 5 to 30 nm.

With respect to a material used for an electron blocking layer, the material used in the aforesaid hole transport layer is suitably used, and further, the material used as the aforesaid host compound is also suitably used for an electron blocking layer.

<<Hole Injection Layer>>

A hole injection layer (it is also called as "an anode buffer layer") is a layer which is arranged between an electrode and a light emitting layer to decrease an operating voltage and to improve an emission luminance. An example of a hole injection layer is detailed in volume 2, chapter 2 "Electrode materials" (pp. 123-166) of "Organic EL Elements and Industrialization Front thereof (Nov. 30, 1998, published by N.T.S. Co. Ltd.)".

A hole injection layer is provided according to necessity, and as described above, it is placed between an anode and a light emitting layer, or between an anode and a hole transport layer.

A hole injection layer is also detailed in JP-A Nos. 9-45479, 9-260062 and 8-288069. Materials used in the hole injection layer are the same materials used in the aforesaid hole transport layer.

Among them, preferable materials are: a phthalocyanine derivative represented by copper phthalocyanine; a hexaazatriphenylene derivative described in JP-A Nos. 2003-519432 and 2006-135145; a metal oxide represented by vanadium oxide; a conductive polymer such as amorphous carbon, polyaniline (or called as emeraldine) and polythiophene; an orthometalated complex represented by tris(2-phenylpyridine) iridium complex; and a triarylamine derivative.

The above-described materials used in a hole injection layer may be used singly or plural kinds may be co-used.

<<Other Additive>>

The above-described organic layer of the present invention may further contain other additive.

Examples of an additive are: halogen elements such as bromine, iodine and chlorine, and a halide compound; and a compound, a complex and a salt of an alkali metal, an alkaline earth metal and a transition metal such as Pd, Ca and Na.

Although a content of an additive may be arbitrarily decided, preferably, it is 1,000 ppm or less based on the total mass of the layer containing the additive, more preferably, it is 500 ppm or less, and still more preferably, it is 50 ppm or less.

In order to improve a transporting property of an electron or a hole, or to facilitate energy transport of an exciton, the content of the additive is not necessarily within these range, and other range of content may be used.

<<Forming Method of Organic Layers>>

Forming methods of organic layers according to the present invention (hole injection layer, hole transport layer, light emitting layer, hole blocking layer, electron transport layer, and electron injection layer) will be described.

Forming methods of organic layers according to the present invention are not specifically limited. They may be formed by using a known method such as a vacuum vapor deposition method and a wet method (wet process).

Examples of a wet process include: a spin coating method, a cast method, an inkjet method, a printing method, a die coating method, a blade coating method, a roll coating method, a spray coating method, a curtain coating method, and a LB method (Langmuir Blodgett method). From the viewpoint of getting a uniform thin layer with high productivity, preferable are method highly appropriate to a roll-to-roll method such as a die coating method, a roll coating method, an inkjet method, and a spray coating method.

Examples of a liquid medium to dissolve or to disperse a material for organic layers according to the present invention include: ketones such as methyl ethyl ketone and cyclohexanone; aliphatic esters such as ethyl acetate; halogenated hydrocarbons such as dichlorobenzene; aromatic hydrocarbons such as toluene, xylene, mesitylene, and cyclohexylbenzene; aliphatic hydrocarbons such as cyclohexane, decalin, and dodecane; organic solvents such as DMF and DMSO.

These will be dispersed with a dispersion method such as an ultrasonic dispersion method, a high shearing dispersion method and a media dispersion method.

A different film forming method may be applied to every organic layer. When a vapor deposition method is adopted for forming each layer, the vapor deposition conditions may be changed depending on the compounds used. Generally, the following ranges are suitably selected for the conditions, heating temperature of boat: 50 to 450° C., level of vacuum: $1\times10^{6}$ to $1\times10^{-2}$ Pa, vapor deposition rate: 0.01 to 50 nm/sec, temperature of substrate: −50 to 300° C., and layer thickness: 0.1 nm to 5 μm, preferably 5 to 200 nm.

Formation of organic layers of the present invention is preferably continuously carried out from a hole injection layer to a cathode with one time vacuuming. It may be taken out on the way, and a different layer forming method may be employed. In that case, the operation is preferably done under a dry inert gas atmosphere.

<<Anode>>

As an anode of an organic EL element, a metal having a large work function (4 eV or more, preferably, 4.5 eV or more), an alloy, and a conductive compound and a mixture thereof are utilized as an electrode substance.

Specific examples of an electrode substance are: metals such as Au, and an alloy thereof; transparent conductive materials such as CuI, indium tin oxide (ITO), $SnO_2$, and ZnO. Further, a material such as IDIXO ($In_2O_3$—ZnO), which may form an amorphous and transparent electrode, may also be used.

As for an anode, these electrode substances may be made into a thin layer by a method such as a vapor deposition method or a sputtering method; followed by making a pattern of a desired form by a photolithography method. Otherwise, when the requirement of pattern precision is not so severe (about 100 μm or more), a pattern may be formed through a mask of a desired form at the time of layer formation with a vapor deposition method or a sputtering method using the above-described material.

Alternatively, when a coatable substance such as an organic conductive compound is employed, it is possible to employ a wet film forming method such as a printing method or a coating method. When emitted light is taken out from the anode, the transmittance is preferably set to be 10% or more. A sheet resistance of the anode is preferably a few hundred Ω/sq or less.

Further, although a layer thickness of the anode depends on a material, it is generally selected in the range of 10 nm to 1 μm, and preferably in the range of 10 to 200 nm.

<<Cathode>>

As a cathode, a metal having a small work function (4 eV or less) (it is called as an electron injective metal), an alloy, a conductive compound and a mixture thereof are utilized as an electrode substance. Specific examples of the aforesaid electrode substance includes: sodium, sodium-potassium alloy, magnesium, lithium, a magnesium/copper mixture, a magnesium/silver mixture, a magnesium/aluminum mixture, a magnesium/indium mixture, an aluminum/aluminum oxide ($Al_2O_3$) mixture, indium, a lithium/aluminum mixture, aluminum, and a rare earth metal. Among them, with respect to an electron injection property and durability against oxidation, preferable are: a mixture of election injecting metal with a second metal which is stable metal having a work function larger than the electron injecting metal. Examples thereof are: a magnesium/silver mixture, a magnesium/aluminum mixture, a magnesium/indium mixture, an aluminum/aluminum oxide ($Al_2O_3$) mixture, a lithium/aluminum mixture and aluminum.

A cathode may be made by using these electrode substances with a method such as a vapor deposition method or a sputtering method to form a thin film. A sheet resistance of the cathode is preferably a few hundred Ω/sq or less. A layer thickness of the cathode is generally selected in the range of 10 nm to 5 μm, and preferably in the range of 50 to 200 nm.

In order to transmit emitted light, it is preferable that one of an anode and a cathode of an organic EL element is transparent or translucent for achieving an improved luminescence.

Further, after forming a layer of the aforesaid metal having a thickness of 1 to 20 nm on the cathode, it is possible to prepare a transparent or translucent cathode by providing with a conductive transparent material described in the description for the anode thereon. By applying this process, it is possible to produce an element in which both an anode and a cathode are transparent.

[Support Substrate]

A support substrate which may be used for an organic EL element of the present invention is not specifically limited with respect to types such as glass and plastics. Hereafter, the support substrate may be also called as substrate body, substrate, substrate substance, or support. They may be transparent or opaque. However, a transparent support substrate is preferable when the emitting light is taken from the side of the support substrate. Support substrates preferably utilized includes such as glass, quartz and transparent resin film. A specifically preferable support substrate is a resin film capable of providing an organic EL element with a flexible property.

Examples of a resin film include: polyesters such as polyethylene terephthalate (PET) and polyethylene naphthalate (PEN), polyethylene, polypropylene, cellophane, cellulose esters and their derivatives such as cellulose diacetate, cellulose triacetate (TAC), cellulose acetate butyrate, cellulose acetate propionate (CAP), cellulose acetate phthalate, and cellulose nitrate, polyvinylidene chloride, polyvinyl alcohol, polyethylene vinyl alcohol, syndiotactic polystyrene, polycarbonate, norbornene resin, polymethyl pentene, polyether ketone, polyimide, polyether sulfone (PES), polyphenylene sulfide, polysulfones, polyether imide, polyether ketone imide, polyamide, fluororesin, Nylon, polymethyl methacrylate, acrylic resin, polyallylates and cycloolefin resins such as ARTON (trade name, made by JSR Co. Ltd.) and APEL (trade name, made by Mitsui Chemicals, Inc.).

On the surface of a resin film, it may be formed a film incorporating an inorganic or an organic compound or a hybrid film incorporating both compounds. Barrier films are preferred with a water vapor permeability of 0.01 $g/m^2 \cdot 24$ h or less (at 25±0.5° C., and 90±2% RH) determined based on JIS K 7129-1992. Further, high barrier films are preferred to have an oxygen permeability of $1\times10^{-3}$ $cm^3/m^2 \cdot 24$ h·atm or less determined based on JIS K 7126-1987, and a water vapor permeability 1 of 1×10 $g/m^2 \cdot 24$ h or less.

As materials that form a barrier film, employed may be those which retard penetration of moisture and oxygen, which deteriorate the element. For example, it is possible to employ silicon oxide, silicon dioxide, and silicon nitride. Further, in order to improve the brittleness of the aforesaid film, it is more preferable to achieve a laminated layer structure of inorganic layers and organic layers. The laminating order of the inorganic layer and the organic layer is not particularly limited, but it is preferable that both are alternatively laminated a plurality of times.

Barrier film forming methods are not particularly limited, and examples of employable methods include a vacuum deposition method, a sputtering method, a reactive sputtering method, a molecular beam epitaxy method, a cluster ion beam method, an ion plating method, a plasma polymerization method, a plasma CVD method, a laser CVD method, a thermal CVD method, and a coating method. Of these, specifically preferred is a method employing an atmospheric pressure plasma polymerization method, described in JP-A No. 2004-68143.

Examples of opaque support substrates include metal plates such aluminum or stainless steel films, opaque resin substrates, and ceramic substrates.

An external taking out quantum efficiency of light emitted by the organic EL element of the present invention is preferably at least 1% at a room temperature, but is more preferably at least 5%.

External taking out quantum efficiency (%)=(Number of photons emitted by the organic EL element to the exterior/Number of electrons fed to organic EL element)×100.

Further, it may be used simultaneously a color hue improving filter such as a color filter, or it may be used simultaneously a color conversion filter which convert emitted light color from the organic EL element to multicolor by employing fluorescent materials.

[Sealing]

As sealing means employed in the present invention, listed may be, for example, a method in which sealing members, electrodes, and a supporting substrate are subjected to adhesion via adhesives. The sealing members may be arranged to cover the display region of an organic EL element, and may be a concave plate or a flat plate. Neither transparency nor electrical insulation is limited.

Specifically listed are glass plates, polymer plate-films, metal plate-films. Specifically, it is possible to list, as glass plates, soda-lime glass, barium-strontium containing glass, lead glass, aluminosilicate glass, borosilicate glass, barium borosilicate glass, and quartz. Further, listed as polymer plates maybe polycarbonate, acryl, polyethylene terephthalate, polyether sulfide, and polysulfone. As a metal plate, listed are those composed of at least one metal selected from the group consisting of stainless steel, iron, copper, aluminum magnesium, nickel, zinc, chromium, titanium, molybdenum, silicon, germanium, and tantalum, or alloys thereof.

In the present invention, since it is possible to achieve a thin organic EL element, it is preferable to employ a polymer film or a metal film. Further, it is preferable that the polymer film has an oxygen permeability of $1\times10^{-3}$ $cm^3/m^2\cdot24$ h·atm or less determined by the method based on JIS K 7126-1987, and a water vapor permeability of $1\times10^{-3}$ $g/m^2\cdot24$ h or less (at 25±0.5° C., and 90±2% RH) determined by the method based on JIS K 7129-1992.

Conversion of the sealing member into concave is carried out by employing a sand blast process or a chemical etching process.

In practice, as adhesives, listed may be photo-curing and heat-curing types having a reactive vinyl group of acrylic acid based oligomers and methacrylic acid, as well as moisture curing types such as 2-cyanoacrylates. Further listed may be thermal and chemical curing types (mixtures of two liquids) such as epoxy based ones. Still further listed may be hot-melt type polyamides, polyesters, and polyolefins. Yet further listed may be cationically curable type UV curable epoxy resin adhesives.

In addition, since an organic EL element is occasionally deteriorated via a thermal process, preferred are those which enable adhesion and curing between a room temperature and 80° C. Further, desiccating agents may be dispersed into the aforesaid adhesives. Adhesives may be applied onto sealing portions via a commercial dispenser or printed on the same in the same manner as screen printing.

Further, it is appropriate that on the outside of the aforesaid electrode which interposes the organic layer and faces the support substrate, the aforesaid electrode and organic layer are covered, and in the form of contact with the support substrate, inorganic and organic material layers are formed as a sealing film. In this case, as materials that form the aforesaid film may be those which exhibit functions to retard penetration of moisture or oxygen which results in deterioration. For example, it is possible to employ silicon oxide, silicon dioxide, and silicon nitride.

Still further, in order to improve brittleness of the aforesaid film, it is preferable that a laminated layer structure is formed, which is composed of these inorganic layers and layers composed of organic materials. Methods to form these films are not particularly limited. It is possible to employ, for example, a vacuum deposition method, a sputtering method, a reactive sputtering method, a molecular beam epitaxy method, a cluster ion beam method, an ion plating method, a plasma polymerization method, an atmospheric pressure plasma polymerization method, a plasma CVD method, a thermal CVD method, and a coating method.

It is preferable to inject a gas phase and a liquid phase material of inert gases such as nitrogen or argon, and inactive liquids such as fluorinated hydrocarbon or silicone oil into the space between the space formed with the sealing member and the display region of the organic EL element. Further, it is possible to form vacuum in the space. Still further, it is possible to enclose hygroscopic compounds in the interior of the space.

Examples of a hygroscopic compound include: metal oxides (for example, sodium oxide, potassium oxide, calcium oxide, barium oxide, magnesium oxide, and aluminum oxide); sulfates (for example, sodium sulfate, calcium sulfate, magnesium sulfate, and cobalt sulfate); metal halides (for example, calcium chloride, magnesium chloride, cesium fluoride, tantalum fluoride, cerium bromide, magnesium bromide, barium iodide, and magnesium iodide); perchlorates (for example, barium perchlorate and magnesium perchlorate). In sulfates, metal halides, and perchlorates, suitably employed are anhydrides. For sulfate salts, metal halides and perchlorates, suitably used are anhydrous salts.

[Protective Film and Protective Plate]

On the aforesaid sealing film which interposes the organic layer and faces the support substrate or on the outside of the aforesaid sealing film, a protective or a protective plate may be arranged to enhance the mechanical strength of the element. Specifically, when sealing is achieved via the aforesaid sealing film, the resulting mechanical strength is not always high enough, therefore it is preferable to arrange the protective film or the protective plate described above. Usable materials for these include glass plates, polymer plate-films, and metal plate-films which are similar to those employed for the aforesaid sealing. However, from the viewpoint of reducing weight and thickness, it is preferable to employ a polymer film.

[Improving Method of Light Extraction]

It is generally known that an organic EL element emits light in the interior of the layer exhibiting the refractive index (being about 1.6 to 2.1) which is greater than that of air, whereby only about 15% to 20% of light generated in the light emitting layer is extracted. This is due to the fact that light incident to an interface (being an interlace of a transparent substrate to air) at an angle of θ which is at least critical angle is not extracted to the exterior of the element due to the resulting total reflection, or light is totally reflected between the transparent electrode or the light emitting layer and the transparent substrate, and light is guided via the transparent electrode or the light emitting layer, whereby light escapes in the direction of the element side surface.

Means to enhance the efficiency of the aforesaid light extraction include, for example: a method in which roughness is formed on the surface of a transparent substrate, whereby total reflection is minimized at the interface of the transparent substrate to air (U.S. Pat. No. 4,774,435), a method in which efficiency is enhanced in such a manner that a substrate results in light collection (JP-A No. 63-314795), a method in which a reflection surface is formed on the side of the element (JP-A No. 1-220394), a method in which a flat layer of a middle refractive index is introduced between the substrate and the light emitting body and an antireflection film is formed (JP-A No. 62-172691), a method in which a flat layer of a refractive index which is equal to or less than the substrate is introduced between the substrate and the light emitting body (JP-A No. 2001-202827), and a method in which a diffraction grating is formed between the substrate and any of the layers such as the transparent electrode layer or the light emitting layer (including between the substrate and the outside) (JP-A No. 11-283751).

In the present invention, it is possible to employ these methods while combined with the organic EL element of the present invention. Of these, it is possible to appropriately employ the method in which a flat layer of a refractive index which is equal to or less than the substrate is introduced between the substrate and the light emitting body and the method in which a diffraction grating is formed between any layers of a substrate, and a transparent electrode layer and a light emitting layer (including between the substrate and the outside space).

By combining these means, the present invention enables the production of elements which exhibit higher emission luminance or excel in durability.

When a low refractive index medium having a thickness, greater than the wavelength of light is formed between the transparent electrode and the transparent substrate, the extraction efficiency of light emitted from the transparent electrode to the exterior increases as the refractive index of the medium decreases.

As materials of the low refractive index layer, listed are, for example, aerogel, porous silica, magnesium fluoride, and fluorine based polymers. Since the refractive index of the transparent substrate is commonly about 1.5 to 1.7, the refractive index of the low refractive index layer is preferably approximately 1.5 or less. More preferably, it is 1.35 or less.

Further, thickness of the low refractive index medium is preferably at least two times of the wavelength in the medium. The reason is that, when the thickness of the low refractive index medium reaches nearly the wavelength of light so that electromagnetic waves escaped via evanescent enter into the substrate, effects of the low refractive index layer are lowered.

The method in which the interface which results in total reflection or a diffraction grating is introduced in any of the media is characterized in that light extraction efficiency is significantly enhanced. The above method works as follows. By utilizing properties of the diffraction grating capable of changing the light direction to the specific direction different from diffraction via so-called Bragg diffraction such as primary diffraction or secondary diffraction of the diffraction grating, of light emitted from the light entitling layer, light, which is not emitted to the exterior due to total reflection between layers, is diffracted via introduction of a diffraction grating between any layers or in a medium (in the transparent substrate and the transparent electrode) so that light is extracted to the exterior.

It is preferable that the introduced diffraction grating exhibits a two-dimensional periodic refractive index. The reason is as follows. Since light emitted in the light emitting layer is randomly generated to all directions, in a common one-dimensional diffraction grating exhibiting a periodic refractive index distribution only in a certain direction, light which travels to the specific direction is only diffracted, whereby light extraction efficiency is not sufficiently enhanced.

However, by changing the refractive index distribution to a two-dimensional one, light, which travels to all directions, is diffracted, whereby the light extraction efficiency is enhanced.

A position to introduce a diffraction grating may be between any layers or in a medium (in a transparent substrate or a transparent electrode). However, a position near the organic light emitting layer, where light is generated, is preferable. In this case, the cycle of the diffraction grating is preferably from about ½ to 3 times of the wavelength of light in the medium. The preferable arrangement of the diffraction grating is such that the arrangement is two-dimensionally repeated in the form of a square lattice, a triangular lattice, or a honeycomb lattice.

[Light Collection Sheet]

Via a process to arrange a structure such as a micro-lens array shape on the light extraction side of the organic EL element of the present invention or via combination with a so-called light collection sheet, light is collected in the specific direction such as the front direction with respect to the light emitting element surface, whereby it is possible to enhance emission luminance in the specific direction.

In an example of the micro-lens array, square pyramids to realize a side length of 30 μm and an apex angle of 90 degrees are two-dimensionally arranged on the light extraction side of the substrate. The side length is preferably 10 to 100 μm. When it is less than the lower limit, coloration occurs due to generation of diffraction effects, while when it exceeds the upper limit, the thickness increases undesirably.

It is possible to employ, as a light collection sheet, for example, one which is put into practical use in the LED backlight of liquid crystal display devices. It is possible to employ, as such a sheet, for example, the emission luminance enhancing film (BEF), produced by Sumitomo 3M Limited. As shapes of a prism sheet employed may be, for example, Δ shaped stripes of an apex angle of 90 degrees and a pitch of 50 μm formed on a base material, a shape in which the apex angle is rounded, a shape in which the pitch is randomly changed, and other shapes.

Further, in order to control the light radiation angle from the light emitting element, simultaneously employed may be a light diffusion plate-film. For example, it is possible to employ the diffusion film (LIGHT-UP), produced by Kimoto Co., Ltd.

<<Applications of Organic EL Element>>

It is possible to employ the organic EL element of the present invention as display devices, displays, and various types of light emitting sources.

Examples of light emitting sources include: lighting devices (home lighting and car lighting), clocks, backlights for liquid crystals, sign advertisements, signals, light sources of light memory media, light sources of electrophotographic copiers, light sources of light communication processors, and light sources of light sensors. The present invention is not limited to them. It is especially effectively employed as a backlight of a liquid crystal display device and a lighting source.

If needed, the organic EL element of the present, invention may undergo patterning via a metal mask or an ink-jet printing method during film formation. When the patterning is carried out, only an electrode may undergo patterning, an electrode and a light emitting layer may undergo patterning, or all element layers may undergo patterning. During preparation of the element, it is possible to employ conventional methods.

<Display Device>

A display device provided with an organic EL element of the present invention may emit a single color or multiple colors. Here, it will be described a multiple color display device.

In case of a multiple color display device, a shadow mask is placed during the formation of a light emitting layer, and a layer is formed as a whole with a vapor deposition method, a cast method, a spin coating method, an inkjet method, and a printing method.

When patterning is done only to the light emitting layer, although the coating method is not limited in particular, preferable methods are a vapor deposition method, an inkjet method, a spin coating method, and a printing method.

A constitution of an organic EL element provided for a display device is selected from the above-described examples of an organic EL element according to the necessity.

As a method of manufacturing the organic EL element, a known method for manufacturing an organic EL element may be used.

When a direct-current voltage is applied to the produced multiple color display device, light emission may be observed by applying voltage of 2 o 40 V by setting the anode to have a plus (+) polarity, and the cathode to have a minus (−) polarity. When the voltage is applied to the device with reverse polarities, an electric current does not pass and light emission does not occur. Further, when an alternating-current voltage is applied to the device, light emission occurs only when the anode has a plus (+) polarity and the cathode has a minus (−) polarity. In addition, an arbitrary wave shape may be used for applying alternating-current.

The multiple color display device may be used for a display device, a display, and a variety of light emitting sources. In a display device or a display, a full color display is possible by using 3 kinds of organic EL elements emitting blue, red and green.

Examples of a display device or a display are: a television set, a personal computer, a mobile device, an AV device, a character broadcast display, and an information display in a car. Specifically, it may be used for a display device reproducing a still image or a moving image. When it is used for a display device reproducing a moving image, the driving mode may be any one of a passive-matrix mode and an active-matrix mode.

Examples of a light emitting source include: home lighting, car lighting, backlights for clocks and liquid crystals, sign advertisements, signals, light sources of light memory media, light sources of electrophotographic copiers, light sources of light communication processors, and light sources of light sensors. The present invention is not limited to them.

In the following, an example of a display device provided with an organic EL element of the present invention will be described by referring to drawings.

FIG. 1 is a schematic drawing illustrating an example of a display device composed of an organic EL element. Display of image information is carried out by light emission of an organic EL element. For example, it is a schematic drawing of a display of a cell-phone.

A display 1 is constituted of a display section A having plural number of pixels, a control section B which performs image scanning of the display section A based on image information, and a wiring section C electrically connecting the display section A and the control section B.

The control section B, which is electrically connected to the display section A via the wiring section C, sends a scanning signal and an image data signal to plural number of pixels based on image information from the outside and pixels of each scanning line successively emit depending on the image data signal by a scanning signal to perform image scanning, whereby image information is displayed on the display section A.

Figure 2:
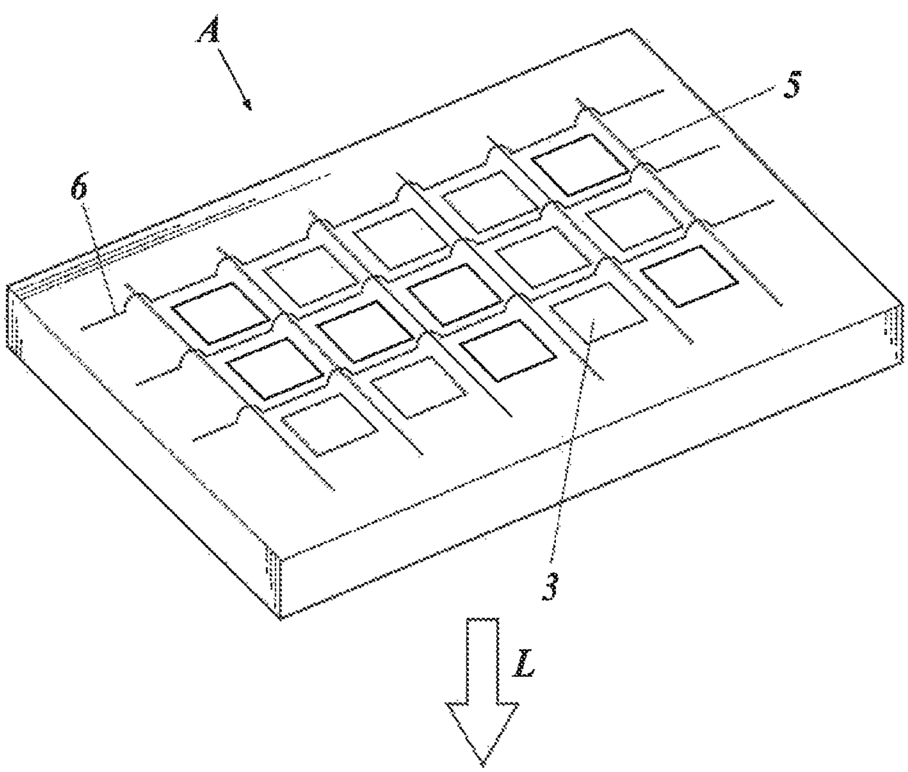
FIG. 2 is a schematic diagram of a display device by an active matrix mode.

FIG. 2 is a schematic drawing of the display section A based on an active matrix mode.

The display section A is provided with the wiring section C, which contains plural scanning lines 5 and data lines 6, and plural pixels 3 on a substrate. Primary part materials of the display section A will be explained in the following.

In FIG. 2, illustrated is the case that light emitted by the pixel 3 is taken out along the white allow (downward).

The scanning lines 5 and the plural data lines 6 each are comprised of a conductive material, and the scanning lines 5 and the data lines 6 are perpendicular in a grid form and are connected to pixels 3 at the right-angled crossing points (details are not shown in the drawing).

The pixel 3 receives an image data from the data line 6 when a scanning signal is applied from the scanning line 5 and emits according to the received image data.

Full-color display is possible by appropriately arranging pixels having an emission color in a red region, pixels in a green region and pixels in a blue region, side by side on the same substrate.

Next, an emission process of a pixel will be explained. FIG. 3 is a schematic drawing of a pixel.

A pixel is equipped with an organic EL element 10, a switching transistor 11, an operating transistor 12 and a capacitor 13. Red, green and blue emitting organic EL elements are utilized as the organic EL element 10 for plural pixels, and full-color display device is possible by arranging these side by side on the same substrate.

In FIG. 3, an image data signal is applied on the drain of the switching transistor 11 via the data line 6 from the control section B. Then when a scanning signal is applied on the gate of the switching transistor 11 via the scanning line 5 from control section B, operation of switching transistor is on to transmit the image data signal applied on the drain to the gates of the capacitor 13 and the operating transistor 12.

The operating transistor 12 is on, simultaneously with the capacitor 13 being charged depending on the potential of an image data signal, by transmission of an image data signal. In the operating transistor 12, the drain is connected to an electric source line 7 and the source is connected to the electrode of the organic EL element 10, and an electric current is supplied from the electric source line 7 to the organic EL element 10 depending on the potential of an image data applied on the gate.

When a scanning signal is transferred to the next scanning line 5 by successive scanning of the control section B, operation of the switching transistor 11 is off.

However, since the capacitor 13 keeps the charged potential of an image data signal even when operation of the switching transistor 11 is off, operation of the operating transistor 12 is kept on to continue emission of the organic EL element 10 until the next scanning signal is applied.

When the next scanning signal is applied by successive scanning, the operating transistor 12 operates depending on the potential of an image data signal synchronized to the scanning signal and the organic EL element 10 emits light.

That is, emission of each organic EL element 10 of the plural pixels 3 is performed by providing the switching transistor 11 and the operating transistor 12 against each organic EL element 10 of plural pixels 3. Such an emission method is called as an active matrix mode.

Herein, emission of the organic EL element 10 may be either emission of plural gradations based on a multiple-valued image data signal having plural number of gradation potentials or on and off of a predetermined emission quantity based on a binary image data signal. Further, potential hold of the capacitor 13 may be either continuously maintained until the next scanning signal application or discharged immediately before the next scanning signal application.

In the present invention, emission operation is not necessarily limited to the above-described active matrix mode but may be a passive matrix mode in which organic EL element is emitted based on a data signal only when a scanning signal is scanned.

Figure 4:
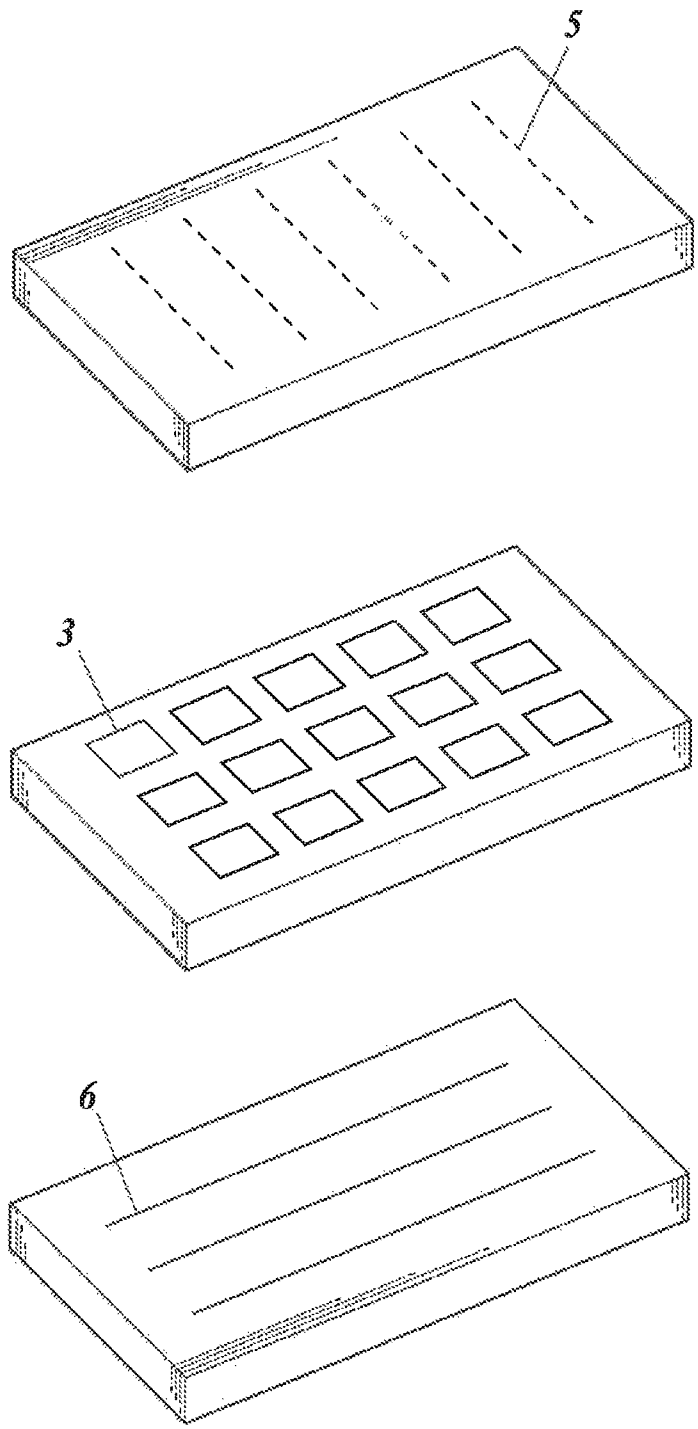
FIG. 4 is a schematic diagram of a display device by a passive matrix mode.

FIG. 4 is a schematic drawing of a display device based on a passive matrix mode. In FIG. 4, plural number of scanning lines 5 and plural number of image data lines 6 are arranged grid-wise, opposing to each other and sandwiching the pixels 3.

When a scanning signal of the scanning line 5 is applied by successive scanning, the pixel 3 connected to the scanning line 5 applied with the signal emits depending on an image data signal.

Since the pixel 3 is provided with no active element in a passive matrix mode, decrease of manufacturing cost is possible.

By employing the organic EL element of the present invention, it was possible to obtain a display device having improved emission efficiency.

<Lighting Device>

An organic EL element of the present invention may be used for a lighting device.

An organic EL element of the present invention may be provided with a rasonator structure. The intended uses of the organic EL element provided with a rasonator structure are: a light source of a light memory media, a light source of an electrophotographic copier, a light source of a light communication processor, and a light source of a light sensor, however, it is not limited to them. It may be used for the above-described purposes by making to emit a laser.

Further, an organic EL element of the present invention may be used for a kind of lamp such as for illumination or exposure. It may be used for a projection device for projecting an image, or may be used for a display device to directly observe a still image or a moving image thereon.

The driving mode used for a display device of a moving image reproduction may be any one of a passive matrix mode and an active matrix mode. By employing two or more kinds of organic EL elements of the present invention emitting a different emission color, it may produce a full color display device.

In addition, a π-conjugated boron compound used in the present invention may be applicable to an organic EL element substantially emitting white light as a lighting device. For example, when a plurality of light emitting materials are employed, white light may be obtained by mixing colors of a plurality of emission colors. As a combination of the plurality of emission colors, it may be a combination of red, green and blue having emission maximum wavelength of three primary colors, or it may be a combination of colors having two emission maximum wavelength making use of the relationship of two complementary colors of blue and yellow, or blue-green and orange.

A production method of an organic EL element of the present invention is done by placing a mask only during formation of a light emitting layer, a hole transport layer and an electron transport layer. It may be produced by coating with a mask to make simple arrangement. Since other layers are common, there is no need of pattering with a mask. For example, it may produce an electrode uniformly with a vapor deposition method, a cast method, a spin coating method, an inkjet method, and a printing method. The production yield will be improved.

By using these methods, it may be produced a white organic EL element in which a plurality of light emitting elements are arranged in parallel to form an array state. The element itself emits white light.

[One Embodiment of Lighting Device of the Present Invention]

One embodiment of lighting devices of the present Invention provided with an organic EL element of the present invention will be described.

The non-light emitting surface of the organic EL element of the present invention was covered with a glass case, and a 300 μm thick glass substrate was employed as a sealing substrate. An epoxy based light curable type adhesive (LUXTRACK LC0629B produced by Toagosei Co., Ltd.) was employed in the periphery as a sealing material. The resulting one was superimposed on the aforesaid cathode to be brought into close contact with the aforesaid transparent support substrate, and curing and sealing were carried out via exposure of UV radiation onto the glass substrate side, whereby the lighting device shown in FIG. 5 and FIG. 6, was formed.

Figure 5:
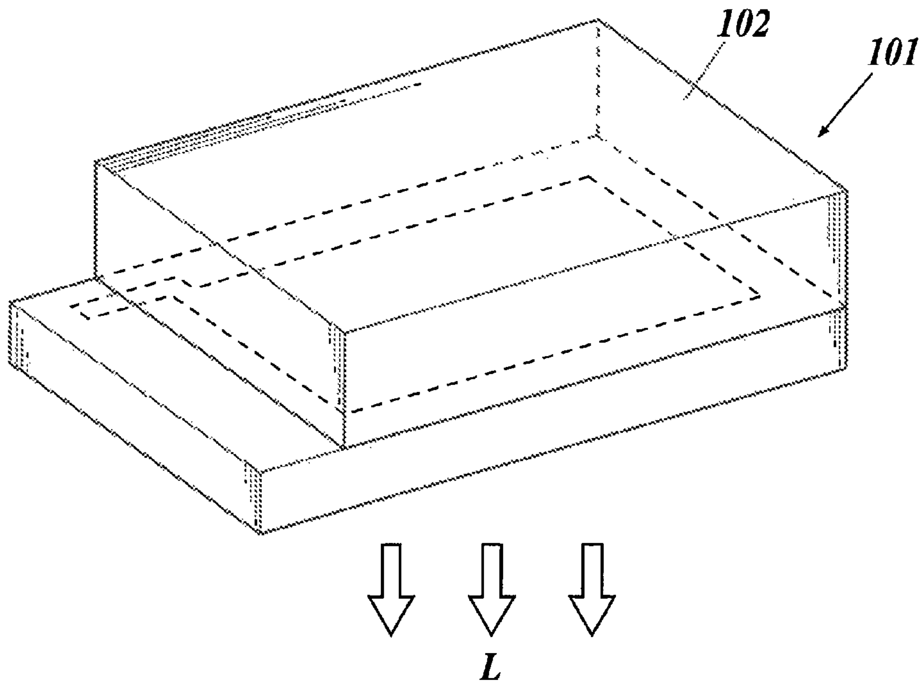
FIG. 5 is a schematic view of a lighting device.

FIG. 5 is a schematic view of a lighting device, and an organic EL element of the present invention (Organic EL element 101 in a lighting device) is covered with glass cover 102 (incidentally, sealing by the glass cover was carried out in a globe box under nitrogen ambience (under an ambience of high purity nitrogen gas at a purity of at least 99.999%) so that Organic EL Element 101 was not brought into contact with atmosphere).

Figure 6:
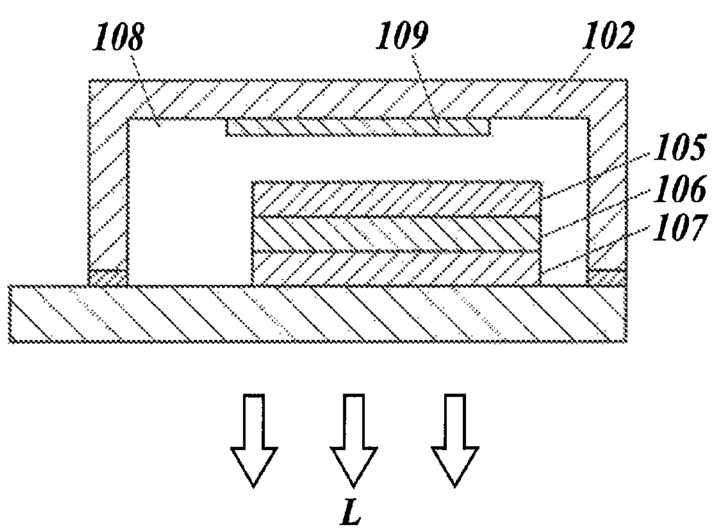
FIG. 6 is a pattern diagram of a lighting device.

FIG. 6 is a cross-sectional view of a lighting device. In FIG. 6, 105 represents a cathode, 106 represents an organic EL layer, and 107 represents a glass substrate fitted with a transparent electrode. Further, the interior of glass cover 102 is filled with nitrogen gas 108 and water catching agent 109 is provided.

By employing an organic EL element of the present invention, it was possible to obtain a lighting device having improved emission efficiency.

EXAMPLES

Hereafter, the present invention will be described specifically by referring to examples, however, the present invention is not limited to them. In examples, the indication of "%" is used. Unless particularly mentioned, it represents "mass %".

Example 1: Comparison of Stability Against Nucleophile

A π-conjugated boron compound B1 according to the present invention, trisbiphenylborane, and trimesitylborane each were placed in a different egg-plant shaped flask. Then, N-methylpyrrolidone was added to each flask and dissolved completely. Further, triethylamine was added and the solution was heated to 100° C.

After reaction at 100° C. for 1 hour, B1 was measured for $^{1}$H-NMR, and it was confirmed that B1 was not decomposed at all.

On the other hand, trisbiphenylborane, and trimesitylborane were measured for $^{1}$H-NMR after reaction at 100° C.

for 1 hour, and it was confirmed that trisbiphenylborane, and trimesitylborane both were decomposed about 30%.

From the above results, it was found that the π-conjugated boron compound B1 according to the present invention has sufficient stability against nucleophilic species as compared with known borane compounds.

Example 2: Comparison of Thermal Stability

A π-conjugated boron compound B1 according to the present invention, trisbiphenylborane, and trimesitylborane each were placed in a different glass tube. Then, they were heated at 300° C.

After heating at 300° C. for 1 hour, B1 was taken out of the glass tube. B1 was measured for $^1$H-NMR, and it was confirmed that B1 was not decomposed at all.

On the other hand, trisbiphenylborane, and trimesitylborane were measured for $^1$H-NMR after heating at 300° C. for 1 hour, and it was confirmed that trisbiphenylborane, and trimesitylborane both were decomposed about 20%.

From the above results, it was found that the π-conjugated boron compound B1 according to the present invention has sufficient thermal stability as compared with the known borane compound.

B1

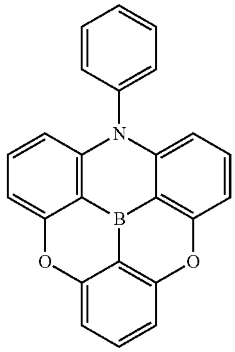

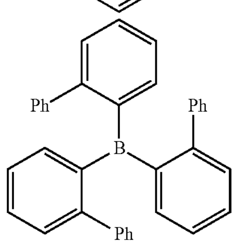

Trisbiphenylborane

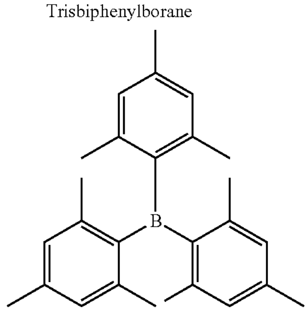

Trimesitylborane

Example 3: Comparison of Electron Mobility Measurement Using Space Charge Limited Current (SCLC) Method A glass substrate of 50 mm×50 mm with a thickness of 0.7 mm on which was formed a film of ITO (indium tin oxide) with a thickness of 100 nm as an anode was subjected to ultrasonic washing with isopropyl alcohol, followed by drying with desiccated nitrogen gas, and it was subjected to UV ozone washing. The glass substrate was fixed to a substrate holder of a commercial vacuum deposition apparatus.

After reducing the pressure of a vacuum tank to $4\times10^{-4}$ Pa, calcium was vapor deposited on the anode to form a hole blocking layer made of calcium having a thickness of 5.0 nm.

Subsequently, a π-conjugated boron compound B1 according to the present invention was vapor deposited to produce an electron transport layer having a thickness of 120 nm.

Subsequently, lithium fluoride (0.5 nm) was vapor deposited as an electron injection layer, then, aluminum (100 nm) was vapor deposited as a cathode in this order. Thus, an evaluation element EOD-01 was produced.

Evaluation element EOD-02 to EOD-017 were similarly produced by replacing the π-conjugated boron compound B1 with B6. B7, B19, B26, B29. B38, B41, B46, B47, B75. B93, B99, 8100, Comparative compound 1, Comparative compound 2 and Comparative compound 3.

Comparative compound 1

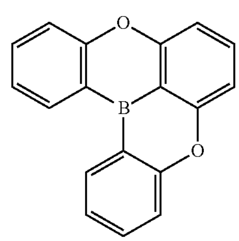

Comparative compound 2

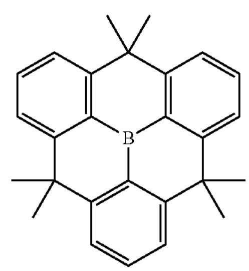

Comparative compound 3

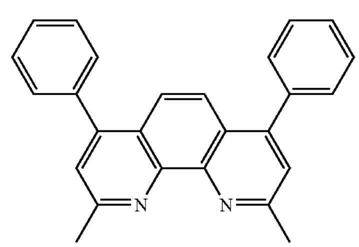

(BCP)

-continued

Comparative compound 4

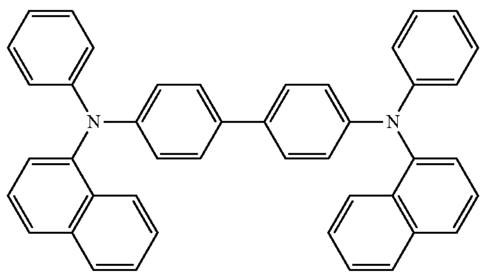

(NPD)

Comparative compound 5

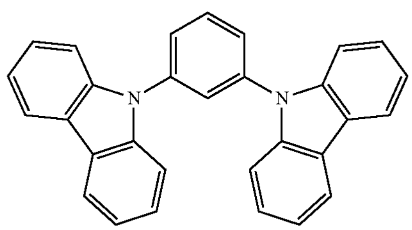

(mCP)

The current density-voltage characteristics of the prepared evaluation elements were measured. The current density was calculated from the current value at the time of impressed voltage of 5 V. As a result, all of the π-conjugated boron compounds according to the present invention had improved current density as compared with the three comparative compounds. From this, it was found that the π-conjugated boron compound according to the present invention is superior to the comparative compound in electron mobility.

Example 4: Comparison of Hole Mobility Measurement Using Space Charge Limited Current (SCLC) Method A glass substrate of 50 mm×50 mm with a thickness of 0.7 mm on which was formed a film of ITO (indium tin oxide) with a thickness of 100 nm as an anode was subjected to ultrasonic washing with isopropyl alcohol, followed by drying with desiccated nitrogen gas, and it was subjected to UV ozone washing. The glass substrate was fixed to a substrate holder of a commercial vacuum deposition apparatus. The glass substrate was fixed to a substrate holder of a commercial vacuum deposition apparatus.

Subsequently, a π-conjugated boron compound B1 according to the present invention was vapor deposited to produce a hole transport layer having a thickness of 120 nm.

Subsequently, 2,9-dimethyl-4,7-diphenyl-1,10-phenanthroline (BCP) (0.5 nm) was vapor deposited as an electron transport layer, then, molybdenum oxide (0.5 nm) was vapor deposited as an electron blocking layer, and aluminum (100 nm) was vapor deposited as a cathode in this order. Thus, an evaluation element HOD-01 was produced.

Evaluation element EOD-02 to EOD-017 were similarly produced by replacing the π-conjugated boron compound B1 with B2, B4, B9, B12, B16, B21, B36, B44, B68, B85, B95, B101. B110, B158, Comparative compound 1, Comparative compound 2 and Comparative compound 4.

The current density-voltage characteristics of the prepared evaluation element were measured. The current density was calculated from the current value at the time of impressed voltage of 5 V. As a result, all of the π-conjugated boron compounds according to the present invention had improved current density as compared with the three comparative compounds. From this, it was found that the π-conjugated boron compound according to the present invention is superior to the comparative compound in hole mobility.

Example 5: Comparison of Drive Voltage and Emission Luminance Result when Used as a Host)

(Preparation of Organic EL Element 1)

A glass substrate of 50 mm×50 mm with a thickness of 0.7 mm on which was formed a film of ITO (indium tin oxide) with a thickness of 100 nm as an anode was subjected to ultrasonic washing with isopropyl alcohol, followed by drying with desiccated nitrogen gas, and it was subjected to UV ozone washing. The glass substrate was fixed to a substrate holder of a commercial vacuum deposition apparatus. The glass substrate was fixed to a substrate holder of a commercial vacuum deposition apparatus.

Subsequently, HAT-CN (1,4,5,8,9,12-hexaazatriphenylenehexacarbonitrile) was vapor deposited to a thickness of 10 nm to provide a hole injection-transport layer.

Subsequently, α-NPD (4,4'-bis[N-(1-naphthyl)-N-phenylamino]biphenyl) was vapor deposited onto the hole injection layer to form a hole transport layer having a thickness of 40 nm.

Comparative compound 5 as a host material and bis[2-(4,6-difluorophenyl)pyridinato-C2, N](picolinato) iridium (III) (FIrpic) as a light emitting compound were co-vapor deposited to become 94 volume % and 6 volume %. Thereby a light emitting layer having a thickness of 30 nm was provided. The comparative compound 5 has the above-mentioned structure.

Thereafter, BCP (2,9-dimethyl-4,7-diphenyl-1,10-phenanthroline) was vapor-deposited to provide an electron transport layer having a thickness of 30 nm.

Further, after vapor depositing lithium fluoride with a thickness of 0.5 nm, aluminum was further vapor deposited to a thickness of 100 nm to provide a cathode.

The non-light emitting side of the obtained element was covered with a can-shaped glass case in an atmosphere of high-purity nitrogen gas having a purity of 99.999% or higher, and an electrode lead-out wiring was provided to produce an organic EL element 1.

(Preparation of Organic EL Elements 2 to 21)

Organic EL Elements 2 to 21 were prepared in the same manner as preparation of Organic EL Element 1 expect that the host material and the light emitting compound were changed as indicated in Table 1. The structure of Dopant-1 is as indicated in the following.

Dopant-1

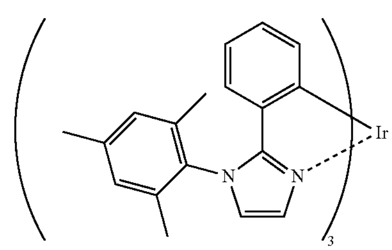

[Evaluation]

(1) Measurement of Relative Emission Efficiency

Each organic EL element thus produced was allowed to emit light by applying a constant electric current of 2.5 $mA/cm^2$ at room temperature (about 25° C.). The emission luminance immediately after starting to emit light was measured with Spectroradiometer CS-2000 (produced by Konica Minolta, Inc.). The relative emission luminance was determined as a relative value with respect to an emission luminance of the organic EL element 1 by using the following formula.

Relative emission luminance (%)=(Emission luminance of each organic EL element/Emission luminance of Organic EL element 1)×100

The larger the obtained numerical value is, the more preferable results are obtained.

(2) Measurement of Relative Drive Voltage

Further, front emission luminance was measured on both sides of the transparent electrode side (transparent substrate side) and the opposite electrode side (cathode side) of each organic EL element, and the voltage when the sum was 1000 $cd/m^2$ was defined as the drive voltage (V). For measurement of emission luminance, Spectroradiometer CS-1000 (produced by Konica Minolta, Inc.) was used.

The drive voltage obtained above was applied to the following formula to determine the relative drive voltage of each organic EL element with respect to the drive voltage of Organic EL element 1.

Relative drive voltage (%)=(Drive voltage of each organic EL element/Drive voltage of Organic EL element 1)×100

The smaller the obtained numerical value is, the more preferable results are obtained.

TABLE 1

| Element No. | Host material | Dopant material | Relative emission luminance (%) | Relative drive voltage (%) | Remarks |
|---|---|---|---|---|---|
| 1 | Comparative compound 5 | FIrpic | 100 | 100 | Comparative example |
| 2 | Comparative compound 1 | FIrpic | 105 | 94 | Comparative example |
| 3 | Comparative compound 2 | FIrpic | 90 | 104 | Comparative example |
| 4 | B1 | FIrpic | 154 | 79 | Present invention |
| 5 | B2 | FIrpic | 130 | 89 | Present invention |
| 6 | B6 | FIrpic | 131 | 86 | Present invention |
| 7 | B7 | FIrpic | 134 | 88 | Present invention |
| 8 | B16 | FIrpic | 148 | 81 | Present invention |
| 9 | B23 | FIrpic | 126 | 90 | Present invention |
| 10 | B44 | FIrpic | 143 | 81 | Present invention |
| 11 | B67 | FIrpic | 147 | 79 | Present invention |
| 12 | B68 | FIrpic | 137 | 81 | Present invention |
| 13 | B103 | FIrpic | 142 | 84 | Present invention |
| 14 | B105 | FIrpic | 147 | 85 | Present invention |
| 15 | B108 | FIrpic | 144 | 82 | Present invention |
| 16 | B109 | FIrpic | 146 | 85 | Present invention |
| 17 | B147 | FIrpic | 150 | 79 | Present invention |
| 18 | B163 | FIrpic | 152 | 80 | Present invention |
| 19 | B167 | FIrpic | 150 | 80 | Present invention |
| 20 | B1 | Dopant-1 | 148 | 82 | Present invention |
| 21 | B147 | Dopant-1 | 146 | 83 | Present invention |

As is apparent from Table 1, the organic EL elements 4 to 21 of the present invention in which the π-conjugated boron compound according to the present invention was used as a host compound in the light emitting layer of the organic EL element had a relative emission luminance of 126 or more and the relative drive voltage was 89 or less.

From these results, the inventive samples were found to be as follows. The relative emission luminance was higher and the relative drive voltage was lower compared with the comparative compound 1 in which the part around the boron was not cyclized and the comparative compound 2 in which the crosslinking sites of the general formula (I) were all carbon.

Example 6: Sample in which the Inventive Compound is Used as an Electron Transport (ET) Material An organic EL element was produced in the same manner as production of the organic EL element 1 in Example 5 except that the materials used for the electron transport layer were changed to B6, B7 and B99. In addition, mCP was used as a host material, and FIrpic was used as a light emitting material.

The organic EL element thus produced was allowed to emit light by applying a constant electric current of 2.5 $mA/cm^2$ at room temperature. It was found that blue light was emitted.

From this result, it was confirmed that by including B6, B7 and B99 according to the present invention, it functions as an electron transport material in the organic EL element.

Example 7: Sample in which the Inventive Compound is Used as a Hole Transport (HT) Material An organic EL element was produced in the same manner as production of the organic EL element 1 in Example 5 except that the materials used for the hole transport layer were changed to B2, B12 and B36. In addition, mCP was used as a host material, and FIrpic was used as a light emitting material.

The organic EL element thus produced was allowed to emit light by applying a constant electric current of 2.5 $mA/cm^2$ at room temperature. It was found that blue light was emitted.

From this result, it was confirmed that by including B2, B12 and B36 according to the present invention, it functions as a hole transport material in the organic EL element.

INDUSTRIAL APPLICABILITY

The organic electroluminescence element material of the present invention may be suitably used for a host material, an electron transport material and a hole transport material of an organic EL element. An organic EL element containing the organic electroluminescence element material of the present invention in an organic layer interposed between an anode and a cathode may be suitably used for electronic devices such as a display device, a display, and various lighting devices.

DESCRIPTION OF SYMBOLS

1: Display
3: Pixel
5: Scanning line
6: Data line
7: Electric source line
10: Organic EL element
11: Switching transistor
12: Operating transistor
13: Capacitor

101: Organic EL element in a lighting device
102: Glass cover
105: Cathode
106: Organic EL layer
107: Glass substrate having a transparent electrode
108: Nitrogen gas
109: Water catching agent
A: Display section
B: Control section
C: Wiring section

The invention claimed is:

1. An organic electroluminescence element material containing a π-conjugated boron compound having a structure represented by Formula (1), Formula (1)

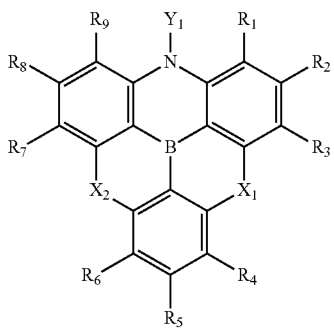

wherein, $X_1$ and $X_2$ each independently represent O, S, or N—$Y_1$, at least one of $X_1$ or $X_2$ is O or S, $Y_1$ represents an alkyl group, an aromatic hydrocarbon ring group, or an aromatic heterocyclic group, when there are a plurality of $Y_1$s the plurality of $Y_1$s may be the same or different, $R_1$, $R_3$, $R_4$, $R_6$, $R_7$, and $R_9$ each independently represent a hydrogen atom or a substituent, and $R_2$, $R_5$, and $R_8$ each independently represent a hydrogen atom, an alkyl group, an alkoxy group, a haloalkyl group, a cyano group,

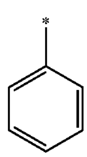,
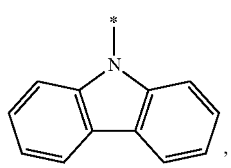,
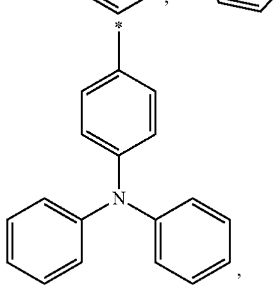,
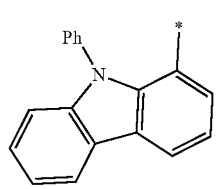,
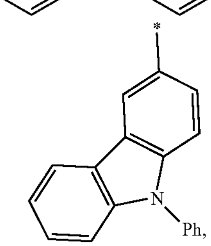Ph,
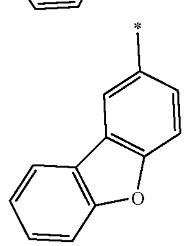,

-continued

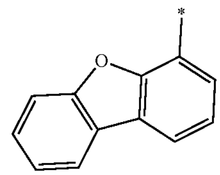,
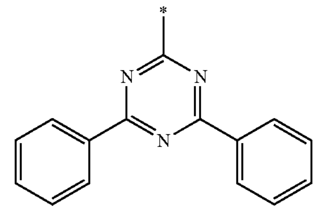,
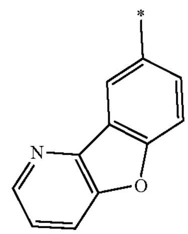,
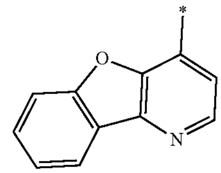,
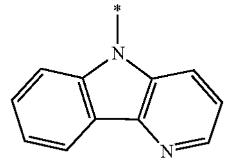,
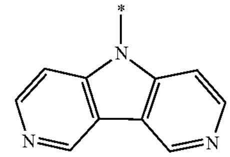,
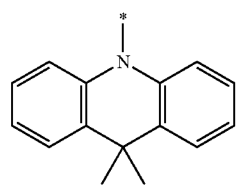,
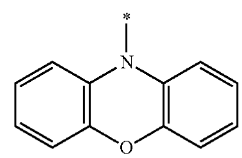,
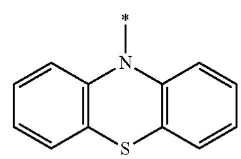,
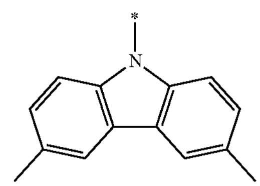,
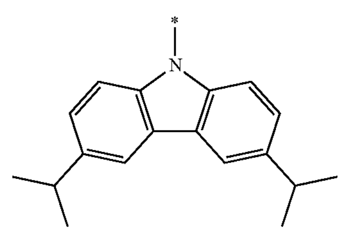,
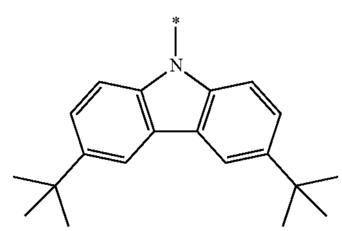,
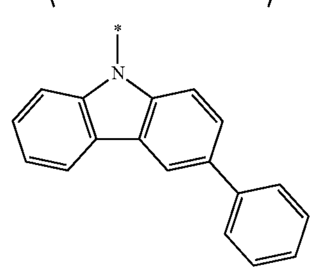, -continued

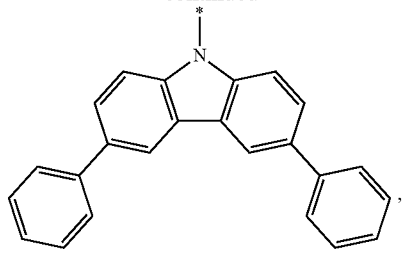

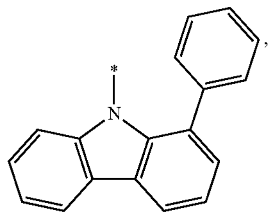

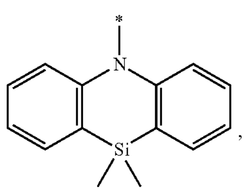

and

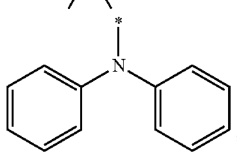

wherein * is a site bonding to the π-conjugated boron compound.

2. The organic electroluminescence element material described in claim 1, wherein $X_1$ and $X_2$ in Formula (1) each represent O.

3. An organic electroluminescence element material containing a π-conjugated boron compound having a structure represented by Formula (1), Formula (1)

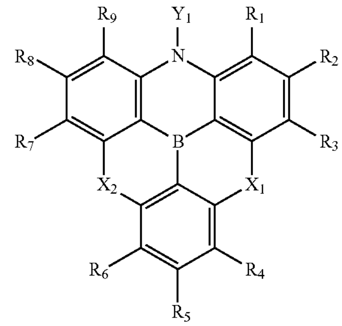

wherein $X_1$ and $X_2$ each independently represent O, $Y_1$ and $R_1$ to $R_9$ each independently represent: an azine skeleton, a dibenzofuran skeleton, an azadibenzofuran skeleton, a diazadibenzofuran skeleton, a carbazole skeleton, a diazacarbazole skeleton or an aryl group having an electron withdrawing group.

4. An organic electroluminescence element material containing a π-conjugated boron compound having a structure represented by Formula (1), Formula (1)

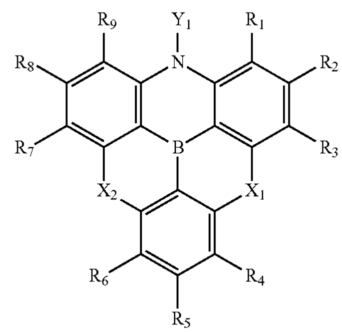

wherein $X_1$ and $X_2$ each independently represent O, $Y_1$ and $R_1$ to $R_9$ each independently represent a carbazole skeleton or an aryl group having an electron donating group.

5. An organic electroluminescence element containing an organic layer interposed between an anode and a cathode, wherein the organic layer includes the organic electroluminescence element material described in claim 1.

6. A display device provided with the organic electroluminescence element described in claim 5.

7. A lighting device provided with the organic electroluminescence element described in claim 5.

* * * * *